(12) United States Patent
Sasaki et al.

(10) Patent No.: US 10,665,453 B2
(45) Date of Patent: *May 26, 2020

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Toshinari Sasaki, Atsugi (JP); Junichiro Sakata, Atsugi (JP); Hiroki Ohara, Sagamihara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,396

(22) Filed: Aug. 23, 2018

(65) Prior Publication Data

US 2018/0366326 A1 Dec. 20, 2018

Related U.S. Application Data

(60) Continuation of application No. 14/480,760, filed on Sep. 9, 2014, now Pat. No. 10,062,570, which is a
(Continued)

(30) Foreign Application Priority Data

Jun. 30, 2009 (JP) .................................. 2009-156410

(51) Int. Cl.
*H01L 21/02* (2006.01)
*H01L 29/66* (2006.01)
(Continued)

(52) U.S. Cl.
CPC .. *H01L 21/02664* (2013.01); *H01L 21/02565* (2013.01); *H01L 29/66765* (2013.01);
(Continued)

(58) Field of Classification Search
CPC combination set(s) only.
See application file for complete search history.

(56) References Cited

U.S. PATENT DOCUMENTS

| | | |
|---|---|---|
| 4,847,211 A | 7/1989 | Lee |
| 5,731,856 A | 3/1998 | Kim et al. |

(Continued)

FOREIGN PATENT DOCUMENTS

| | | |
|---|---|---|
| CN | 001450649 A | 10/2003 |
| CN | 101258607 A | 9/2008 |

(Continued)

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

(Continued)

*Primary Examiner* — Fernando L Toledo
*Assistant Examiner* — Valerie N Newton
(74) *Attorney, Agent, or Firm* — Robinson Intellectual Property Law Office; Eric J. Robinson

(57) ABSTRACT

An object is to provide a high reliable semiconductor device including a thin film transistor having stable electric characteristics. In a method for manufacturing a semiconductor device including a thin film transistor in which an oxide semiconductor film is used for a semiconductor layer including a channel formation region, heat treatment (which is for dehydration or dehydrogenation) is performed so as to (Continued)

improve the purity of the oxide semiconductor film and reduce impurities such as moisture. Besides impurities such as moisture existing in the oxide semiconductor film, heat treatment causes reduction of impurities such as moisture existing in the gate insulating layer and those in interfaces between the oxide semiconductor film and films which are provided over and below the oxide semiconductor film and are in contact with the oxide semiconductor film.

22 Claims, 43 Drawing Sheets

Related U.S. Application Data continuation of application No. 14/022,392, filed on Sep. 10, 2013, now Pat. No. 8,846,460, which is a division of application No. 12/826,000, filed on Jun. 29, 2010, now Pat. No. 8,557,641.

(51) Int. Cl.
*H01L 29/786* (2006.01)
*H01L 27/12* (2006.01)

(52) U.S. Cl.
CPC .... *H01L 29/66969* (2013.01); *H01L 29/7869* (2013.01); *H01L 29/78618* (2013.01); *H01L 29/78696* (2013.01); *H01L 27/1225* (2013.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,119,365 B2 | 10/2006 | Takafuji et al. |
| 7,132,691 B1 | 11/2006 | Tanabe et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,435,633 B2 | 10/2008 | Todorokihara et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,485,928 B2 | 2/2009 | Falster et al. |
| 7,501,293 B2 | 3/2009 | Ito et al. |
| 7,579,224 B2 | 8/2009 | Kuwabara et al. |
| 7,601,984 B2 | 10/2009 | Sano et al. |
| 7,619,250 B2 | 11/2009 | Takafuji et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,781,964 B2 | 8/2010 | Hara et al. |
| 7,791,074 B2 | 9/2010 | Iwasaki |
| 7,868,326 B2 | 1/2011 | Sano et al. |
| 7,884,367 B2 | 2/2011 | Takafuji et al. |
| 7,935,582 B2 | 5/2011 | Iwasaki |
| 7,956,361 B2 | 6/2011 | Iwasaki |
| 7,982,216 B2 | 7/2011 | Imai |
| 7,994,508 B2 | 8/2011 | Ye |
| 8,026,145 B2 | 9/2011 | Falster et al. |
| 8,143,115 B2 | 3/2012 | Omura et al. |
| 8,148,721 B2 | 4/2012 | Hayashi et al. |
| 8,154,024 B2 | 4/2012 | Iwasaki |
| 8,164,256 B2 | 4/2012 | Sano et al. |
| 8,168,974 B2 | 5/2012 | Sano et al. |
| 8,183,099 B2 | 5/2012 | Sakata |
| 8,193,045 B2 | 6/2012 | Omura et al. |
| 8,258,023 B2 | 9/2012 | Lee |
| 8,294,148 B2 | 10/2012 | Ye |
| 8,318,551 B2 | 11/2012 | Akimoto et al. |
| 8,354,674 B2 | 1/2013 | Kimura |
| 8,384,077 B2 | 2/2013 | Yano et al. |
| 8,415,198 B2 | 4/2013 | Itagaki et al. |
| 8,502,217 B2 | 8/2013 | Sato et al. |
| 8,541,944 B2 | 9/2013 | Sano et al. |
| 8,557,641 B2 | 10/2013 | Sasaki et al. |
| 8,563,977 B2 | 10/2013 | Shimada et al. |
| 8,785,240 B2 | 7/2014 | Watanabe |
| 8,796,078 B2 | 8/2014 | Sasaki et al. |
| 8,872,171 B2 | 10/2014 | Yamazaki et al. |
| 9,082,857 B2 | 7/2015 | Yamazaki et al. |
| 9,130,045 B2 | 9/2015 | Lee |
| 10,062,570 B2 * | 8/2018 | Sasaki ................ H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023698 A1 | 1/2008 | Li et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0303020 A1 | 12/2008 | Shin et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0001881 A1 | 1/2009 | Nakayama |
| 2009/0008639 A1 | 1/2009 | Akimoto et al. |
| 2009/0045397 A1 | 2/2009 | Iwasaki |
| 2009/0057674 A1 | 3/2009 | Jeong et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153762 A1 | 6/2009 | Kuwabara et al. |
| 2009/0278122 A1 | 11/2009 | Hosono et al. |
| 2009/0280600 A1 | 11/2009 | Hosono et al. |
| 2010/0006833 A1 | 1/2010 | Ha et al. |
| 2010/0012932 A1 | 1/2010 | Shieh et al. |
| 2010/0025678 A1 | 2/2010 | Yamazaki et al. |
| 2010/0025679 A1 | 2/2010 | Yamazaki et al. |
| 2010/0032665 A1 | 2/2010 | Yamazaki et al. |
| 2010/0044701 A1 | 2/2010 | Sano et al. |
| 2010/0045179 A1 | 2/2010 | Sano et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0171117 A1 | 7/2010 | Kuwabara et al. |
| 2010/0193785 A1 | 8/2010 | Kimura |
| 2010/0283049 A1 | 11/2010 | Sato et al. |
| 2010/0289020 A1 | 11/2010 | Yano et al. |
| 2012/0126226 A1 | 5/2012 | Kuwabara et al. |
| 2012/0132911 A1 | 5/2012 | Shimada et al. |
| 2012/0168749 A1 | 7/2012 | Sano et al. |
| 2012/0168750 A1 | 7/2012 | Hayashi et al. |
| 2013/0146452 A1 | 6/2013 | Yano et al. |
| 2015/0084048 A1 | 3/2015 | Hayashi et al. |

FOREIGN PATENT DOCUMENTS

| | | |
|---|---|---|
| CN | 101897031 A | 11/2010 |
| EP | 0051940 B | 5/1985 |
| EP | 1115163 A | 7/2001 |
| EP | 1737044 A | 12/2006 |
| EP | 2061086 A | 5/2009 |
| EP | 2068367 A | 6/2009 |
| EP | 2084746 A | 8/2009 |
| EP | 2226847 A | 9/2010 |
| EP | 2339639 A | 6/2011 |
| EP | 2816607 A | 12/2014 |
| EP | 3249694 A | 11/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-357586 A | 12/2000 |
| JP | 2002-076356 A | 3/2002 |
| JP | 2002-289859 A | 10/2002 |
| JP | 2003-037268 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-229212 A | 8/2006 |
| JP | 2007-096055 A | 4/2007 |
| JP | 2007-103918 A | 4/2007 |
| JP | 2007-123861 A | 5/2007 |
| JP | 2007-220817 A | 8/2007 |
| JP | 2007-310352 A | 11/2007 |
| JP | 2007-311404 A | 11/2007 |
| JP | 2008-053356 A | 3/2008 |
| JP | 2008-117863 A | 5/2008 |
| JP | 2008-141119 A | 6/2008 |
| JP | 2008-281988 A | 11/2008 |
| JP | 2008-311342 A | 12/2008 |
| JP | 2009-010362 A | 1/2009 |
| JP | 2009-033145 A | 2/2009 |
| JP | 2009-515370 | 4/2009 |
| JP | 2009-099847 A | 5/2009 |
| JP | 2009-099944 A | 5/2009 |
| JP | 2009-128761 A | 6/2009 |
| JP | 2009-135186 A | 6/2009 |
| JP | 2009-135380 A | 6/2009 |
| JP | 2010-535431 | 11/2010 |
| JP | 2014-029032 A | 2/2014 |
| KR | 2008-0072136 A | 8/2008 |
| KR | 2008-0095603 A | 10/2008 |
| KR | 2008-0104588 A | 12/2008 |
| KR | 2008-0106368 A | 12/2008 |
| KR | 10-0882677 | 2/2009 |
| KR | 2009-0050614 A | 5/2009 |
| KR | 2009-0050970 A | 5/2009 |
| KR | 2009-0057690 A | 6/2009 |
| KR | 2010-0094509 A | 8/2010 |
| TV | 449949 | 8/2001 |
| TW | 200910468 | 3/2009 |
| TW | 200937638 | 9/2009 |
| WO | WO-2004/114391 | 12/2004 |
| WO | WO-2006/051995 | 5/2006 |
| WO | WO-2007/029844 | 3/2007 |
| WO | WO-2007/056745 | 5/2007 |
| WO | WO-2008/023553 | 2/2008 |
| WO | WO-2008/069056 | 6/2008 |
| WO | WO-2008/069255 | 6/2008 |
| WO | WO-2008/069286 | 6/2008 |
| WO | WO-2008/126879 | 10/2008 |
| WO | WO-2008/133456 | 11/2008 |
| WO | WO-2008/143304 | 11/2008 |
| WO | WO-2008/149873 | 12/2008 |
| WO | WO-2009/018509 | 2/2009 |
| WO | WO-2009/041544 | 4/2009 |
| WO | WO-2009/072532 | 6/2009 |
| WO | WO-2009/075281 | 6/2009 |
| WO | WO-2009/139009 | 11/2009 |

OTHER PUBLICATIONS

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Li.C et al., "Modulated Structures of Homologous Compounds $InMO_3(ZnO)m$ (M=In,Ga; m=Integer) Described by Four-

(56) References Cited

OTHER PUBLICATIONS

Dimensional Superspace Group", Journal of Solid State Chemistry, 1998, vol. 139, pp. 347-355.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Lee.H et al., "Current Status of, Challenges to, and Perspective View of AM-OLED", IDW '06 : Proceedings of the 13th International Display Workshops, Dec. 7, 2006, pp. 663-666.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Tsuda.K et al., "Ultra Low Power Consumption Technologies for Mobile TFT-LCDs", IDW '02 : Proceedings of the 9th International Display Workshops, Dec. 4, 2002, pp. 295-298.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Kurokawa.Y et al., "UHF RFCPUS on Flexible and Glass Substrates for Secure RFID Systems", Journal of Solid-State Circuits , 2008, vol. 43, No. 1, pp. 292-299.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.S et al., "Challenge to Future Displays: Transparent AM-OLED Driven by PEALD Grown ZnO TFT", IMID '07 Digest, 2007, pp. 1249-1252.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kitzerow.H et al., "Observation of Blue Phases in Chiral Networks", Liquid Crystals, 1993, vol. 14, No. 3, pp. 911-916.
Kikuchi.H et al., "Polymer-Stabilized Liquid Crystal Blue Phases", Nature Materials, Sep. 2, 2002, vol. 1, pp. 64-68.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Park.J et al., "High performance amorphous oxide thin film transistors with self-aligned top-gate structure", IEDM 09: Technical Digest of International Electron Devices Meeting, Dec. 7, 2009, pp. 191-194.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Miyasaka.M, "SUFTLA Flexible Microelectronics on Their Way to Business", SID Digest '07 : SID International Symposium Digest of Technical Papers, 2007, vol. 38, pp. 1673-1676.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
International Search Report (Application No. PCT/JP2010/060694) dated Jul. 27, 2010.
Written Opinion (Application No. PCT/JP2010/060694) dated Jul. 27, 2010.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Nakamura.M, "Synthesis of Homologous Compound with New Long-Period Structure", Nirim Newsletter, Mar. 1, 1995, vol. 150, pp. 1-4.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.
Chinese Office Action (Application No. 201080028690.1) dated Jan. 13, 2014.
Taiwanese Office Action (Application No. 099121074) dated Apr. 10, 2015.
European Search Report (Application No. 10794048.8) dated May 6, 2015.
Korean Office Action (Application No. 2015-7015963) dated Oct. 20, 2015.
Korean Office Action (Application No. 2016-7020354) dated Sep. 12, 2016.
Korean Office Action (Application No. 2017-7011202) dated May 29, 2017.
European Office Action (Application No. 19185984.2) dated Oct. 18, 2019.

\* cited by examiner

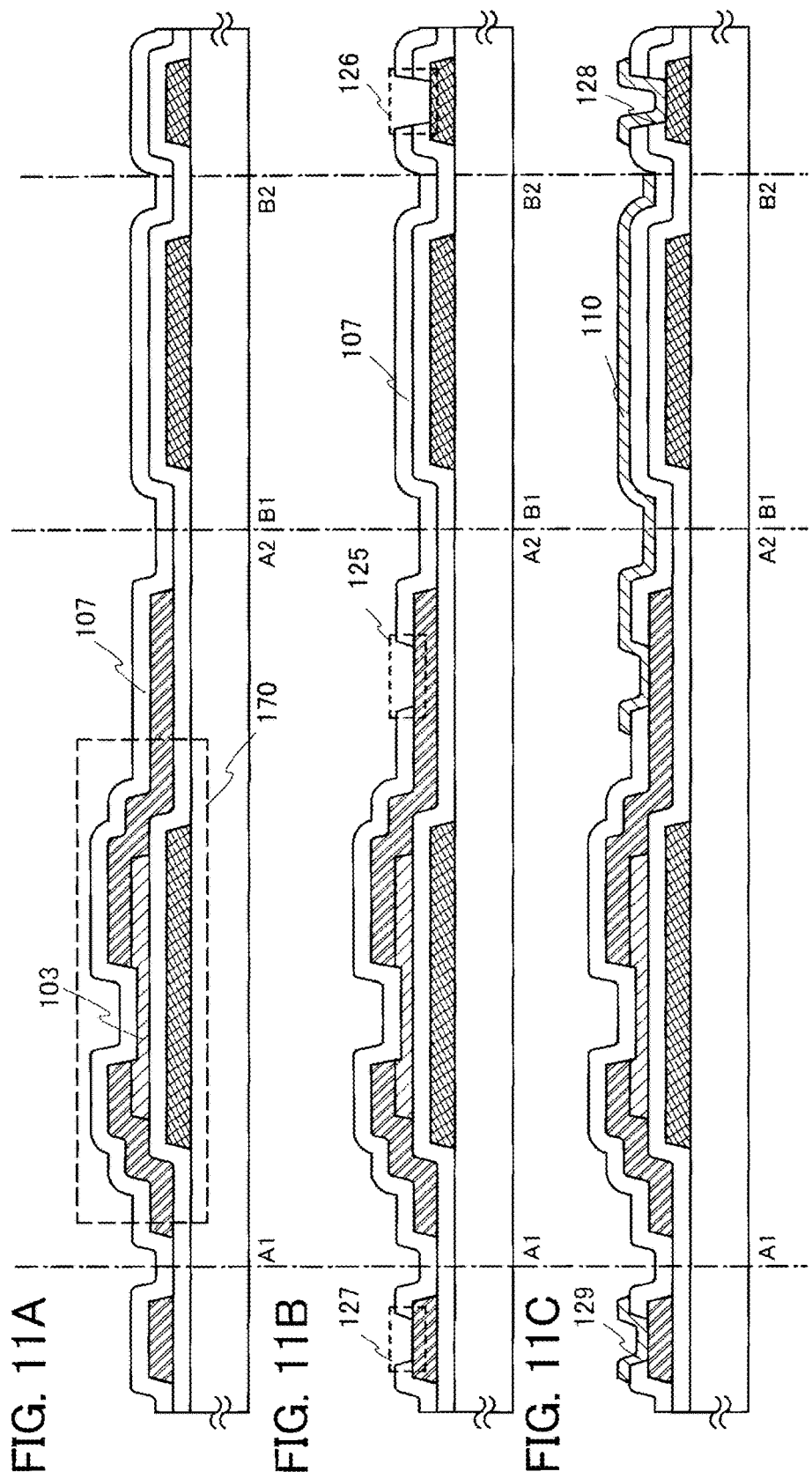

FIG. 13A1
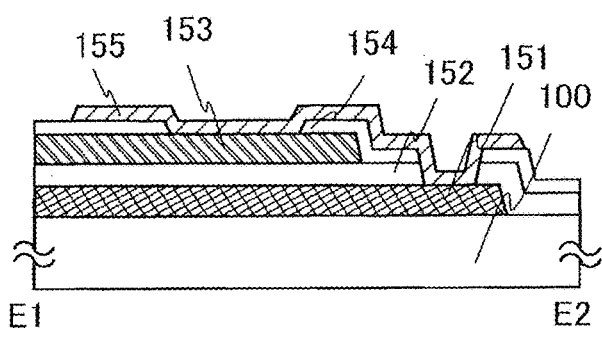
FIG. 13A2
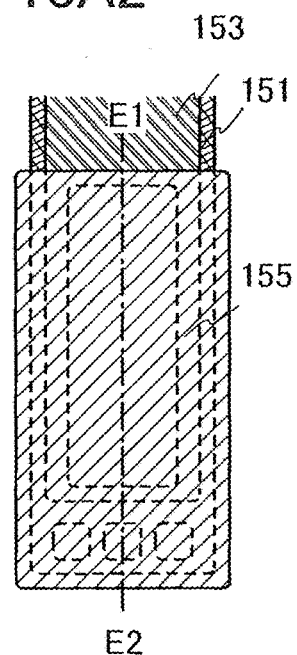
FIG. 13B1
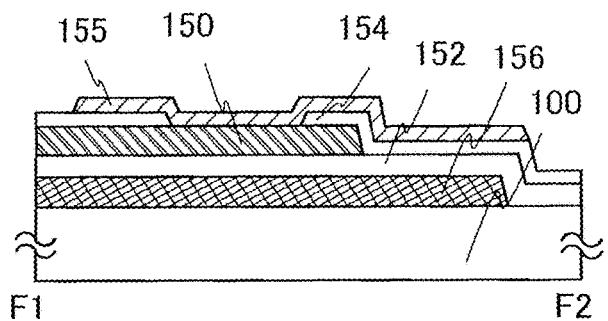
FIG. 13B2
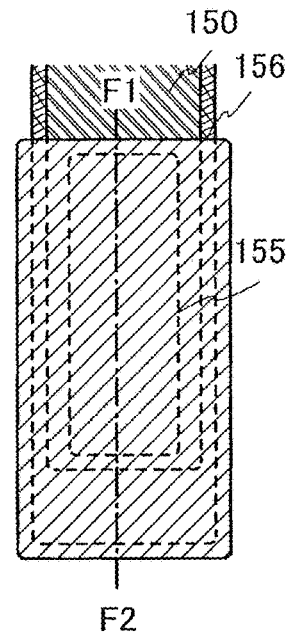

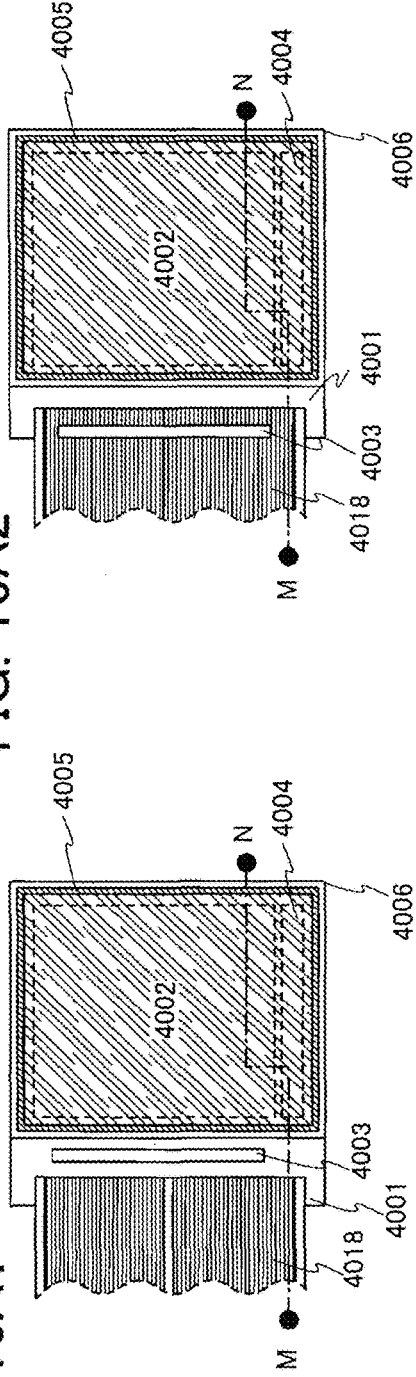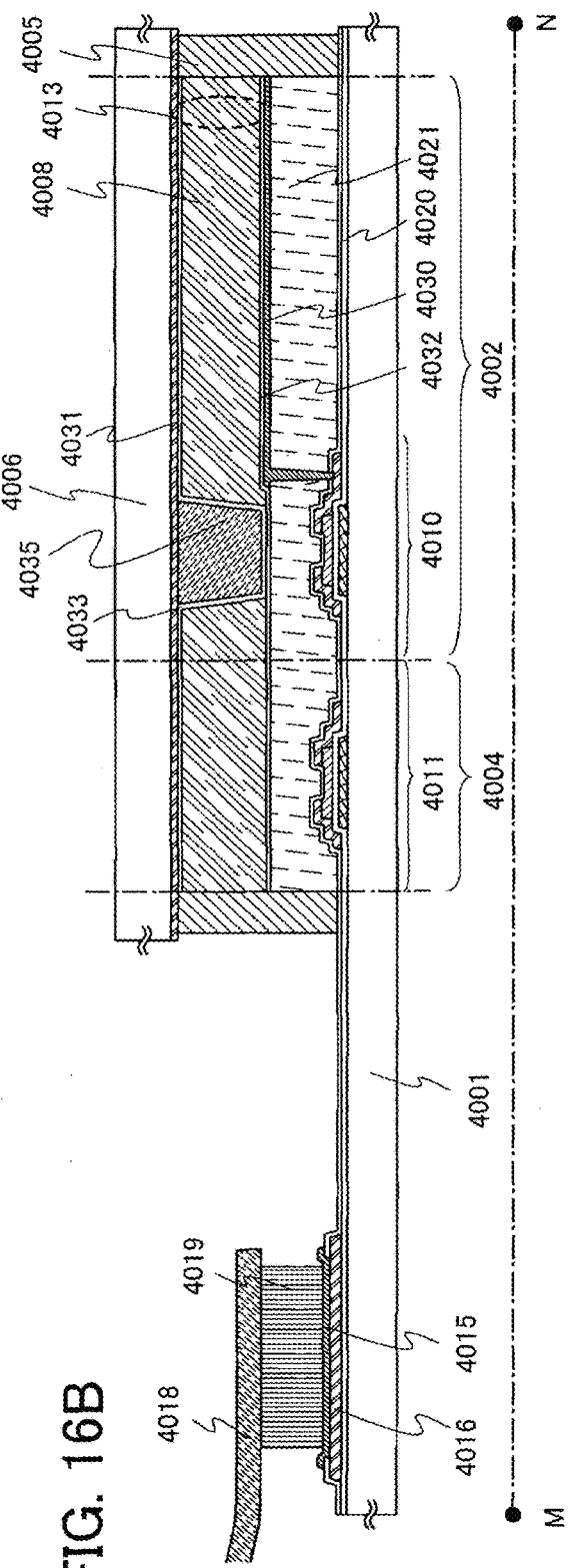

SEMICONDUCTOR DEVICE AND METHOD FOR MANUFACTURING THE SAME

TECHNICAL FIELD

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and an electronic appliance are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. Thin film transistors including such metal oxide having semiconductor characteristics in its channel formation region have been proposed (Patent Documents 1 to 4 and Non-Patent Document 1).

Examples of metal oxides include not only an oxide of a single metal element but also an oxide of a plurality of metal elements (multi-component oxides). For example, $InGaO_3(ZnO)_m$ (m is a natural number) which is a homologous compound is a known material as multi-component oxides including In, Ga, and Zn (Non-Patent Documents 2 to 4).

In addition, it has been proved that an oxide semiconductor including such an In—Ga—Zn based oxide can be used as a channel layer of a thin film transistor (Patent Document 5, and Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Homologous Series, Synthesis and Crystal Structure of $InFeO_3(ZnO)_m$ (m: natural number) and its Isostructural Compound", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

It is an object to provide a highly reliable semiconductor device including a thin film transistor whose electric characteristics are stable.

In a method for manufacturing a semiconductor device including a thin film transistor in which an oxide semiconductor film is used for a semiconductor layer including a channel formation region, heat treatment (which is for dehydration or dehydrogenation) is performed so as to improve the purity of the oxide semiconductor film and reduce impurities such as moisture. Besides impurities such as moisture existing in the oxide semiconductor film, heat treatment causes reduction of impurities such as moisture existing in the gate insulating layer and those in interfaces between the oxide semiconductor film and films which are provided over and below the oxide semiconductor film and are in contact with the oxide semiconductor film.

In order to reduce impurities such as moisture, after formation of the oxide semiconductor film, heat treatment is performed under an inert-gas atmosphere of nitrogen or a rare gas such as argon or helium or under reduced pressure, at 200° C. or higher, preferably, 400° C. to 600° C. inclusive. In the heat treatment, the formed oxide semiconductor film is exposed. As a result, impurities such as moisture, which are contained in the oxide semiconductor film, are reduced. After heat treatment, slow cooling is performed to a temperature which is equal to or higher than room temperature and lower than 100° C. under an inert-gas atmosphere.

Use of an oxide semiconductor film in which contained moisture is reduced by heat treatment performed under an inert-gas atmosphere of nitrogen, argon, or the like or under reduced pressure allows improvement of electric characteristics of a thin film transistor and achievement of both mass productivity and high performance thereof.

Heat treatment was performed on a plurality of samples under a nitrogen atmosphere at heat temperatures whose conditions were determined. Such a plurality of samples were measured with thermal desorption spectroscopy (TDS). Measurement results are shown in FIG. 2, FIG. 3, and FIG. 4.

The thermal desorption spectroscopy apparatus is used for detecting and identifying a gas component discharged or generated from the samples by a quadrupole mass analyzer; thus, a gas and a molecule discharged from surfaces and insides of the samples can be observed. Discharge or generation of gas from the samples occurs while the samples are heated and the temperature is rising in high vacuum. With use of a thermal desorption spectrometer (product name: EMD-WA1000S) manufactured by ESCO Ltd., measurement was performed under a condition where the rising temperature was at approximately 10° C./min., the SEM voltage was set to 1500 V, the dwell time was 0.2 (sec), and the number of channels to be used was 23. In addition, during the measurement, the pressure was at a degree of vacuum of about $1 \times 10^{-7}$ (Pa). Note that the ionization coefficient, the fragmentation coefficient, the pass-through coefficient, and the pumping rate of $H_2O$ were respectively 1.0, 0.805, 1.56, and 1.0.

FIG. 2 is a graph showing TDS results of comparison between a sample (comparative sample) which includes only a glass substrate and a sample (Sample 1) where an In—Ga—Zn—O-based non-single-crystal film with a set thickness of 50 nm (an actual thickness obtained after etching is about 30 nm) is formed over a glass substrate. FIG. 2 shows results obtained by measuring $H_2O$. Discharge of impurities such as moisture ($H_2O$) from the In—Ga—Zn—O-based non-single-crystal film can be confirmed from a peak in the vicinity of 300° C.

FIG. 3 is a graph showing comparison of samples, which shows TDS measurement results of $H_2O$. The comparison was performed on the following samples: the sample (Sample 1) where an In—Ga—Zn—O-based non-single-crystal film with a set thickness of 50 nm is formed over a glass substrate; a sample (Sample 2) where the structure of Sample 1 is subjected to heat treatment for an hour at 350° C. under an air atmosphere; and a sample (Sample 3) where the structure of Sample 1 is subjected to heat treatment for an hour at 350° C. under a nitrogen atmosphere. From the results shown in FIG. 3, a peak in the vicinity of 300° C. of Sample 3 is lower than that of Sample 2. Thus, discharge of moisture ($H_2O$) due to heat treatment performed under a nitrogen atmosphere can be confirmed. Moreover, it is found that heat treatment performed under a nitrogen atmosphere reduces impurities such as moisture ($H_2O$) more than heat treatment performed under an air atmosphere.

FIG. 4 is a graph showing comparison of samples, which shows TDS measurement results of $H_2O$. The comparison was performed on the following samples: the sample (Sample 1) where an In—Ga—Zn—O-based non-single-crystal film with a set thickness of 50 nm is formed over a glass substrate; a sample (Sample 4) where the structure of Sample 1 is subjected to heat treatment for an hour at 250° C. under a nitrogen atmosphere; the sample (Sample 3) where the structure of Sample 1 is subjected to heat treatment for an hour at 350° C. under a nitrogen atmosphere; a sample (Sample 5) where the structure of Sample 1 is subjected to heat treatment for an hour at 450° C. under a nitrogen atmosphere; and a sample (Sample 6) where the structure of Sample 1 is subjected to heat treatment for 10 hours at 350° C. under a nitrogen atmosphere. From the results shown in FIG. 4, it is found that the higher the heat temperature under a nitrogen atmosphere is, the smaller the amount of impurities such as moisture ($H_2O$) discharged from the In—Ga—Zn—O-based non-single-crystal film becomes.

In addition, from the graphs of FIG. 3 and FIG. 4, two peaks can be confirmed: a first peak in the vicinity of 200° C. to 250° C., which indicates discharge of impurities such as moisture ($H_2O$); and a second peak at 300° C. or higher, which indicates discharge of impurities such as moisture ($H_2O$).

Note that even in the case where the sample which has been subjected to heat treatment at 450° C. under a nitrogen atmosphere is left at room temperature in an air atmosphere approximately for one week, discharge of moisture at 200° C. or higher was not observed. Thus, it is found that by performing heat treatment, the In—Ga—Zn—O-based non-single-crystal film becomes stable.

Further, FIG. 1 shows measurement results of carrier concentrations. Conditions of heat temperature under a nitrogen atmosphere were set to 150° C., 175° C., 200° C., 225° C., 250° C., 275° C., 300° C., 325° C., 350° C., 375° C., 400° C., 425° C., and 450° C., and a carrier concentration at each temperature was measured.

FIG. 5A illustrates a three-dimensional view of a property-evaluation sample 510 for evaluating properties (the carrier concentrations and Hall mobility) of an oxide semiconductor film (an In—Ga—Zn—O-based non-single-crystal film). The property-evaluation sample 510 was fabricated and subjected to Hall effect measurement at room temperature. The carrier concentration and Hall mobility of the oxide semiconductor film were evaluated. The property-evaluation sample 510 was fabricated in the following manner: an insulating film 501 including silicon oxynitride was formed over a substrate 500, an oxide semiconductor film 502 with a size of 10 mm×10 mm, which serves as an evaluation object, was formed over the insulating film 501, and electrodes 503 to 506 each having a diameter of 1 mm were formed over the oxide semiconductor film 502. The carrier concentrations of the oxide semiconductor film obtained by the Hall effect measurement are shown in FIG. 1, the Hall mobility thereof is shown in FIG. 5B, and conductivity thereof is shown in FIG. 5C.

From the results of FIG. 1, FIG. 2, FIG. 3, and FIG. 4, it is found that there is a relation, at 250° C. or higher in TDS measurement, between discharge of impurities such as moisture ($H_2O$) from the In—Ga—Zn—O-based non-single-crystal film and change in carrier concentration. When the impurities such as moisture ($H_2O$) are discharged from the In—Ga—Zn—O-based non-single-crystal film, the carrier concentration is increased.

Moreover, H, O, OH, $H_2$, $O_2$, N, $N_2$, and Ar, in addition to $H_2O$, were each measured by TDS. The measurement resulted in that peaks of $H_2O$, H, O, and OH were observed clearly but peaks of $H_2$, $O_2$, N, $N_2$, and Ar were not observed. As samples of the above measurement, a structure where an In—Ga—Zn—O-based non-single-crystal film with a set thickness of 50 nm was formed over a glass substrate was used. The conditions of heat treatment were set as follows: heat treatment under a nitrogen atmosphere at 250° C. for an hour; that under a nitrogen atmosphere at 350° C. for an hour; that under a nitrogen atmosphere at 350° C. for ten hours; and that in a nitrogen atmosphere at 450° C. for an hour. As comparative samples, a structure in which heat treatment was not performed on an In—Ga—Zn—O-based non-single-crystal film and a structure including only a glass substrate were measured. FIG. 37, FIG. 38, FIG. 39, and FIG. 40 show TDS results of H, O, OH, and $H_2$, respectively. Note that under the above conditions of heat treatment, the oxygen concentration under a nitrogen atmosphere is 20 ppm or lower.

According to the above results, it is found that by performance of heat treatment of the In—Ga—Zn—O-based non-single-crystal film, moisture ($H_2O$) is mainly discharged. In other words, heat treatment causes discharge of moisture ($H_2O$) mainly from the In—Ga—Zn—O-based non-single-crystal film. The TDS measurement values of H shown in FIG. 37, O shown in FIG. 38, and OH shown in FIG. 39 are affected by materials obtained by decomposition of water molecules. Note that hydrogen and OH which are considered to be contained in the In—Ga—Zn—O-based non-single-crystal film are discharged together by heat treatment.

In this specification, heat treatment performed under an inert-gas atmosphere of nitrogen or an inert gas such as argon or helium or under reduced pressure is referred to as heat treatment for dehydration or dehydrogenation. In this specification, "dehydrogenation" does not indicate elimination of only $H_2$ by heat treatment. For convenience, elimination of H, OH, and the like is referred to as "dehydration or dehydrogenation".

Impurities ($H_2O$) contained in an oxide semiconductor layer is reduced and the carrier concentration are increased by heat treatment performed under an inert gas, and then slow cooling is performed. After slow cooling, the carrier concentration in the oxide semiconductor layer is reduced by formation of an oxide insulating film in contact with the oxide semiconductor layer or the like, which leads to improvement in reliability.

By heat treatment performed under a nitrogen atmosphere, resistance of an oxide semiconductor layer is reduced (i.e., the carrier concentration is increased, preferably to $1\times10^{18}/cm^3$ or higher), so that a low-resistance oxide semiconductor layer can be obtained. After that, if an oxide insulating film is formed to be in contact with the low-resistance oxide semiconductor layer, in the low-resistance oxide semiconductor layer, at least a region in contact with the oxide insulating film can have increased resistance (i.e., the carrier concentration is reduced, preferably to lower than $1\times10^{18}/cm^3$, more preferably $1\times10^{14}/cm^3$ or lower). Thus, a high-resistance oxide semiconductor region can be obtained. During a manufacturing process of a semiconductor device, it is important to increase and decrease the carrier concentration in the oxide semiconductor layer by performance of heat treatment under an inert-gas atmosphere (or reduced pressure), slow cooling, formation of an oxide insulating film, and the like. In other words, heat treatment for dehydration or dehydrogenation is performed on an oxide semiconductor layer, which results in that the oxide semiconductor layer becomes an oxygen-deficiency type and be turned into an n-type (such as $n^-$ or $n^+$-type) oxide semiconductor layer. Then, by formation of an oxide insulating film, the oxide semiconductor layer is in an oxygen-excess state and to be an i-type oxide semiconductor layer. When an oxide insulating film is formed over the In—Ga—Zn—O-based non-single-crystal film, a carrier concentration of $1\times10^{14}/cm^3$ or lower, which is indicated by a dotted line 10 in FIG. 1, is obtained. In this manner, a semiconductor device including a thin film transistor having high electric characteristics and high reliability can be provided.

Note that as the oxide insulating film formed to be in contact with the low-resistance oxide semiconductor layer, an inorganic insulating film which blocks impurities such as moisture, hydrogen ions, and $OH^-$ is used. Specifically, a silicon oxide film or a silicon nitride oxide film is used.

In addition, after the oxide insulating film serving as a protective film is formed to be over and in contact with the low-resistance oxide semiconductor layer, second heat treatment may be performed. In the case where second heat treatment is performed after formation of the oxide insulating film serving as a protective film to be over and in contact with the oxide semiconductor layer, variation in electric characteristics of thin film transistors can be reduced.

One embodiment of the present invention disclosed in this specification is a semiconductor device including a gate electrode layer, a gate insulating layer over the gate electrode layer, an oxide semiconductor layer over the gate insulating layer, and an insulating layer over the oxide semiconductor layer. The gate insulating layer, the oxide semiconductor layer, the insulating layer, an interface between the gate insulating layer and the oxide semiconductor layer, and an interface between the oxide semiconductor layer and the insulating layer have a hydrogen concentration of $3\times10^{20}$ cm$^{-3}$ or lower.

Moisture contained in the oxide semiconductor layer includes a variety of forms such as moisture ($H_2O$), M-OH, M-H, and the like as well as hydrogen. An average value or a peak value of the hydrogen concentration which is the absolute quantity is $3\times10^{20}$ cm$^{-3}$ or lower, preferably $1\times10^{20}$ cm$^{-3}$ or lower.

Such a concentration range can be obtained by secondary ion mass spectrometry (SIMS) or on the basis of data of SIMS.

With the above structure, at least one of the above problems can be resolved.

One embodiment of the present invention to realize the above structure is a method for manufacturing a semiconductor device including the steps of forming a gate electrode layer, forming a gate insulating layer over the gate electrode layer, forming an oxide semiconductor layer over the gate insulating layer, performing dehydration or dehydrogenation on the oxide semiconductor layer, forming a source electrode layer and a drain electrode layer over the dehydrated or dehydrogenated oxide semiconductor layer, and forming an oxide insulating film which is in contact with a part of the oxide semiconductor layer and over the gate insulating layer, the oxide semiconductor layer, the source electrode layer, and the drain electrode layer. Note that dehydration or dehydrogenation is heat treatment performed under a nitrogen atmosphere or a rare gas atmosphere or under reduced pressure.

Another embodiment of the present invention to realize the above structure is a method for manufacturing a semiconductor device including the steps of forming a gate electrode layer, forming a gate insulating layer over the gate electrode layer, forming an oxide semiconductor layer over the gate insulating layer, heating the oxide semiconductor layer under an inert atmosphere to increase a carrier concentration, forming a source electrode layer and a drain electrode layer over the oxide semiconductor layer whose carrier concentration is increased, and forming an oxide insulating film which is in contact with a part of the heated oxide semiconductor layer and over the gate insulating layer, the heated oxide semiconductor layer, the source electrode layer, and the drain electrode layer, so that a carrier concentration is reduced. Note that after the oxide semiconductor layer is heated under an inert atmosphere at a temperature of 400° C. or higher, slow cooling is performed to a temperature which is equal to higher than room temperature and lower than 100° C.

Another embodiment of the present invention to realize the above structure is a method for manufacturing a semiconductor device including the steps of forming a gate electrode layer, forming a gate insulating layer over the gate electrode layer, forming an oxide semiconductor layer over the gate insulating layer, heating the oxide semiconductor layer under a reduced pressure to increase a carrier concentration, forming a source electrode layer and a drain electrode layer over the oxide semiconductor layer whose carrier concentration is increased, and forming an oxide insulating film which is in contact with a part of the heated oxide semiconductor layer and over the gate insulating layer, the heated oxide semiconductor layer, and the source electrode layer, and the drain electrode layer, so that a carrier concentration is reduced.

In each structure formed by the above manufacturing method, the carrier concentration of the oxide semiconductor layer whose carrier concentration is increased is $1\times10^{18}/cm^3$ or higher. The carrier concentration of the oxide semiconductor layer whose carrier concentration is reduced due to formation of the oxide insulating film is lower than $1\times10^{18}/cm^3$, preferably $1\times10^{14}/cm^3$ or lower.

The oxide semiconductor used in this specification is, for example, a thin film expressed by $InMO_3(ZnO)_m$ (m>0), and a thin film transistor using the thin film as a semiconductor layer is manufactured. Note that M denotes one metal element or a plurality of metal elements selected from Ga, Fe, Ni, Mn, and Co. For example, M denotes Ga in some cases; meanwhile, M denotes the above metal element such as Ni or Fe in addition to Ga (Ga and Ni or Ga and Fe) in other cases. Further, the above oxide semiconductor may include Fe or Ni, another transitional metal element, or an oxide of the transitional metal as an impurity element in addition to the metal element included as M. In this specification, an oxide semiconductor whose composition formula is represented as $InMO_3(ZnO)_m$ (m>0) where at least Ga is included as M is referred to as an In—Ga—Zn—O-based oxide semiconductor, and a thin film thereof is also referred to as an In—Ga—Zn—O-based non-single-crystal film.

As the oxide semiconductor which is applied to the oxide semiconductor layer, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; an In—Ga—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Moreover, silicon oxide may be included in the above oxide semiconductor layer. Addition of silicon oxide ($SiO_x$ (x>0)) which hinders crystallization into the oxide semiconductor layer can suppress crystallization of the oxide semiconductor layer in the case where heat treatment is performed after formation of the oxide semiconductor layer in the manufacturing process. Note that the preferable state of the oxide semiconductor layer is amorphous, or partial crystallization thereof is acceptable.

The oxide semiconductor preferably includes In, further preferably, includes In and Ga. Dehydration or dehydrogenation is effective in a process of forming an i-type (intrinsic) oxide semiconductor layer.

Since a thin film transistor is easily broken due to static electricity or the like, a protective circuit for protecting the driver circuit is preferably provided over the same substrate as a gate line or a source line. The protective circuit is preferably formed with a non-linear element including an oxide semiconductor.

Further, treatment of the gate insulating layer and the oxide semiconductor film may be successively performed without exposure to air. Such treatment is also called successive treatment, an in-situ step, or successive film formation. Successive treatment without exposure to air enables an interface between the gate insulating layer and the oxide semiconductor film to be formed without being contaminated by atmospheric components or contamination impurities floating in the air, such as moisture or hydrocarbon. Thus, variation in characteristics of thin film transistors can be reduced.

Note that the term "successive treatment" in this specification means that during the process from a first treatment step performed by a PCVD method or a sputtering method to a second treatment step performed by a PCVD method or a sputtering method, an atmosphere in which a substrate to be processed is disposed is not contaminated by a contaminant atmosphere such as air, and is constantly controlled to be vacuum or an inert-gas atmosphere (a nitrogen atmosphere or a rare gas atmosphere). By the successive treatment, treatment such as film formation can be performed while moisture or the like is prevented from attaching again to the substrate to be processed which is cleaned.

Performing the process from the first treatment step to the second treatment step in the same chamber is within the scope of the successive treatment in this specification. Further, the case where the process from the first treatment step to the second treatment is performed in different chambers in the following manner is also within the scope of the successive treatment in this specification: the substrate is transferred after the first treatment step to another chamber without being exposed to air and subjected to the second treatment.

Note that the case where there is the following step between the first treatment step and the second treatment step is also within the scope of the successive treatment in this specification: a substrate transfer step, an alignment step, a slow cooling step, a heating or cooling a substrate step which is for setting the substrate to have temperature suitable to the second film formation step, or the like.

However, the following case is not within the scope of the successive treatment in this specification: there is a step in which liquid is used, such as a cleaning step, a wet etching step, or a resist formation step between the first treatment step and the second treatment step.

A thin film transistor having stable electric characteristics can be provided. Further, a semiconductor device which includes thin film transistors having excellent electric characteristics and high reliability can be provided.

BRIEF DESCRIPTION OF DRAWINGS

FIGS. 11A to 11C are cross-sectional views illustrating manufacturing steps of one embodiment of the present invention.

FIGS. 13A1 and 13A2 and FIGS. 13B1 and 13B2 illustrate a semiconductor device of one embodiment of the present invention.

FIGS. 16A1 and 16A2 and 16B illustrate a semiconductor device.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

A semiconductor device and a method for manufacturing a semiconductor device will be described with reference to FIGS. 6A to 6D and FIGS. 7A and 7B.

Figure 7A:
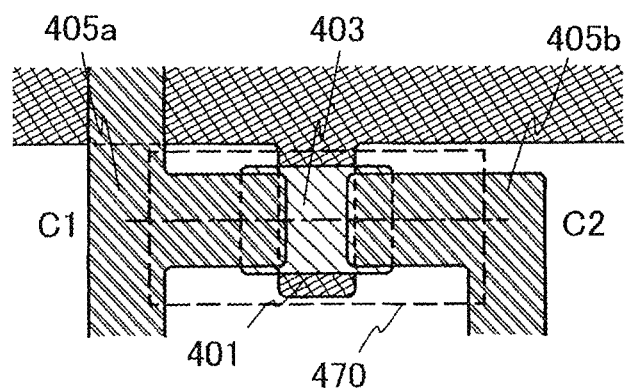
FIGS. 7A and 7B illustrate a semiconductor device of one embodiment of the present invention.
Figure 7B:
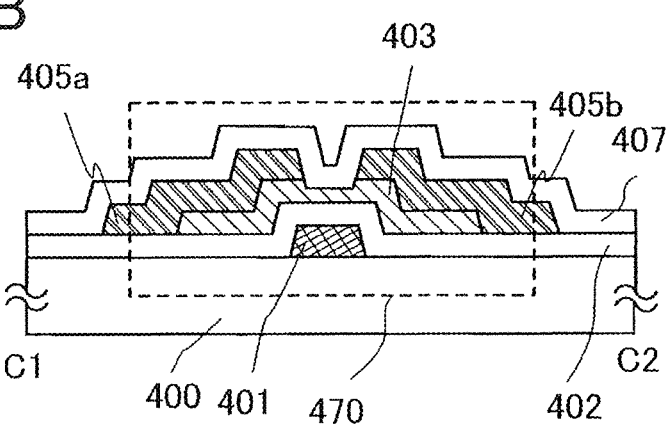

FIG. 7A is a top view of a thin film transistor 470 of a semiconductor device, and FIG. 7B is a cross-sectional view along line C1-C2 of FIG. 7A. The thin film transistor 470 is a bottom-gate thin film transistor and includes, over a substrate 400 which is a substrate having an insulating surface, a gate electrode layer 401, a gate insulating layer 402, a semiconductor layer 403, and source and drain electrode layers 405a and 405b. In addition, an oxide insulating film 407 is provided to cover the thin film transistor 470 and be in contact with the semiconductor layer 403.

The semiconductor layer 403 formed using an oxide semiconductor film is subjected to heat treatment (heat treatment for dehydration or dehydrogenation) for reducing impurities such as moisture and the like at least after formation of the oxide semiconductor film, so that resistance is reduced (i.e., the carrier concentration is increased, preferably to $1 \times 10^{18}/cm^3$ or higher). After that, the oxide insulating film 407 is formed to be in contact with the oxide semiconductor film, so that the oxide semiconductor film has increased resistance (i.e., the carrier concentration is reduced, preferably to lower than $1 \times 10^{18}/cm^3$, more preferably $1 \times 10^{14}/cm^3$ or lower). Accordingly, the oxide semiconductor film can be used as a channel formation region.

After elimination of impurities such as moisture ($H_2O$) by performance of heat treatment for dehydration or dehydrogenation, it is preferable that slow cooling be performed under an inert atmosphere. After the heat treatment for dehydration or dehydrogenation and the slow cooling, the carrier concentration of the oxide semiconductor layer is reduced by formation of an oxide insulating film to be in contact with the oxide semiconductor layer or the like, which improves reliability of the thin film transistor 470.

Besides impurities such as moisture inside the semiconductor layer 403, the heat treatment causes reduction in impurities such as moisture inside the gate insulating layer 402 and in interfaces provided between the semiconductor layer 403 formed using an oxide semiconductor and films which are over and below the semiconductor layer 403 to be in contact therewith. Specifically, the interfaces indicate an interface between the gate insulating layer 402 and the semiconductor layer 403 and an interface between the oxide insulating film 407 and the semiconductor layer 403.

Here, an example showing results of the reliability test of the thin film transistor 470 is described with reference to FIGS. 41A to 41C.

One of methods for examining reliability of thin film transistors is a bias-temperature stress test (hereinafter, referred to as a BT test). The BT test is one kind of an accelerated test and can evaluate change in characteristics, caused by long-term usage, of thin film transistors in a short time. In particular, the amount of shift in threshold voltage of the thin film transistor between before and after the BT test is an important indicator for examining reliability. Between before and after the BT test, the small amount of shift in threshold voltage means high reliability.

Specifically, the temperature of a substrate over which a thin film transistor is formed (substrate temperature) is set at fixed temperature, a source and a drain of the thin film transistor are set at the same potential, and a gate is supplied with potential different from those of the source and the drain for a certain period. The substrate temperature may be set as appropriate in accordance with the purpose of the test. A test in the case where potential applied to the gate is higher than potentials of the source and the drain is referred to as a +BT test, and a test in the case where potential applied to the gate is lower than potentials of the source and the drain is referred to as a −BT test.

The stress conditions for the BT test can be determined by setting the substrate temperature, electric field intensity applied to a gate insulating film, or a time period of application of electric field. The electric field intensity applied to a gate insulating film can be determined by dividing the potential difference between the gate potential and the source and drain potential by the thickness of the gate insulating film. For example, in the case where the electric field intensity applied to the 100-nm-thick gate insulating film is to be set to 2 MV/cm, the potential difference may be set to 20 V.

In this embodiment, results of a BT test performed on three kinds of samples are described. The samples are subjected to heat treatment under a nitrogen atmosphere at 250° C., 350° C., and 450° C., which is performed before formation of source and drain in manufacture of a thin film transistor.

Note that "voltage" generally indicates a difference between potentials of two points, and "potential" indicates a static electric energy (electrical potential energy) unit charge which is at a point in a static electric field has. However, in an electronic circuit, a difference between a potential at a certain point and a reference potential (e.g., a ground potential) is often referred to as the potential at a certain point. Thus, in this specification, when a difference between a potential at a certain point and a reference potential (e.g., a ground potential) is referred to as the potential at a certain point, the potential at a certain point means the voltage except for the case where definition is particularly given.

As the BT test, a +BT test and a −BT test were performed under such conditions that a substrate temperature was 150° C., an electric field intensity applied to a gate insulating film was 2 MV/cm, and a time period for application was one hour.

First, the +BT test is described. In order to measure initial characteristics of a thin film transistor subjected to the BT test, a change in characteristics of the source-drain current (hereinafter, referred to as the drain current) was measured, under the conditions where the substrate temperature was set to 40° C., the voltage between source and drain (hereinafter, the drain voltage) was set to 10 V, and the voltage between source and gate (hereinafter, the gate voltage) was changed in the range of −20 V to +20 V. That is, Vg-Id characteristics were measured. Here, as a countermeasure against moisture-absorption onto surfaces of the samples, the substrate temperature was set to 40° C. However, the measurement may be performed at room temperature (25° C.) or lower if there is no particular problem.

Next, the substrate temperature was increased to 150° C., and then, the potentials of the source and the drain of the thin film transistor were set to 0 V. After that, the voltage was applied to the gate so that the electric field intensity applied to the gate insulating film was 2 MV/cm. In this case, the thickness of the gate insulating film of the thin film transistor was 100 nm. The gate was supplied with +20 V of voltage, and the gate supplied with the voltage was kept for one hour. Note that although the time period for voltage application was one hour here, the time period may be changed as appropriate in accordance with the purpose.

Next, the substrate temperature was lowered to 40° C. while the voltage was kept on being applied to the source, the drain, and the gate. If application of the voltage is stopped before the substrate temperature was completely lowered to 40° C., the thin film transistor which has been damaged during the BT test is repaired by the influence of residual heat. Thus, lowering of the substrate temperature needs to be performed with application of the voltage. After the substrate temperature was lowered to 40° C., application of the voltage was terminated.

Then, the Vg-Id characteristics were measured under the conditions same as those for the measurement of the initial characteristics, so that the Vg-Id characteristics after the +BT test were obtained.

Next, the −BT test is described. The −BT test was performed with the procedure similar to the +BT test, but has a different point from the +BT test, in that the voltage applied to the gate after the substrate temperature is increased to 150° C. is set to −20 V.

In the BT test, it is important to use a thin film transistor which has been never subjected to a BT test. For example, if a −BT test is performed with use of a thin film transistor which has been once subjected to a +BT test, the results of the −BT test cannot be evaluated correctly due to influence of the +BT test which has been performed previously. Similarly, if the thin film transistor which has been once subjected to a +BT test is used for another +BT test, the results cannot be evaluated correctly. However, the usage of the thin film transistor is not limited to the above in the case where the BT test is performed repeatedly in consideration of such influence.

Figure 41A:
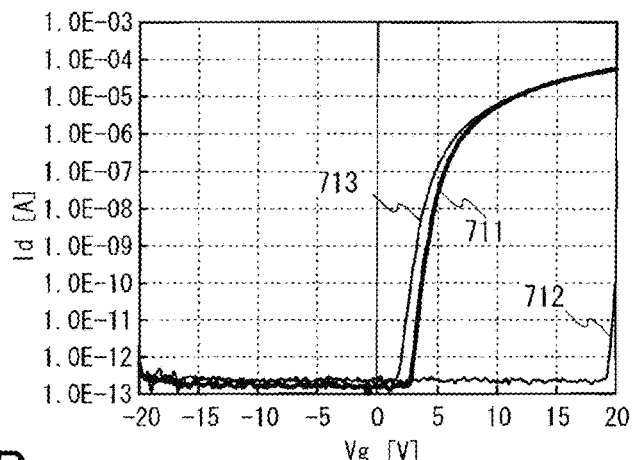
FIGS. 41A to 41C are graphs each showing Vg-Id characteristics of a thin film transistor before and after a BT test.
Figure 41B:
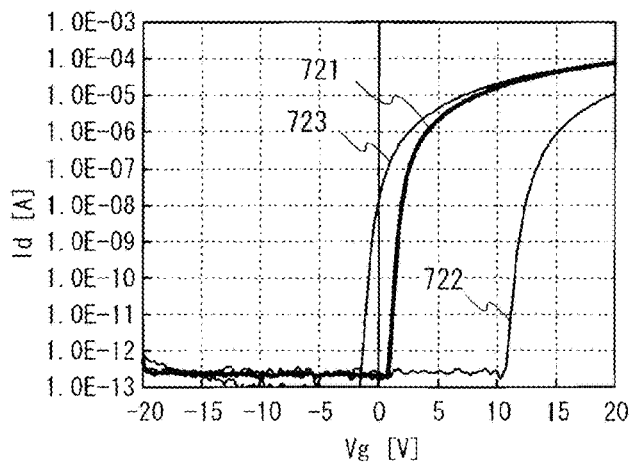
Figure 41C:
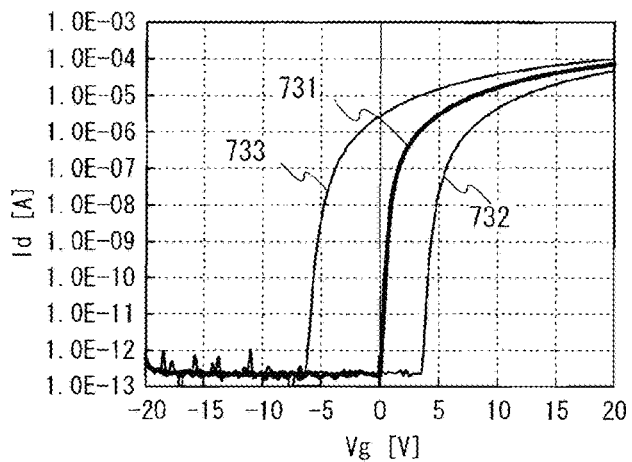

FIGS. 41A to 41C show the Vg-Id characteristics before and after the BT tests. FIG. 41A shows the BT test results of thin film transistors each formed in such a manner that heat treatment is performed under a nitrogen atmosphere at 250° C. before formation of a source and a drain. FIG. 41B shows the BT test results of thin film transistors each formed in such a manner that heat treatment is performed under a nitrogen atmosphere at 350° C. before formation of a source and a drain. FIG. 41C shows the BT test results of thin film transistors each formed in such a manner that heat treatment is performed under a nitrogen atmosphere at 450° C. before formation of a source and a drain.

In each graph, the horizontal axis represents the gate voltage (Vg) which is shown with a logarithmic scale, and the vertical axis represents the drain current (Id) which is shown with a logarithmic scale. Initial characteristics 711, 721, and 731 indicate the Vg-Id characteristics of the thin film transistors before the +BT tests, +BTs 712, 722, and 732 indicate the Vg-Id characteristics of the thin film transistors after +BT tests, and −BTs 713, 723, and 733 indicate the Vg-Id characteristics of the thin film transistors after −BT tests. Note that the Vg-Id characteristics of the thin film transistors before the −BT tests are almost the same as those before the +BT tests; thus, they are not shown in the graphs.

According to FIGS. 41A to 41C, it is found that as compared to the threshold voltages of the initial characteristics 711, 721, and 731, the threshold voltages of the +BTs 712, 722, and 732 are shifted in the plus direction, and the threshold voltages of the −BTs 713, 723, and 733 are shifted in the minus direction. In addition, in terms of the amount of shift in the threshold voltage after +BT test, it is found that the shift amount at 350° C. of FIG. 41B is smaller than that at 250° C. of FIG. 41A and that the shift amount at 450° C. of FIG. 41C is smaller than that at 350° C. of FIG. 41B. That is, the higher the temperature of heat treatment which is performed before formation of a source and a drain is made, the smaller the amount of shift in the threshold voltage after +BT tests becomes.

The temperature of heat treatment at 450° C. or higher can improve reliability in at least the +BT tests. It is found that there is a relation between elimination of impurities such as moisture ($H_2O$) from the In—Ga—Zn—O-based non-single-crystal film and the results of the BT stress tests.

The source and drain electrode layers 405a and 405b in contact with the semiconductor layer 403 which is an oxide semiconductor layer is formed using one or more materials selected from titanium, aluminum, manganese, magnesium, zirconium, and beryllium. Further, an alloy film including these elements in combination, and the like, may be stacked.

The semiconductor layer 403 including a channel formation region may be formed using an oxide material having semiconductor characteristics. Typically, an In—Ga—Zn—O-based non-single-crystal film is used.

FIGS. 6A to 6D are cross-sectional views illustrating manufacturing steps of the thin film transistor 470.

Figure 6A:
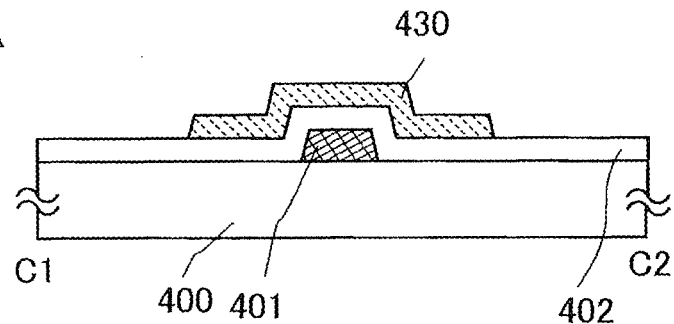
FIGS. 6A to 6D are cross-sectional views illustrating manufacturing steps of one embodiment of the present invention.

In FIG. 6A, the gate electrode layer 401 is provided over the substrate 400 which is a substrate having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a stacked structure of three layers, a stacked layer of a tungsten layer or a tungsten nitride layer, an alloy of aluminum and silicon or an alloy of aluminum and titanium, and a titanium nitride layer or a titanium layer is preferable.

The gate insulating layer 402 is formed over the gate electrode layer 401.

The gate insulating layer 402 can be formed to have a single layer of a silicon oxide layer, a silicon nitride layer, a silicon oxynitride layer, or a silicon nitride oxide layer or a stacked layer thereof by a plasma CVD method or a sputtering method. For example, a silicon oxynitride layer may be formed by a plasma CVD method using $SiH_4$, oxygen, and nitrogen as a deposition gas.

Next, an oxide semiconductor film is formed over the gate insulating layer 402.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which, without application of a voltage to a target side, an RF power source is used for application of a voltage to a substrate side under an argon atmosphere and plasma is generated in the vicinity of the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

The oxide semiconductor film is formed by a sputtering method with use of an In—Ga—Zn—O-based oxide semiconductor target. Alternatively, the oxide semiconductor film can be formed by a sputtering method under a rare gas (typically, argon) atmosphere, an oxygen atmosphere, or an atmosphere of a rare gas (typically, argon) and oxygen.

The gate insulating layer 402 and the oxide semiconductor film may be formed successively without exposure to air. Successive film formation without exposure to air makes it possible to obtain an interface of stacked layers, which are not contaminated by atmospheric components or impurity elements floating in air, such as moisture or hydrocarbon. Therefore, variation in characteristics of the thin film transistor can be reduced.

The oxide semiconductor film is processed into an island-shaped oxide semiconductor layer 430 (a first oxide semiconductor layer) by a photolithography step (see FIG. 6A).

Figure 6B:
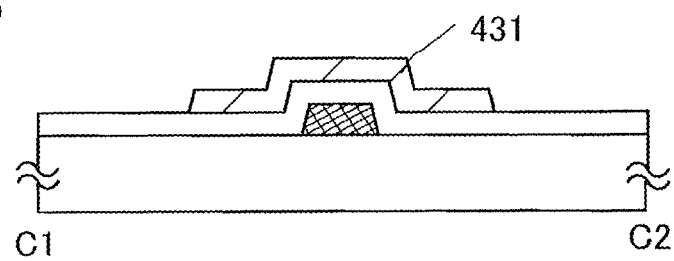

Heat treatment is performed on the oxide semiconductor layer under an atmosphere of an inert gas (such as nitrogen, helium, neon, or argon) or under reduced pressure, and then, slow cooling is performed under an inert atmosphere (see FIG. 6B).

By heat treatment performed on the oxide semiconductor layer 430 under such an atmosphere, impurities contained in the oxide semiconductor layer 430, such as hydrogen and moisture, can be removed.

Note that in heat treatment, it is preferable that moisture, hydrogen, and the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more; that is, an impurity concentration is set to 1 ppm or lower, preferably, 0.1 ppm or lower.

As heat treatment, an instantaneous heating method can be employed, such as a heating method using an electric furnace, a GRTA (gas rapid thermal anneal) method using a heated gas, or an LRTA (Lamp Rapid Thermal Anneal) method using lamp light.

Here, a heating method using an electric furnace 601 is described with reference to FIG. 14 as one mode of heat treatment of the oxide semiconductor layer 430.

Figure 14:
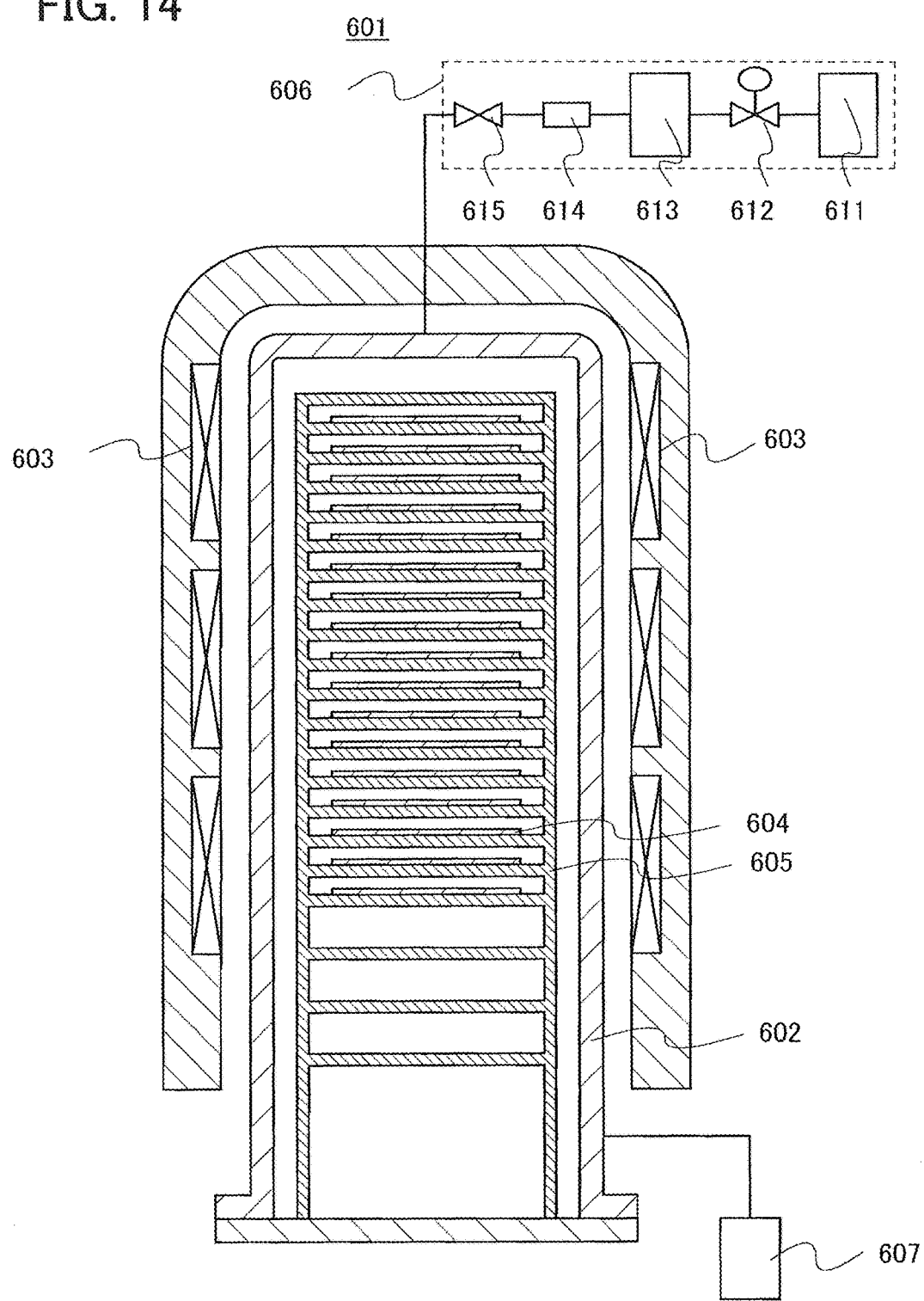
FIG. 14 is a cross-sectional view of an electric furnace.

FIG. 14 is a schematic view of the electric furnace 601. Heaters 603 are provided outside a chamber 602, which heats the chamber 602. Inside the chamber 602, a susceptor 605 in which a substrate 604 is mounted is provided. The substrate 604 is transferred into/from the chamber 602. In addition, the chamber 602 is provided with a gas supply means 606 and an evacuation means 607. With the gas supply means 606, a gas is introduced into the chamber 602. The evacuation means 607 exhausts the inside of the chamber 602 or reduces the pressure in the chamber 602. Note that the temperature rising characteristics of the electric furnace is preferably set to from 0.1° C./min to 20° C./min. The temperature decreasing characteristics of the electric furnace is preferably set to from 0.1° C./min to 15° C./min.

The gas supply means 606 includes a gas supply source 611, a pressure adjusting valve 612, a refining apparatus 613, a mass flow controller 614, and a stop valve 615. In this embodiment, it is preferable that the refining apparatus 613 be provided between the gas supply source 611 and the chamber 602. The refining apparatus 613 can remove impurities such as moisture and hydrogen in a gas which is introduced from the gas supply source 611 into the chamber 602; thus, entry into the chamber 602, of moisture, hydrogen, and the like, can be suppressed by provision of the refining apparatus 613.

In this embodiment, nitrogen or a rare gas is introduced into the chamber 602 from the gas supply source 611, so that the inside of the chamber 602 is in a nitrogen or a rare gas atmosphere. In the chamber 602 heated at from 200° C. to 600° C. inclusive, preferably, from 400° C. to 450° C. inclusive, the oxide semiconductor layer 430 formed over the substrate 604 is heated, whereby the oxide semiconductor layer 430 can be dehydrated or dehydrogenated.

Alternatively, the chamber 602 in which the pressure is reduced by the evacuation means is heated at from 200° C. to 600° C. inclusive, preferably, from 400° C. to 450° C. inclusive. In such a chamber 602, the oxide semiconductor layer 430 formed over the substrate 604 is heated, whereby the oxide semiconductor layer 430 can be dehydrated or dehydrogenated.

Next, the heaters are turned off, and the chamber 602 of the heating apparatus is gradually cooled. By performance of heat treatment and slow cooling under an inert-gas atmosphere or under reduced pressure, resistance of the oxide semiconductor layer is reduced (i.e., the carrier concentration is increased, preferably to $1\times10^{18}/cm^3$ or higher), so that a low-resistance oxide semiconductor layer 431 (a second oxide semiconductor layer) can be formed.

As a result, reliability of the thin film transistor formed later can be improved.

Note that in the case where heat treatment is performed under reduced pressure, an inert gas may be discharged after the heat treatment, so that the chamber is to be under an atmospheric pressure, and then, cooling may be performed.

After the substrate 604 in the chamber 602 of the heating apparatus is cooled to 300° C., the substrate 604 may be transferred into an atmosphere at room temperature. As a result, the cooling time of the substrate 604 can be shortened.

If the heating apparatus has a multi-chamber structure, heat treatment and cool treatment can be performed in chambers different from each other. Typically, an oxide semiconductor layer over a substrate is heated in a first chamber which is filled with nitrogen or a rare gas and heated at from 200° C. to 600° C. inclusive, preferably from 400° C. to 450° C. inclusive. Next, the substrate subjected to heat treatment is transferred, through a transfer chamber in which nitrogen or a rare gas is introduced, into a second chamber which is filled with nitrogen or a rare gas and heated at 100° C. or lower, preferably at room temperature, and then cooling treatment is performed therein. Through the above steps, throughput can be increased.

The heat treatment of the oxide semiconductor layer under an inert-gas atmosphere or reduced pressure may be performed on the oxide semiconductor film which has not yet been processed into the island-shaped oxide semiconductor layer. In that case, after heat treatment of the oxide semiconductor film performed under an inert-gas atmosphere or reduced pressure, slow cooling is performed to the temperature equal to or higher than room temperature and lower than 100° C. Then, the substrate is taken out from the heating apparatus, and a photolithography step is performed.

The oxide semiconductor film which has been subjected to heat treatment under an inert-gas atmosphere or reduced pressure is preferably an amorphous film, but a part thereof may be crystallized.

Next, a conductive film is formed over the gate insulating layer 402 and the oxide semiconductor layer 431.

As a material for the conductive film, an element selected from Al, Cr, Ta, Ti, Mo, and W; an alloy containing any of the above elements as its component; an alloy film containing a combination of any of the above elements; and the like can be given.

If heat treatment is performed after formation of the conductive film, the conductive film preferably has heat resistance enough to withstand the heat treatment. Since use of Al alone brings disadvantages such as low resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of these above elements as a component, an alloy containing these elements in combination, and a nitride containing any of these above elements as a component.

Figure 6C:
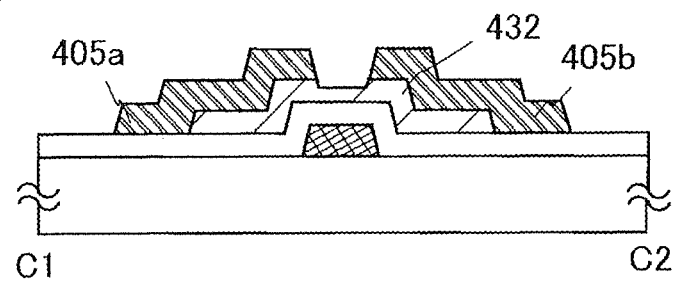
Figure 6D:
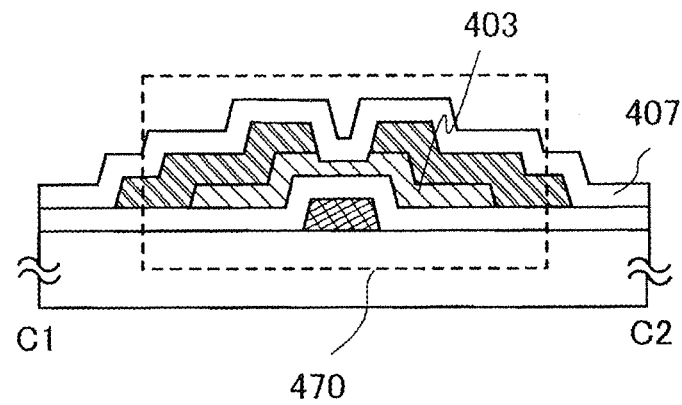

The oxide semiconductor layer 431 and the conductive film are etched in an etching step, so that an oxide semiconductor layer 432 and the source and drain electrode layers 405a and 405b are formed (see FIG. 6C). Note that the oxide semiconductor layer 432 is partly etched so as to have a groove (a depressed portion).

The oxide insulating film 407 is formed by a sputtering method so as to be in contact with the oxide semiconductor layer 432. The oxide insulating film 407 which is formed to be in contact with the low-resistance oxide semiconductor layer does not contain impurities such as moisture, a hydrogen ion, and OW and is formed using an inorganic insulating film which prevents the impurities from entering from the outside. Specifically, a silicon oxide film or a silicon nitride oxide is used.

In this embodiment, as the oxide insulating film 407, a 300-nm-thick silicon oxide film is formed. The substrate temperature in film formation may be from room temperature to 300° C. or lower and in this embodiment, is 100° C. The formation of the silicon oxide film by a sputtering method can be performed under a rare gas (typically, argon) atmosphere, an oxygen atmosphere, or an atmosphere of a rare gas (typically, argon) and oxygen. As a target, a silicon oxide target or a silicon target may be used. For example, with use of a silicon target, a silicon oxide film can be formed by a sputtering method under an atmosphere of oxygen and nitrogen.

When the oxide insulating film 407 is formed by a sputtering method, a PCVD method, or the like to be in contact with the low-resistance oxide semiconductor layer 432, in the low-resistance oxide semiconductor layer 432, at least a region in contact with the oxide insulating film 407 have increased resistance (i.e., the carrier concentration is reduced, preferably to lower than $1\times10^{18}/cm^3$). Thus, a high-resistance oxide semiconductor region can be obtained. During a manufacture process of a semiconductor device, it is important to increase and decrease the carrier concentration in the oxide semiconductor layer through performance of heat treatment and slow cooling under an inert-gas atmosphere (or reduced pressure), formation of an oxide insulating film, and the like. The oxide semiconductor layer 432 becomes the semiconductor layer 403 having a high-resistance oxide semiconductor region (a third oxide semiconductor layer), and then, the thin film transistor 470 can be completed (see FIG. 6D).

Impurities (such as $H_2O$, H, and OH) contained in the oxide semiconductor layer are reduced by performance of the heat treatment for dehydration or dehydrogenation, and the carrier concentration is increased. After that, slow cooling is performed. Then, formation of an oxide insulating film in contact with the oxide semiconductor layer, or the like, is performed, so that the carrier concentration of the oxide semiconductor layer is reduced. Thus, reliability of the thin film transistor 470 can be improved.

Further, after formation of the oxide insulating film 407, heat treatment may be performed on the thin film transistor 470, under a nitrogen atmosphere or an air atmosphere (in air) at temperature equal to or higher than 150° C. and lower than 350° C., preferably. For example, heat treatment under a nitrogen atmosphere at 250° C. is performed for one hour. In such heat treatment, the oxide semiconductor layer 432 in a condition of being in contact with the oxide insulating film 407 is heated; thus, variation in electric characteristics of the thin film transistor 470 can be reduced. There is no particular limitation on when to perform this heat treatment (at temperature equal to or higher than 150° C. and lower than 350° C., preferably) as long as it is performed after the oxide insulating film 407 is formed. When this heat treatment also serves as heat treatment in another step, e.g., heat treatment in formation of a resin film or heat treatment for reducing resistance of a transparent conductive film, the number of steps can be prevented from increasing.

Embodiment 2

A semiconductor device and a method for manufacturing a semiconductor device will be described with reference to FIGS. 8A to 8D and FIGS. 9A and 9B. The same portion as or a portion having functions similar to those described in Embodiment 1 can be formed in a manner similar to that described in Embodiment 1; therefore, repetitive description is omitted.

Figure 9A:
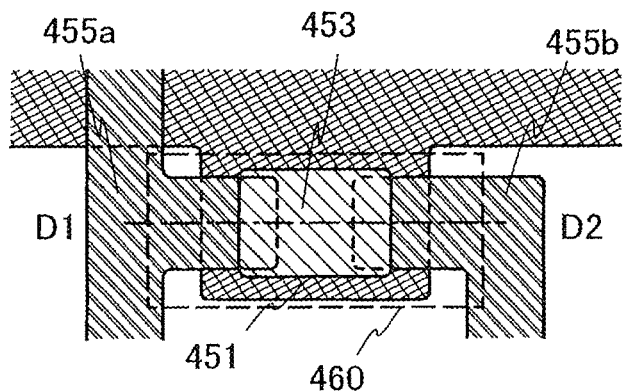
FIGS. 9A and 9B illustrate a semiconductor device of one embodiment of the present invention.
Figure 9B:
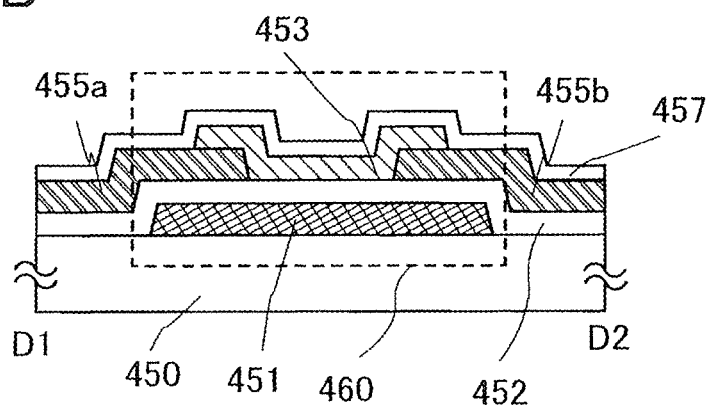

FIG. 9A is a top view of a thin film transistor 460 included in a semiconductor device, and FIG. 9B is a cross-sectional view along line D1-D2 of FIG. 9A. The thin film transistor 460 is a bottom-gate thin film transistor and includes, over a substrate 450 which is a substrate having an insulating surface, a gate electrode layer 451, a gate insulating layer 452, source and drain electrode layers 455a and 455b, and a semiconductor layer 453. In addition, an oxide insulating film 457 is provided so as to cover the thin film transistor 460 and be in contact with the semiconductor layer 453. For the semiconductor layer 453, an In—Ga—Zn—O-based non-single-crystal film is used.

In the thin film transistor 460, the gate insulating layer 452 exists throughout the region including the thin film transistor 460, and the gate electrode layer 451 is provided between the gate insulating layer 452 and the substrate 450 which is a substrate having an insulating surface. Over the gate insulating layer 452, the source and drain electrode layers 455a and 455b are provided. Further, over the gate insulating layer 452 and the source and drain electrode layers 455a and 455b, the semiconductor layer 453 is provided. Although not illustrated, in addition to the source and drain electrode layers 455a and 455b, a wiring layer is provided over the gate insulating layer 452, and the wiring layer extends beyond the peripheral portion of the semiconductor layer 453.

The semiconductor layer 453 formed using an oxide semiconductor film is subjected to heat treatment (heat treatment for dehydration or dehydrogenation) for reducing impurities such as moisture and the like at least after formation of the oxide semiconductor film, so that resistance is reduced (the carrier concentration is increased, preferably to $1\times10^{18}/cm^3$ or higher). After that, the oxide insulating film 457 is formed to be in contact with the oxide semiconductor film, so that the oxide semiconductor film has increased resistance (i.e., the carrier concentration is reduced, preferably to lower than $1\times10^{18}/cm^3$). Accordingly, the oxide semiconductor film can be used as a channel formation region.

After elimination of impurities such as moisture ($H_2O$) by performance of heat treatment for dehydration or dehydrogenation, it is preferable that slow cooling be performed in an inert atmosphere. After heat treatment for dehydration or dehydrogenation and slow cooling, the carrier concentration of the oxide semiconductor layer is reduced by formation of an oxide insulating film to be in contact with the oxide semiconductor layer or the like, which improves reliability of the thin film transistor 460.

The source and drain electrode layers 455a and 455b in contact with the semiconductor layer 453 which is an oxide semiconductor layer is formed using one or more materials selected from titanium, aluminum, manganese, magnesium, zirconium, and beryllium.

FIGS. 8A to 8D are cross-sectional views illustrating manufacturing steps of the thin film transistor 460.

The gate electrode layer 451 is provided over the substrate 450 which is a substrate having an insulating surface. An insulating film serving as a base film may be provided between the substrate 450 and the gate electrode layer 451. The base film has a function of preventing diffusion of an impurity element from the substrate 450, and can be formed to have a single-layer or stacked-layer structure using one or more of a silicon nitride film, a silicon oxide film, a silicon nitride oxide film, and a silicon oxynitride film. The gate electrode layer 451 can be formed to have a single-layer or stacked-layer structure using a metal material selected from molybdenum, titanium, chromium, tantalum, tungsten, aluminum, copper, neodymium, and scandium, or an alloy material which contains any of these materials as its main component.

The gate insulating layer 452 is formed over the gate electrode layer 451.

The gate insulating layer 452 can be formed by a plasma CVD method or a sputtering method to have a single layer of a silicon oxide layer, a silicon nitride layer, a silicon oxynitride layer, or a silicon nitride oxide layer or a stacked layer thereof.

Figure 8A:
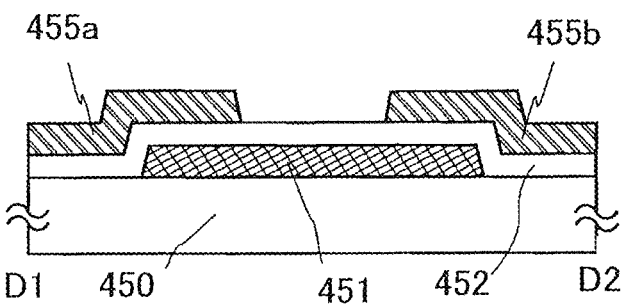
FIGS. 8A to 8D are cross-sectional views illustrating manufacturing steps of one embodiment of the present invention.

Over the gate insulating layer 452, a conductive film is formed and patterned into island-shaped source and drain electrode layers 455a and 455b by a photolithography step (FIG. 8A).

As the material of the source and drain electrode layers 455a and 455b, there are an element selected from Al, Cr, Ta, Ti, Mo, and W, an alloy including any of these elements as its component, an alloy including a combination of any of these elements, and the like. Further, an alloy film including these elements in combination, and the like, may be stacked.

The source and drain electrode layers 455a and 455b are preferably formed using a molybdenum film having high heat resistance enough to withstand heat treatment for dehydration or dehydrogenation performed later. In addition, an element selected from Al, Cr, Ta, Ti, and W, an alloy including any of the above elements, an alloy film including these elements in combination, and the like may be stacked over the molybdenum film.

Figure 8B:
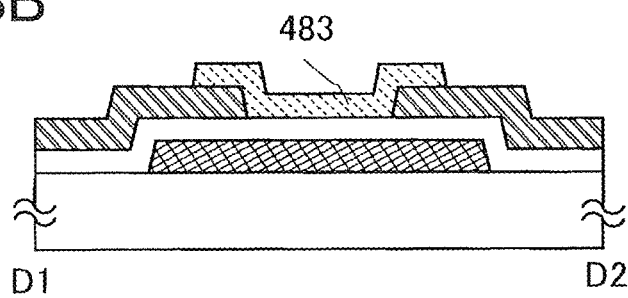
Figure 8C:
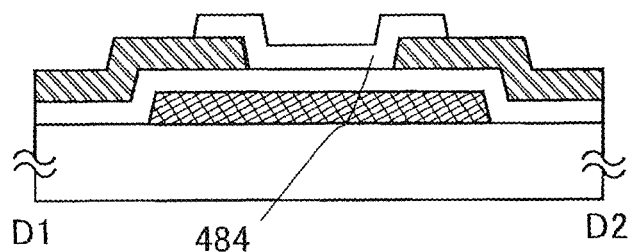
Figure 8D:
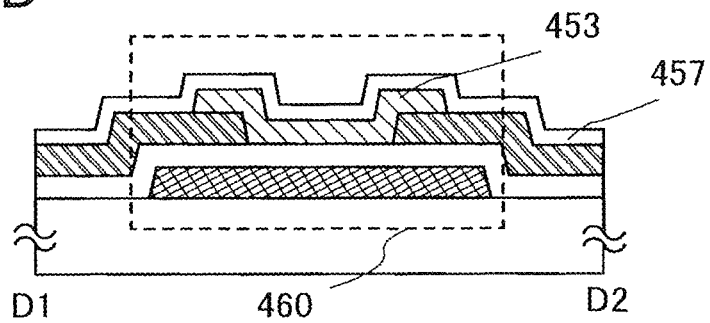

Then, an oxide semiconductor film is formed over the gate insulating layer 452 and the source and drain electrode layers 455a and 455b, and patterned into an island-shaped oxide semiconductor layer 483 (a first oxide semiconductor layer) by a photolithography step (FIG. 8B).

The oxide semiconductor layer 483 serves as a channel formation region and is thus formed in a manner similar to the first oxide semiconductor film in Embodiment 1.

Note that before the oxide semiconductor layer 483 is formed by a sputtering method, dust attached to a surface of the gate insulating layer 452 is preferably removed by reverse sputtering in which an argon gas is introduced and plasma is generated.

Heat treatment for dehydration or dehydrogenation is performed on the oxide semiconductor layer 483, and then, slow cooling is performed under an inert atmosphere. As heat treatment for dehydration or dehydrogenation, heat treatment is performed under an inert gas (such as nitrogen, helium, neon, or argon) atmosphere or under reduced pressure at temperature of from 200° C. to 600° C. inclusive, preferably, from 400° C. to 450° C. inclusive. By the heat treatment in the above atmosphere, resistance of the oxide semiconductor layer 483 is reduced (i.e., the carrier concentration is increased, preferably to $1\times10^{18}/cm^3$ or higher), so that a low-resistance oxide semiconductor layer 484 (a second oxide semiconductor layer) can be obtained (see FIG. 8C).

Note that in heat treatment for dehydration or dehydrogenation, it is preferable that moisture, hydrogen, and the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more; that is, an impurity concentration is set to 1 ppm or lower, preferably, 0.1 ppm or lower.

The heat treatment of the oxide semiconductor layer under an inert-gas atmosphere or under reduced pressure may be performed on the oxide semiconductor film which has not yet been processed into the island-shaped oxide semiconductor layer. In that case, after heat treatment of the oxide semiconductor film performed under an inert-gas atmosphere or reduced pressure, slow cooling is performed to the temperature equal to or higher than room temperature and lower than 100° C. Then, the substrate is taken out from the heating apparatus, and a photolithography step is performed.

Next, the oxide insulating film 457 is formed by a sputtering method or a PCVD method to be in contact with the oxide semiconductor layer 484. In this embodiment, a 300-nm-thick silicon oxide film is formed as the oxide insulating film 457. The substrate temperature in film formation may be from room temperature to 300° C. or lower and in this embodiment, is 100° C. When the oxide insulating film 457 is formed by a sputtering method to be in contact with the low-resistance oxide semiconductor layer 484, in the low-resistance oxide semiconductor layer 484, at least a region in contact with the oxide insulating film 457 which is a silicon oxide film have increased resistance (i.e., the carrier concentration is reduced, preferably to lower than $1\times10^{18}/cm^3$). Thus, a high-resistance oxide semiconductor region can be obtained. During a manufacture process of a semiconductor device, it is important to increase and decrease the carrier concentration in the oxide semiconductor layer by performance of heat treatment and slow cooling under an inert-gas atmosphere (or under reduced pressure), formation of an oxide insulating film, and the like. The oxide semiconductor layer 484 becomes the semiconductor layer 453 having the high-resistance oxide semiconductor region (a third oxide semiconductor layer), and then, the thin film transistor 460 can be completed (see FIG. 8D).

Impurities (such as $H_2O$, H, and OH) contained in the oxide semiconductor layer are reduced by performance of heat treatment for dehydration or dehydrogenation, and the carrier concentration is increased. After that, slow cooling is performed. Then, formation of an oxide insulating film in contact with the oxide semiconductor layer, or the like, is performed, so that the carrier concentration of the oxide semiconductor layer is reduced. Thus, reliability of the thin film transistor 460 can be improved.

Further, after formation of the silicon oxide film as the oxide insulating film 457, heat treatment may be performed on the thin film transistor 460, under a nitrogen atmosphere or an air atmosphere (in air) at temperature equal to or higher than 150° C. and lower than 350° C., preferably. For example, heat treatment is performed under a nitrogen atmosphere at 250° C. for one hour. In such heat treatment, the semiconductor layer 453 in a condition being in contact with the oxide insulating film 457 is heated; thus, variation in electric characteristics of the thin film transistor 460 can be reduced. There is no particular limitation on when to perform this heat treatment (at equal to or higher than 150° C. and lower than 350° C., preferably) as long as it is performed after the oxide insulating film 457 is formed. When this heat treatment also serves as heat treatment in another step, e.g., heat treatment in formation of a resin film or heat treatment for reducing resistance of a transparent conductive film, the number of steps can be prevented from increasing.

This embodiment can be freely combined with Embodiment 1.

Embodiment 3

A manufacturing process of a semiconductor device including a thin film transistor will be described with reference to FIGS. 10A to 10D, FIGS. 11A to 11C, FIG. 12, and FIGS. 13A1, 13A2, 13B1, and 13B2.

Figure 10A:
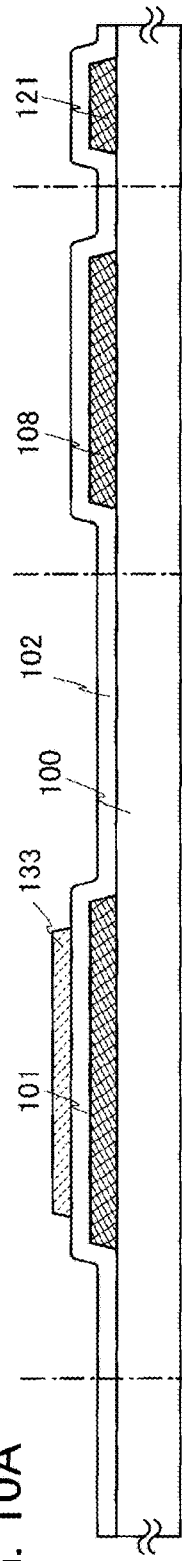
FIGS. 10A to 10D are cross-sectional views illustrating manufacturing steps of one embodiment of the present invention.
Figure 10B:
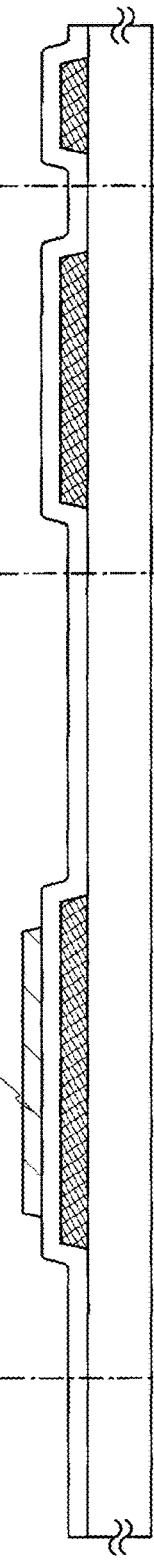

In FIG. 10A, as a substrate 100 having a light-transmitting property, a glass substrate of barium borosilicate glass, aluminoborosilicate glass, or the like can be used.

Next, a conductive layer is formed over an entire surface of the substrate 100, and then a first photolithography step is performed. A resist mask is formed, and then an unnecessary portion is removed by etching, so that wirings and electrodes (a gate wiring including a gate electrode layer 101, a capacitor wiring 108, and a first terminal 121) are formed. At this time, the etching is performed so that at least end portions of the gate electrode layer 101 have a tapered shape.

Each of the gate wiring including the gate electrode layer 101, the capacitor wiring 108, and the first terminal 121 at a terminal portion is preferably formed using a heat-resistant conductive material such as an element selected from titanium (Ti), tantalum (Ta), tungsten (W), molybdenum (Mo), chromium (Cr), neodymium (Nd), and scandium (Sc); an alloy containing any of these elements as its component; an alloy film containing a combination of any of these elements; or a nitride containing any of these elements as its component.

Next, a gate insulating layer 102 is formed over the entire surface of the gate electrode layer 101. The gate insulating layer 102 is formed to a thickness of 50 to 250 nm by a PCVD method, a sputtering method, or the like.

For example, as the gate insulating layer 102, a silicon oxide film is formed to a thickness of 100 nm by a sputtering method. Needless to say, the gate insulating layer 102 is not necessarily formed using such a silicon oxide film and may be formed to have a single-layer structure or a stacked-layer structure using another insulating film: a silicon oxynitride film, a silicon nitride film, an aluminum oxide film, a tantalum oxide film, and the like.

Next, an oxide semiconductor film (an In—Ga—Zn—O-based non-single-crystal film) is formed over the gate insulating layer 102. It is effective to form the In—Ga—Zn—O-based non-single-crystal film without exposure to air after the plasma treatment because dust and moisture do not adhere to the interface between the gate insulating layer and the semiconductor film. Here, the oxide semiconductor film is formed under an argon atmosphere, an oxygen atmosphere, or an atmosphere including both argon and oxygen under the conditions where the target is an oxide semiconductor target including In, Ga, and Zn (an In—Ga—Zn—O-based oxide semiconductor target ($In_2O_3:Ga_2O_3:ZnO=1:1:1$)) with a diameter of 8 inches, the distance between the substrate and the target is set to 170 mm, the pressure is set at 0.4 Pa, and the direct current (DC) power supply is set at 0.5 kW. Note that a pulse direct current (DC) power supply is preferable because dust can be reduced and the film thickness can be uniform. The second In—Ga—Zn—O-based non-single-crystal film is formed to have a thickness of 5 nm to 200 nm. As the oxide semiconductor film, a 50-nm-thick In—Ga—Zn—O-based non-single-crystal film is formed by a sputtering method using an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set. With the multi-source sputtering apparatus, films of different materials can be formed to be stacked in the same chamber, or a film of plural kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method using sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a second photolithography step is performed. A resist mask is formed, and then the oxide semiconductor film is etched. For example, unnecessary portions are removed by wet etching using a mixed solution of phosphoric acid, acetic acid, and nitric acid, so that an oxide semiconductor layer 133 is formed (see FIG. 10A). Note that etching here is not limited to wet etching but dry etching may also be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, or the like can be used. In addition, ITO07N (produced by KANTO CHEMICAL CO., INC.) may also be used.

The etchant used in the wet etching is removed by cleaning together with the material which is etched off. Waste liquid of the etchant containing the removed materials may be purified to recycle the materials contained in the waste liquid. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, heat treatment for dehydration or dehydrogenation is performed on the oxide semiconductor layer 133. After heat treatment performed under an inert gas (such as nitrogen, helium, neon, or argon) atmosphere or under reduced pressure for the oxide semiconductor layer 133, slow cooling is performed under an inert atmosphere.

Heat treatment is preferably performed at a temperature of 200° C. or higher. For example, heat treatment is performed for 1 hour at 450° C. under a nitrogen atmosphere. By the heat treatment under a nitrogen atmosphere, resistance of the oxide semiconductor layer 133 is reduced (i.e., the carrier concentration is increased, preferably to $1 \times 10^{18}/cm^3$ or higher), which results in increase of conductivity of the oxide semiconductor layer 133. Therefore, a low-resistance oxide semiconductor layer 134 is formed (see FIG. 10B). Preferable electrical conductivity of the oxide semiconductor layer 134 is from $1 \times 10^{-1}$ S/cm to $1 \times 10^2$ S/cm inclusive.

Figure 10C:
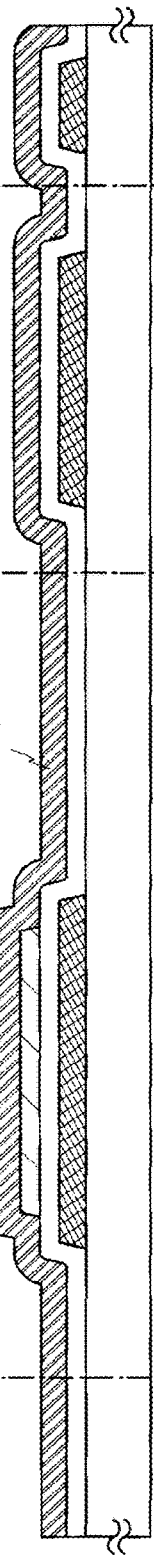

Next, a conductive film 132 is formed using a metal material over the oxide semiconductor layer 134 by a sputtering method or a vacuum evaporation method (see FIG. 10C).

As the material of the conductive film 132, an element selected from Al, Cr, Ta, Ti, Mo, and W, an alloy containing any of these elements as a component, an alloy film containing these elements in combination, and the like can be given.

When heat treatment is performed after the conductive film 132 is formed, the conductive film preferably has heat resistance enough to withstand this heat resistance.

Figure 10D:
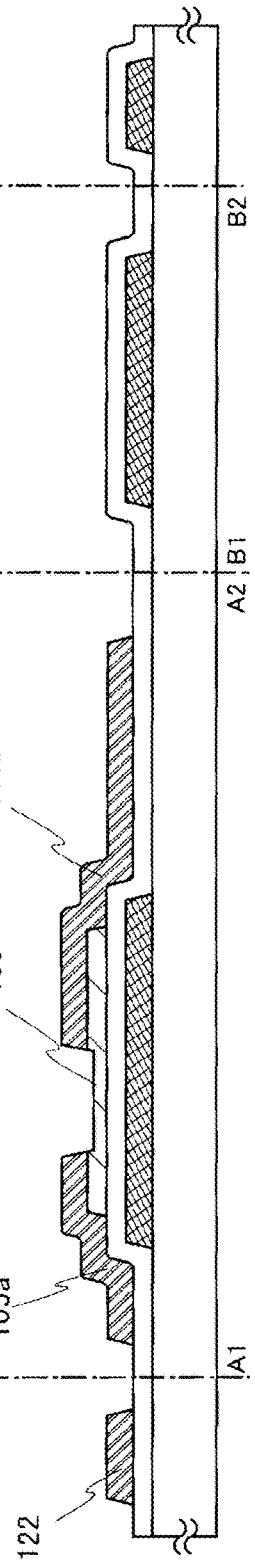
Figure 12:
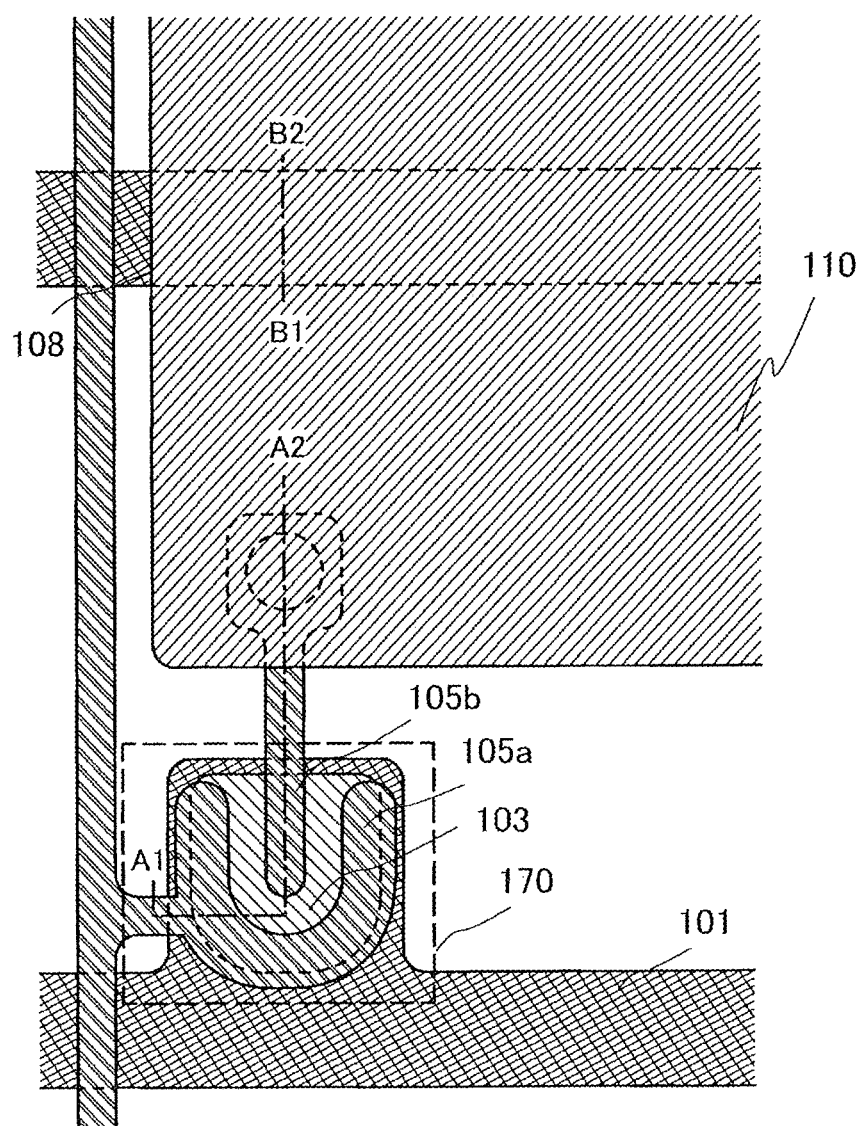
FIG. 12 illustrates a semiconductor device of one embodiment of the present invention.

Next, a third photolithography step is performed. A resist mask is formed, and unnecessary portions are removed, so that source and drain electrode layers 105a and 105b, and a second terminal 122 are formed (see FIG. 10D). Wet etching or dry etching is employed as an etching method at this time. For example, when an aluminum film or an aluminum-alloy film is used as the conductive film 132, wet etching using a mixed solution of phosphoric acid, acetic acid, and nitric acid can be carried out. Here, by wet etching using an ammonia hydrogen peroxide mixture (with the ratio of hydrogen peroxide:ammonia:water=5:2:2), the conductive film 132 is etched to form the source and drain electrode layers 105a and 105b. In this etching step, an exposed region of the oxide semiconductor layer 134 is also partly etched to form a semiconductor layer 135. Thus, a region of the semiconductor layer 135, which lies between the source and drain electrode layers 105a and 105b has a small thickness. In FIG. 10D, etching of the source and drain electrode layers 105a and 105b and the semiconductor layer 135 are simultaneously conducted using dry etching; therefore, the end portions of the source and drain electrode layers 105a and 105b are aligned with the end portions of the semiconductor layer 135, so that a continuous structure is provided.

In the third photolithography step, the second terminal 122 which is formed from the same material as the source and drain electrode layers 105a and 105b is left in a terminal portion. Note that the second terminal 122 is electrically connected to a source wiring (a source wiring including the source or drain electrode layers 105a or 105b).

Further, by use of a resist mask having regions with plural thicknesses (typically, two different thicknesses) which is formed using a multi-tone mask, the number of resist masks can be reduced, resulting in simplified process and lower costs.

Next, the resist mask is removed and a protective insulating layer 107 is formed to cover the gate insulating layer 102, the oxide semiconductor layer 135, and the source and drain electrode layers 105a and 105b. The protective insulating layer 107 is formed using a silicon oxynitride film by a PCVD method. When an exposed region of the oxide semiconductor layer 135 which lies between the source and drain electrode layers 105a and 105b is provided to be in contact with the oxynitride film that is the protective insulating layer 107, in the oxide semiconductor layer 135, a region in contact with the protective insulating layer 107 has increased resistance (i.e., the carrier concentration is reduced, preferably to lower than $1\times10^{18}/\text{cm}^3$). Thus, a semiconductor layer 103 having a high-resistance channel formation region can be formed (see FIG. 11A).

Heat treatment may be performed under an oxygen atmosphere before formation of the protective insulating layer 107. The heat treatment under an oxygen atmosphere may be performed at a temperature higher than or equal to 150° C. and lower than 350° C.

Heat treatment may be performed after formation of the protective insulating layer 107. The heat treatment may be performed under an air atmosphere or a nitrogen atmosphere at a temperature higher than or equal to 150° C. and lower than 350° C. In such heat treatment, the semiconductor layer 103 in a condition being in contact with the oxide insulating layer 107 is heated, which leads to increase in resistance of the semiconductor layer 103; thus, electric characteristics of the transistor can be improved and variation in electric characteristics can be reduced. There is no particular limitation on when to perform this heat treatment (at equal to or higher than 150° C. and lower than 350° C., preferably) as long as it is performed after the protective insulating layer 107 is formed. When this heat treatment also serves as heat treatment in another step, e.g., heat treatment in formation of a resin film or heat treatment for reducing resistance of a transparent conductive film, the number of steps can be prevented from increasing.

Through the above steps, a thin film transistor 170 can be completed.

Next, a fourth photolithography step is performed. A resist mask is formed, and the protective insulating layer 107 and the gate insulating layer 102 are etched to form a contact hole 125 that reaches the drain electrode layer 105b. In addition, a contact hole 127 reaching the second terminal 122 and a contact hole 126 reaching the first terminal 121 are also formed in the same etching step. A cross-sectional view at this stage is illustrated in FIG. 11B.

Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability. Further, when heat treatment for reducing resistance of the transparent conductive film, the heat treatment can serve as heat treatment for increasing resistance of the semiconductor layer 103, which results in improvement of electric characteristics of the transistor and reduction of variation in the electric characteristics thereof.

Next, a fifth photolithography step is performed. A resist mask is formed, and an unnecessary portion of the transparent conductive film is removed by etching to form a pixel electrode layer 110.

In the fifth photolithography step, a storage capacitor is formed with the capacitor wiring 108 and the pixel electrode layer 110, in which the gate insulating layer 102 and the protective insulating layer 107 in the capacitor portion are used as a dielectric.

In addition, in this fifth photolithography step, the first terminal 121 and the second terminal 122 are covered with the resist mask, and transparent conductive films 128 and 129 are left in the terminal portions. The transparent conductive films 128 and 129 function as electrodes or wirings connected to an FPC. The transparent conductive film 128 formed over the first terminal 121 is a connecting terminal electrode serving as an input terminal of a gate wiring. The transparent conductive film 129 formed over the second terminal 122 is a connection terminal electrode which functions as an input terminal of the source wiring.

Then, the resist mask is removed. A cross-sectional view at this stage is illustrated in FIG. 11C. Note that a plan view at this stage corresponds to FIG. 12.

Figure 1:
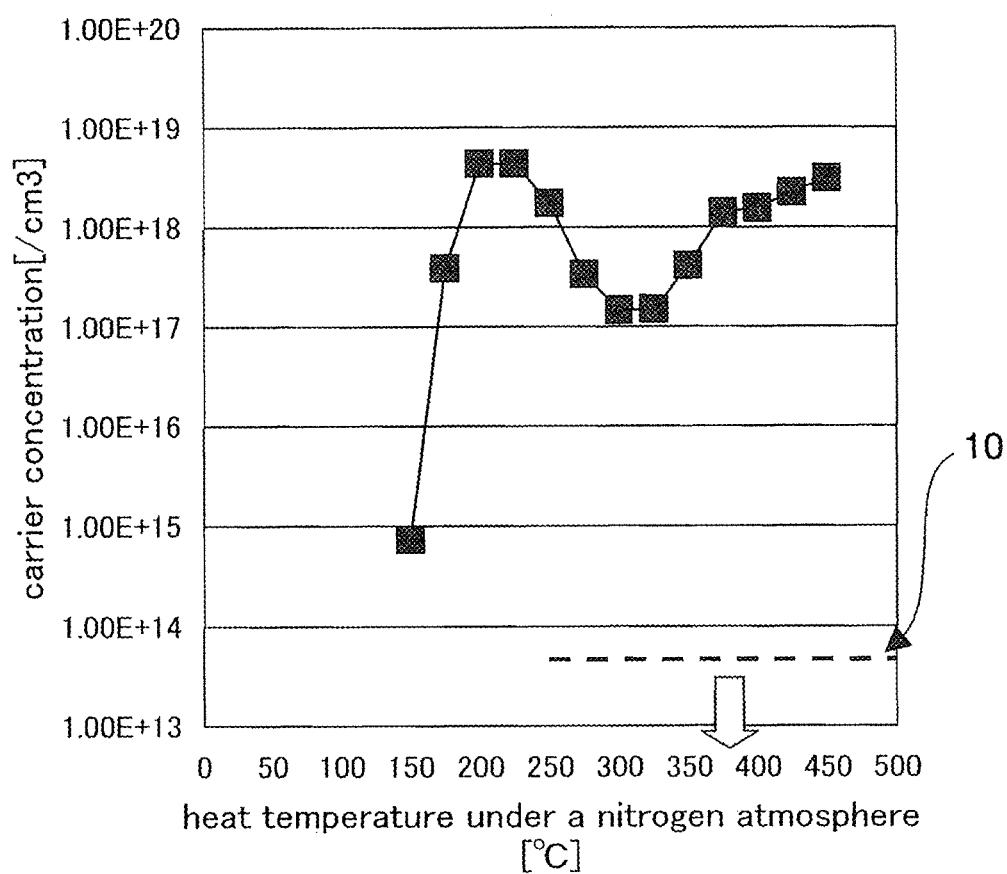
FIG. 1 is a graph showing the carrier concentration of an oxide semiconductor layer with respect to heating temperatures.
Figure 2:
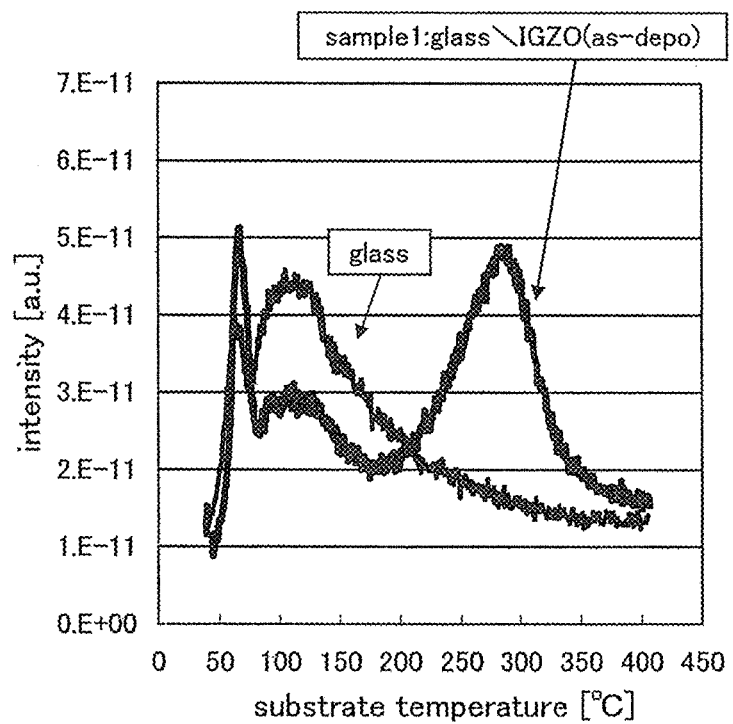
FIG. 2 is a graph showing TDS measurement results.
Figure 3:
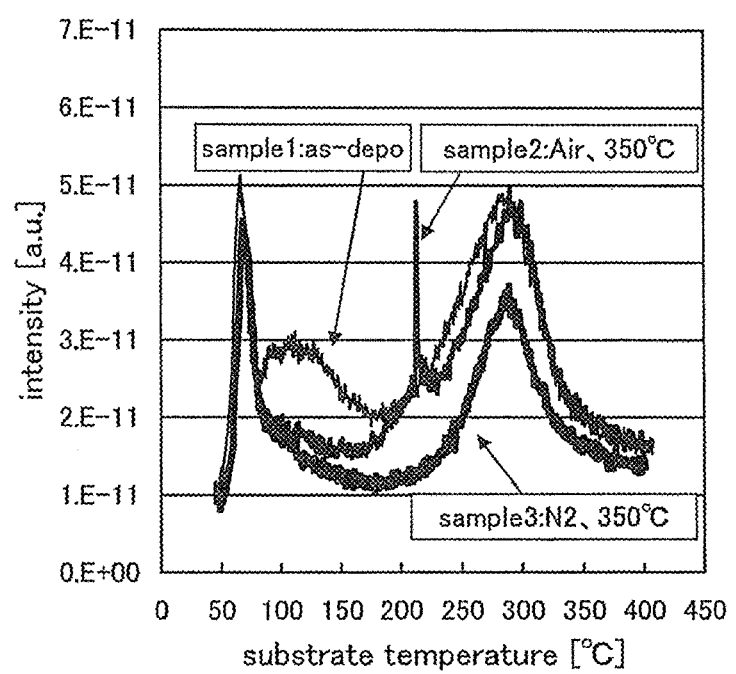
FIG. 3 is a graph showing TDS measurement results.
Figure 4:
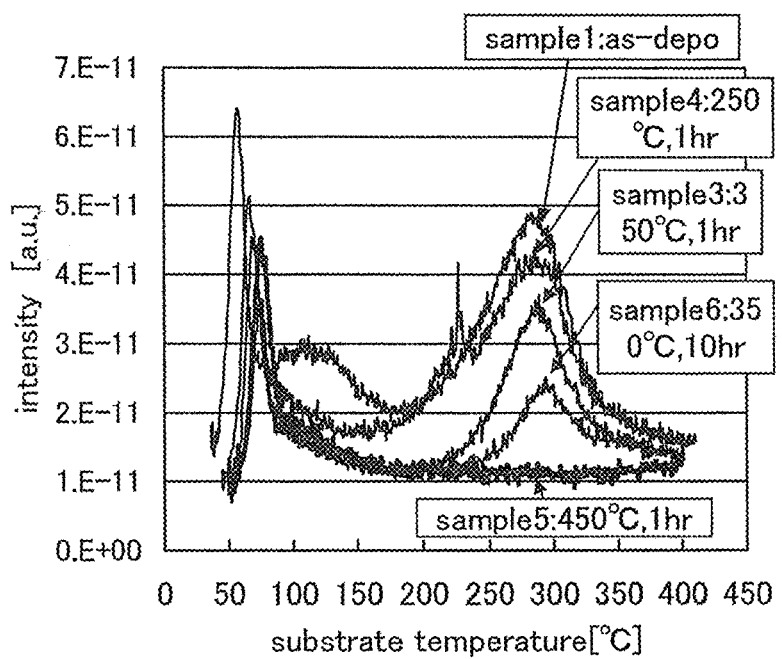
FIG. 4 is a graph showing TDS measurement results.
Figure 5A:
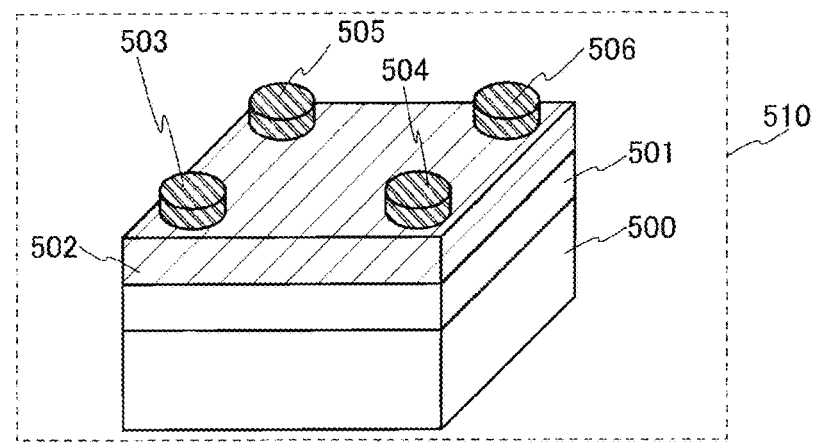
FIG. 5A is a three-dimensional view of a property-evaluation sample.
Figure 5B:
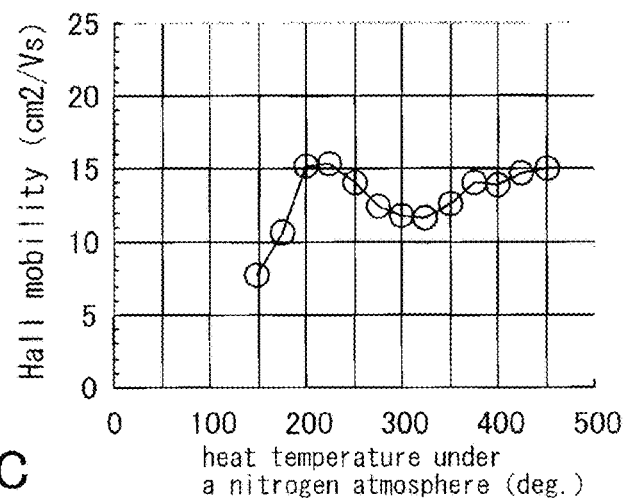
FIG. 5B is a graph showing results of Hall effect measurement of an oxide semiconductor layer.
Figure 5C:
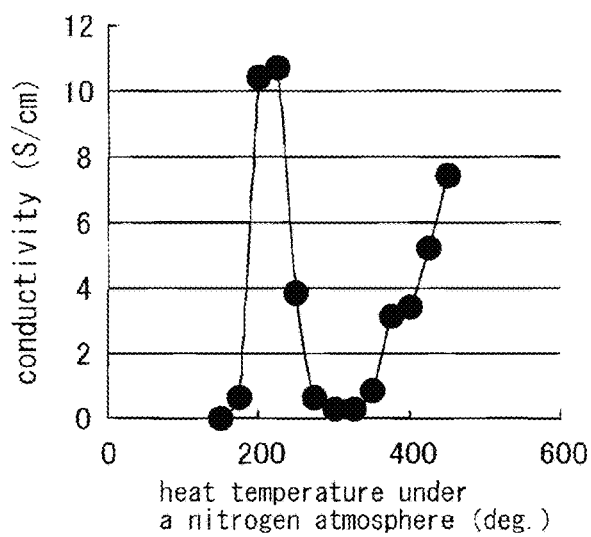
FIG. 5C is a graph showing conductivity.

FIGS. 13A1 and 13A2 are respectively a cross-sectional view and a top view of a gate wiring terminal portion at this stage. FIG. 13A1 is a cross-sectional view taken along line C1-C2 of FIG. 13A2. In FIG. 13A1, a transparent conductive film 155 formed over a protective insulating layer 154 is a connection terminal electrode which functions as an input terminal. Furthermore, in the terminal portion of FIG. 13A1, a first terminal 151 made of the same material as the gate wiring and a connection electrode layer 153 made of the same material as the source wiring overlap each other with a gate insulating layer 152 interposed therebetween, and are electrically connected to each other through the transparent conductive film 155. Note that a part of FIG. 11C where the transparent conductive film 128 is in contact with the first terminal 121 corresponds to a part of FIG. 13A1 where the transparent conductive film 155 is in contact with the first terminal 151.

FIGS. 13B1 and 13B2 are respectively a cross-sectional view and a top view of a source wiring terminal portion which is different from that illustrated in FIG. 11C. Moreover, FIG. 13B1 corresponds to a cross-sectional view taken along line F1-F2 of FIG. 13B2. In FIG. 13B1, a transparent conductive film 155 formed over a protective insulating layer 154 is a connection terminal electrode which functions as an input terminal. Furthermore, in FIG. 13B1, in the terminal portion, an electrode layer 156 formed from the same material as the gate wiring is located below and overlapped with a second terminal 150, which is electrically connected to the source wiring, with a gate insulating layer 152 interposed therebetween. The electrode layer 156 is not electrically connected to the second terminal 150, and a capacitor to prevent noise or static electricity can be formed if the potential of the electrode layer 156 is set to a potential different from that of the second terminal 150, such as floating, GND, or 0 V. The second terminal 150 is electrically connected to the transparent conductive film 155 through the protective insulating layer 154.

A plurality of gate wirings, source wirings, and capacitor wirings are provided depending on the pixel density. Also in the terminal portion, a plurality of first terminals at the same potential as the gate wiring, a plurality of second terminals at the same potential as the source wiring, a plurality of third terminals at the same potential as the capacitor wiring, and the like are arranged. The number of each of the terminals may be any number, and the number of the terminals may be determined by a practitioner as appropriate.

Through these five photolithography steps, the storage capacitor and a pixel thin film transistor portion including the thin film transistor 170 which is a bottom-gate staggered thin film transistor can be completed using the five photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Instead of providing the capacitor wiring, the pixel electrode may be overlapped with a gate wiring of an adjacent pixel with the protective insulating layer and the gate insulating layer interposed therebetween, so that a storage capacitor is formed.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably, 2 times or more as high as a usual vertical synchronizing frequency to improve the moving-image characteristics.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor disclosed in this specification includes an oxide semiconductor film which is used for a channel formation region and has excellent dynamic characteristics; thus, it can be combined with these driving techniques.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

When a light-emitting display device is manufactured, a partition formed using an organic resin layer may be provided between organic light-emitting elements in some cases. In such cases, the organic resin layer is subjected to heat treatment, and the heat treatment can serve as heat treatment for improvement of electric characteristics and reduction of variation in electric characteristics of the transistor by increasing resistance of the semiconductor layer 103.

The use of an oxide semiconductor for a thin film transistor leads to reduction in manufacturing cost. In particular, since impurities such as moisture are reduced for increasing purity of the oxide semiconductor film by heat treatment for dehydration or dehydrogenation, it is not necessary to use a ultrapure oxide semiconductor target and a special sputtering apparatus provided with a deposition chamber whose dew point is lowered. Further, a semiconductor device including a highly reliable thin film transistor with excellent electric characteristics can be manufactured.

The channel formation region in the semiconductor layer is a high-resistance region; thus, electric characteristics of the thin film transistor are stabilized and increase in off current can be prevented. Therefore, a semiconductor device including a thin film transistor having high electric characteristics and high reliability can be provided.

This embodiment can be implemented in appropriate combination with the structures described in the other embodiments.

Embodiment 4

In this embodiment, an example of a display device which is one example of a semiconductor device will be described. In the display device, at least a part of a driver circuit and a thin film transistor to be disposed in a pixel portion are formed over one substrate.

The thin film transistor in the pixel portion is formed according to any of Embodiments 1 to 3. The thin film transistor described in any of Embodiments 1 to 3 is an n-channel TFT; therefore, part of a driver circuit which can be formed using an n-channel TFT is formed over the same substrate as the thin film transistor of the pixel portion.

Figure 20A:
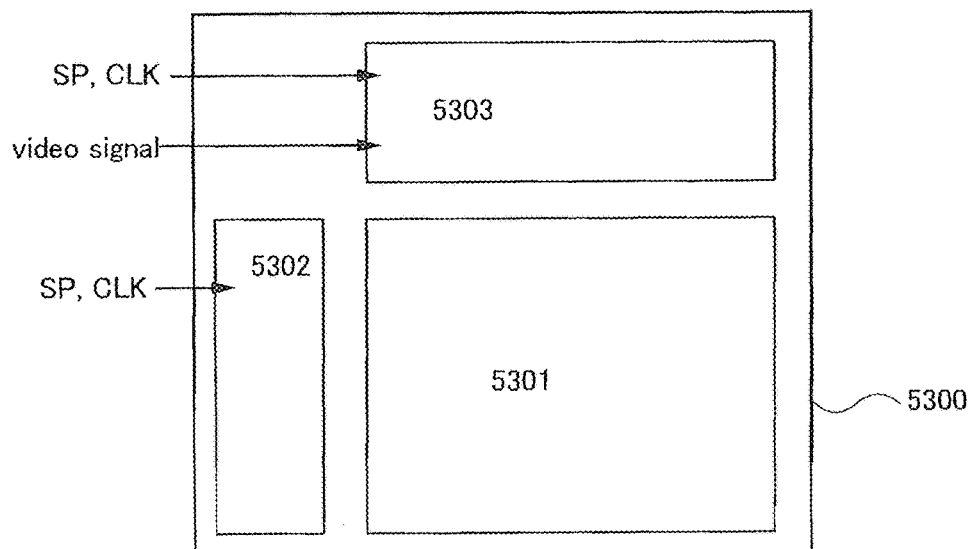
FIGS. 20A and 20B are each a block diagram of a semiconductor device.

FIG. 20A illustrates an example of a block diagram of an active matrix liquid crystal display device, which is an example of a semiconductor device. The display device illustrated in FIG. 20A includes, over a substrate 5300, a pixel portion 5301 including a plurality of pixels each provided with a display element, a scan line driver circuit 5302 that selects a pixel, and a signal line driver circuit 5303 that controls a video signal input to a selected pixel.

The pixel portion 5301 is connected to the signal line driver circuit 5303 by a plurality of signal lines S1 to Sm (not shown) which extend in a column direction from the signal line driver circuit 5303, and to the scan line driver circuit 5302 by a plurality of scan lines G1 to Gn (not shown) that extend in a row direction from the scan line driver circuit 5302. Then, each pixel is connected to a signal line Sj (any one of the signal lines S1 to Sm) and a scan line Gi (any one of the scan lines G1 to Gn).

In addition, the thin film transistor described in each of Embodiments 1 to 3 is an n-channel TFT, and a signal line driver circuit including the n-channel TFT is described with reference to FIG. 21.

Figure 21:
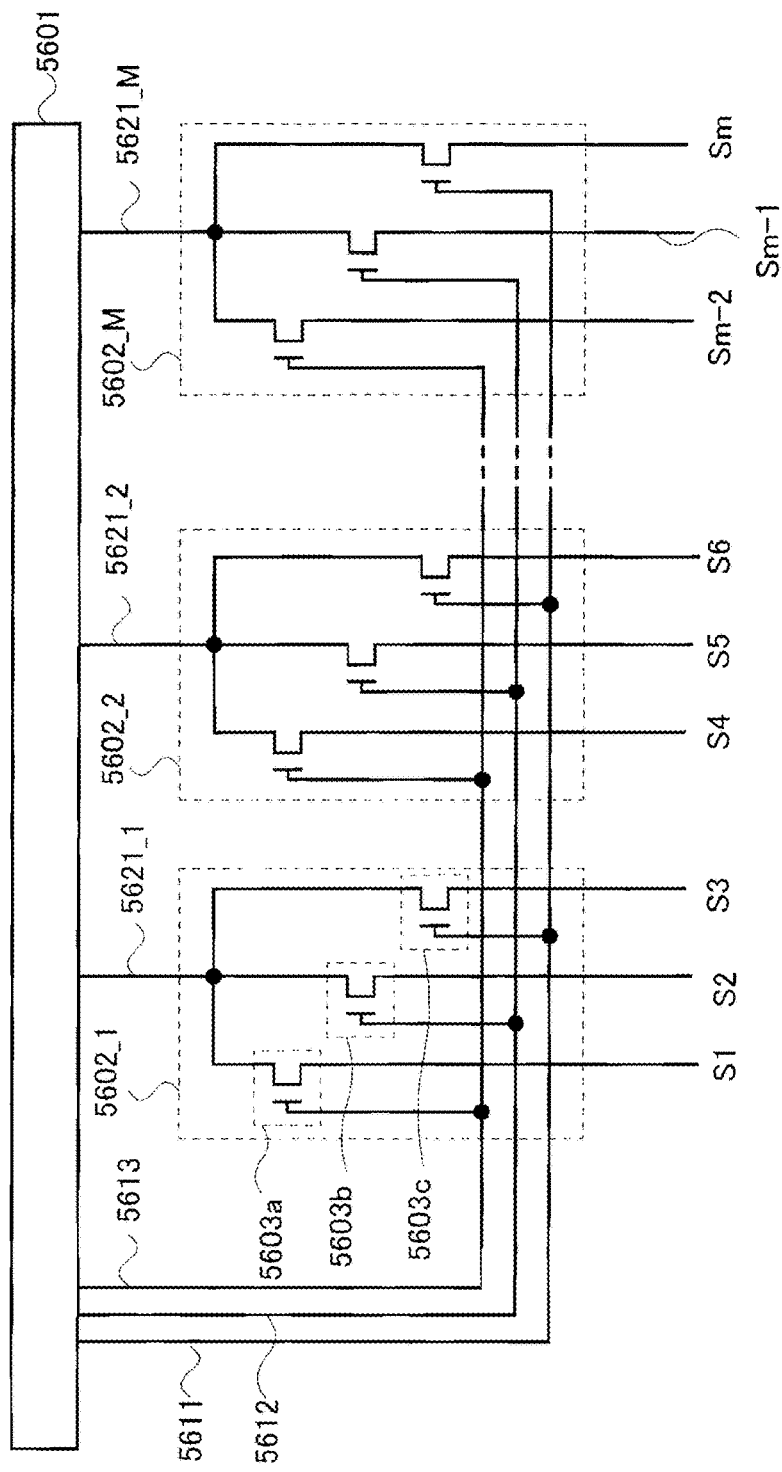
FIG. 21 illustrates a configuration of a signal line driver circuit.

The signal line driver circuit illustrated in FIG. 21 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed over a single crystalline substrate. Further, the switch groups 5602_1 to 5602_M are preferably formed over the same substrate as the pixel portion. Therefore, the driver IC 5601 and the switch groups 5602_1 to 5602_M are preferably connected through an FPC or the like.

Figure 22:
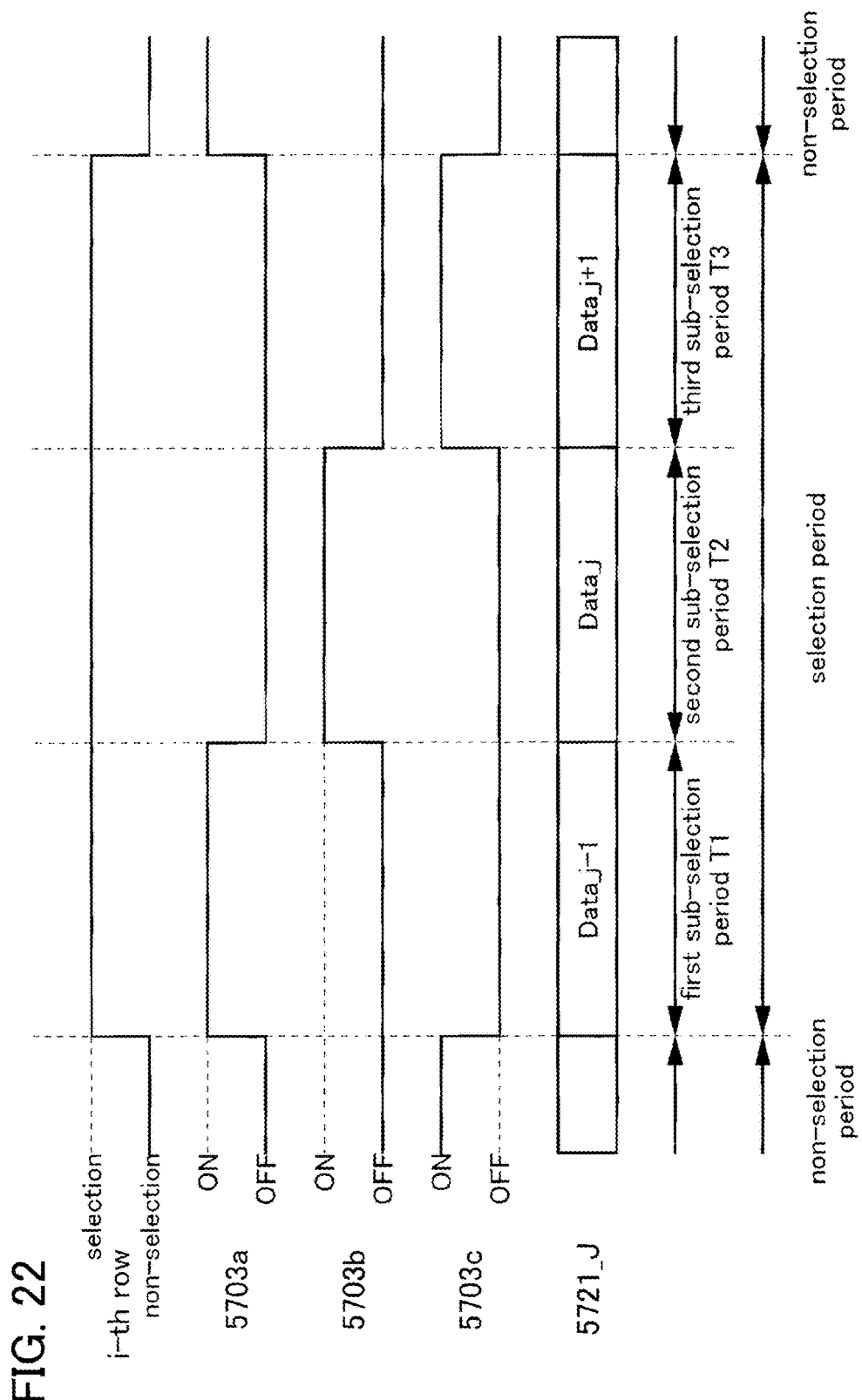
FIG. 22 is a timing chart of operation of a signal line driver circuit.

Next, the operation of the signal line driver circuit illustrated in FIG. 21 is described with reference to a timing chart of FIG. 22. FIG. 22 illustrates the timing chart where a scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 21 operates similarly to that in FIG. 22 even when a scan line of another row is selected.

Note that the timing chart in FIG. 22 shows the case where the wiring 5621_J of the J-th column is connected to the signal line Sj−1, the signal line Sj, and the signal line Sj+1 through the first thin film transistor 5603a, the second thin film transistor 5603b, and the third thin film transistor 5603c.

The timing chart of FIG. 22 shows timing when the scan line Gi of the i-th row is selected, timing 5703a when the first thin film transistor 5603a is turned on/off, timing 5703b when the second thin film transistor 5603b is turned on/off, timing 5703c when the third thin film transistor 5603c is turned on/off, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As shown in FIG. 22, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 21, by dividing one gate selection period into three, video signals can be input to three signal lines from one wiring 5621 in one gate selection period. Therefore, in the signal line driver circuit in FIG. 21, the number of connections of the substrate provided with the driver IC 5601 and the substrate provided with the pixel portion can be approximately ⅓ of the number of signal lines. The number of connections is decreased to approximately ⅓ of the number of the signal lines, so that reliability, yield, etc., of the signal line driver circuit in FIG. 21 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in respective sub-selection periods as shown in FIG. 21.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 23:
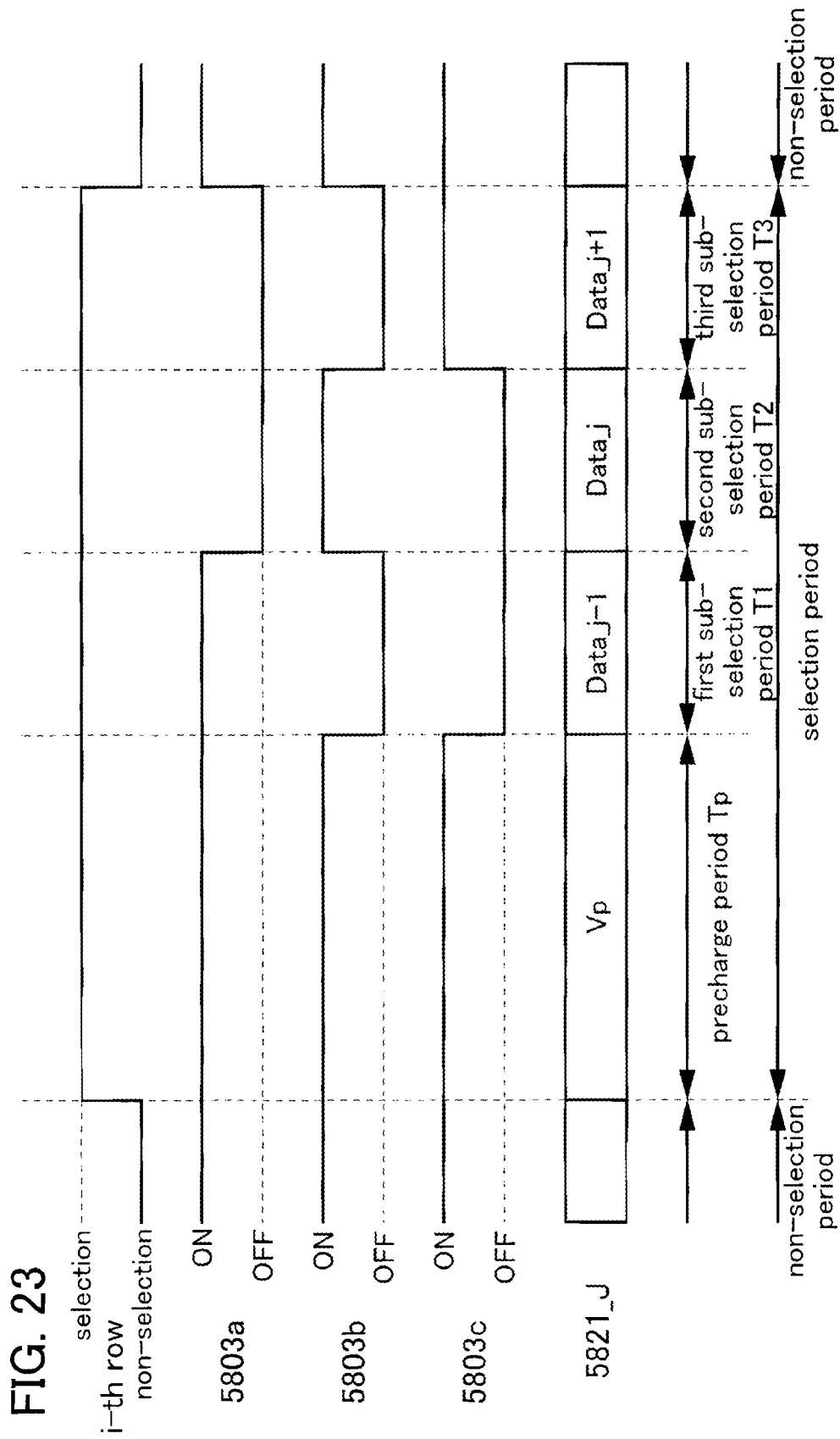
FIG. 23 is a timing chart illustrating operation of a signal line driver circuit.

As another example, as shown in a timing chart of FIG. 23, one selection period may be divided into a pre-charge period Tp, the first sub-selection period T1, the second sub-selection period T2, and the third sub-selection period T3. The timing chart in FIG. 23 shows timing at which the scan line Gi of the i-th row is selected, timing 5803a of on/off of the first thin transistor 5603a, timing 5803b of on/off of the second thin transistor 5603b, timing 5803c of on/off of the third thin transistor 5603c, and a signal 5821_J input to the wiring 5621_J of the J-th column. As shown in FIG. 23, the first thin film transistor 5603a, the second thin film transistor 5603b, and the third thin film transistor 5603c are turned on in the pre-charge period Tp. At this time, pre-charge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit of FIG. 21, to which the timing chart of FIG. 23 is applied, the signal line can be pre-charged by providing the pre-charge period before the sub-selection periods. Thus, a video signal can be written to a pixel with high speed. Note that portions in FIG. 23 which are similar to those of FIG. 22 are denoted by common reference numerals and detailed description of the same portions and portions which have similar functions is omitted.

Further, a structure of a scan line driver circuit is described. The scan line driver circuit includes a shift register. The scan line driver may be provided with a level shifter, a buffer, a switch, and the like as necessary, or may include only a shift register. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register used for a part of the scan line driver circuit will be described with reference to FIG. 24 and FIG. 25.

Figure 24:
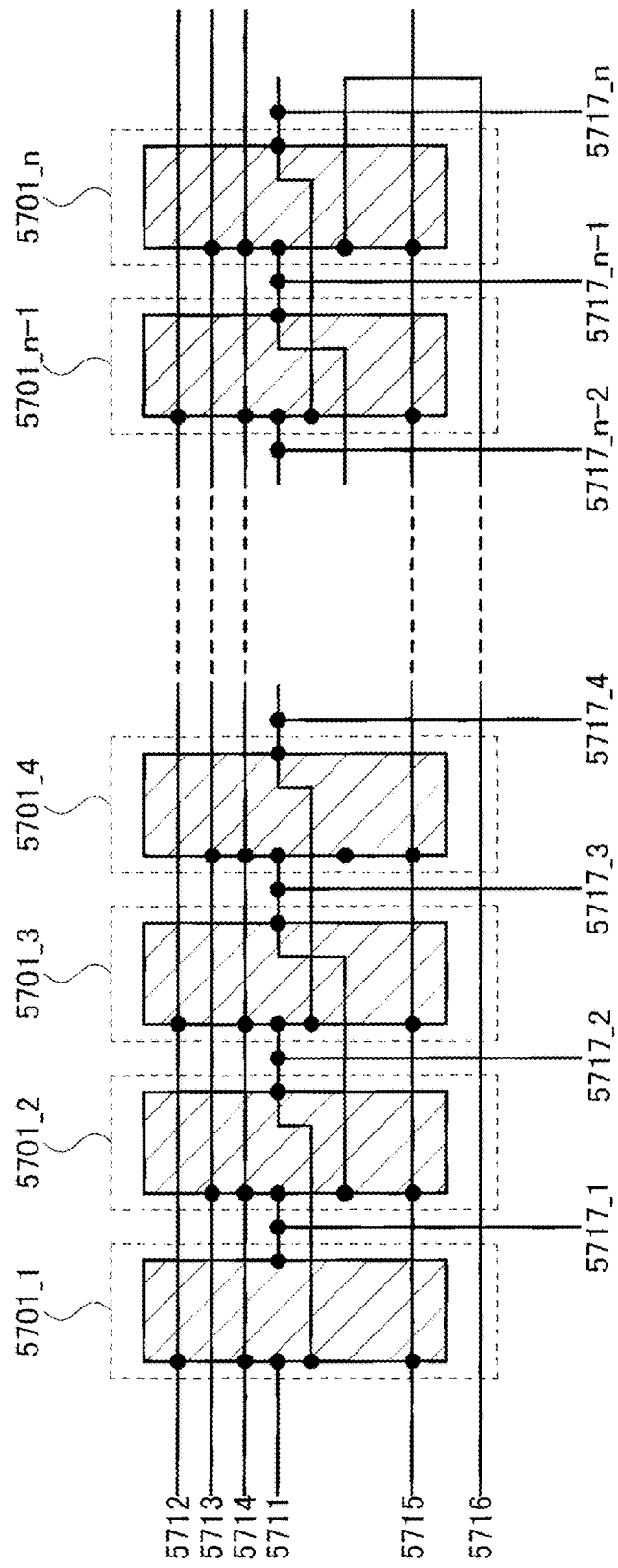
FIG. 24 illustrates a configuration of a shift register.

FIG. 24 shows a circuit configuration of the shift register. The shift register shown in FIG. 24 includes a plurality of flip-flops: flip-flops 5701_1 to 5701_n. The shift register operates with input of a first clock signal, a second clock signal, a start pulse signal, and a reset signal.

Connection relations of the shift register in FIG. 24 are described. In the flip-flop 5701_i (one of the flip-flops 5701_1 to 5701_n) of the i-th stage in the shift register of FIG. 24, a first wiring 5501 shown in FIG. 25 is connected to a seventh wiring 5717_i−1; a second wiring 5502 shown in FIG. 25 is connected to a seventh wiring 5717_i+1; a third wiring 5503 shown in FIG. 25 is connected to a seventh wiring 5717_i; and a sixth wiring 5506 shown in FIG. 25 is connected to a fifth wiring 5715.

Figure 25:
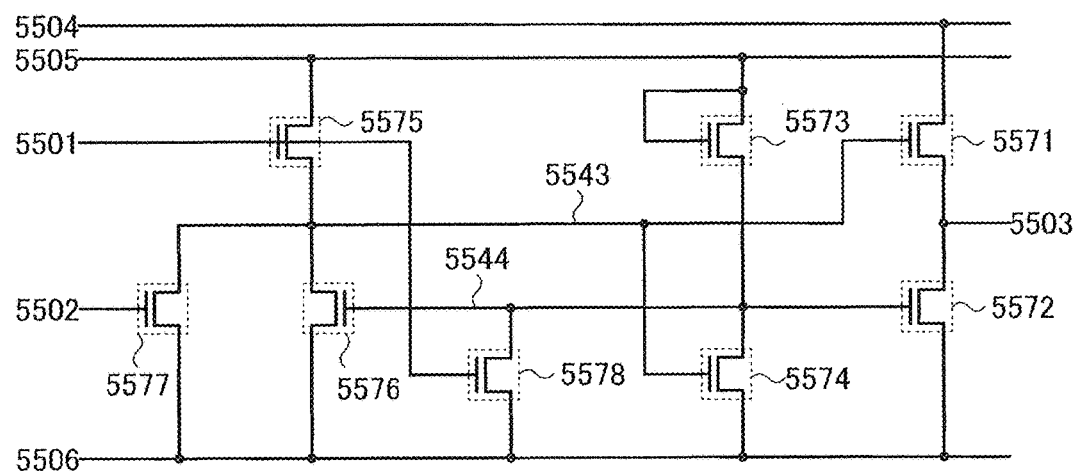
FIG. 25 illustrates a connection structure of a flip-flop of FIG. 24.

Further, a fourth wiring 5504 shown in FIG. 25 is connected to a second wiring 5712 in flip-flops of odd-numbered stages, and is connected to a third wiring 5713 in flip-flops of even-numbered stages. A fifth wiring 5505 shown in FIG. 25 is connected to a fourth wiring 5714.

Note that the first wiring 5501 of the first stage flip-flop 5701_1 shown in FIG. 25 is connected to a first wiring 5711. Moreover, the second wiring 5502 of the n-th stage flip-flop 5701_n shown in FIG. 25 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 25 shows details of the flip-flop shown in FIG. 24. A flip-flop shown in FIG. 25 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Now a connection structure of the flip-flop shown in FIG. 24 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

Moreover, the signal line driver circuit and the scan line driver circuit can be manufactured using only the n-channel TFTs described in any of Embodiments 1 to 3. The n-channel TFT described in any one of Embodiments 1 to 3 has a high mobility, and thus a driving frequency of a driver circuit can be increased. Further, in the case of the n-channel TFT described in any of Embodiments 1 to 3, since parasitic capacitance is reduced, frequency characteristics (also referred to as f characteristics) are excellent. For example, a scan line driver circuit using the n-channel TFT described in any of Embodiments 1 to 3 can operate at high speed, and thus a frame frequency can be increased and insertion of black images and the like can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 20B:
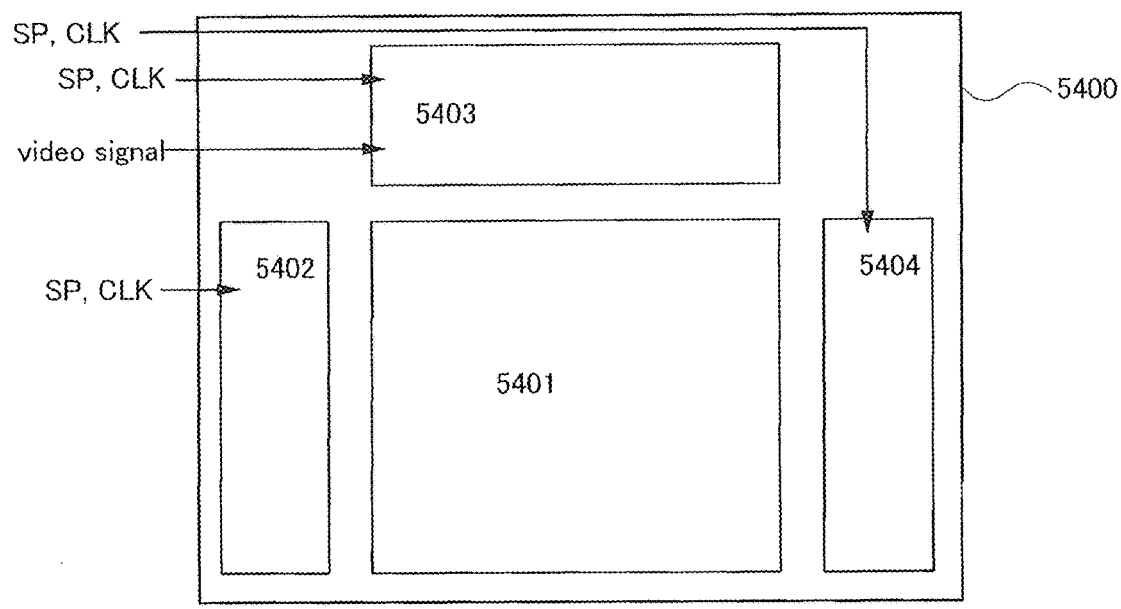

Further, when an active matrix light-emitting display device which is an example of a semiconductor device is manufactured, a plurality of thin film transistors are arranged in at least one pixel, and thus a plurality of scan line driver circuits are preferably arranged. FIG. 20B illustrates an example of a block diagram of an active matrix light-emitting display device.

The display device illustrated in FIG. 20B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 20B is a digital signal, a pixel is in a light-emitting state or in a non-light-emitting state by switching of ON/OFF of a transistor. Thus, grayscale can be displayed using an area grayscale method or a time grayscale method. An area grayscale method refers to a driving method in which one pixel is divided into a plurality of subpixels and the respective subpixels are driven independently based on video signals so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale can be displayed.

Note that in the light-emitting display device shown in FIG. 20B, in the case where one pixel includes two switching TFTs, a signal which is input to a first scan line serving as a gate wiring of one of the switching TFTs is generated in the first scan line driver circuit 5402 and a signal which is input to a second scan line serving as a gate wiring of the other of the switching TFTs is generated in the second scan line driver circuit 5404. However, the signal which is input to the first scan line and the signal which is input to the second scan line may be generated together in one scan line driver circuit. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include n-channel TFTs among driver circuits can be formed over the same substrate as the thin film transistors of the pixel portion. Moreover, the signal line driver circuit and the scan line driver circuit can be manufactured using only the n-channel TFTs described in any of Embodiments 1 to 3.

Moreover, the above-described driver circuit can be used for an electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. The electrophoretic display does not require a polarizing plate which is necessary for a liquid crystal display device, so that the weight thereof is reduced.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained using the thin film transistor of any of Embodiments 1 to 3 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above process, a highly reliable display device as a semiconductor device can be manufactured.

This embodiment can be implemented in appropriate combination with the structures described in the other embodiments.

Embodiment 5

A thin film transistor is manufactured, and a semiconductor device having a display function (also referred to as a display device) can be manufactured using the thin film transistor in a pixel portion and further in a driver circuit. Further, part or whole of the driver circuit can be formed over the same substrate as a pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by the current or the voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state provided with only a pixel electrode of the display element, a state after a conductive film serving as a pixel electrode is formed and before the conductive film is etched to form the pixel electrode, or any of other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which is one embodiment of a semiconductor device, will be described with reference to FIGS. 16A1, 16A2, and 16B. FIGS. 16A1 and 16A2 are each a plan view of a panel in which highly reliable thin film transistors 4010 and 4011 each including the oxide semiconductor layer described in Embodiment 3 and a liquid crystal element 4013 are sealed between a first substrate 4001 and a second substrate 4006 with a sealant 4005. FIG. 16B is a cross-sectional view along line M-N in FIGS. 16A1 and 16A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 16A1 illustrates an example of mounting the signal line driver circuit 4003 by a COG method, and FIG. 16A2 illustrates an example of mounting the signal line driver circuit 4003 by a TAB method.

The pixel portion 4002 and the scan line driver circuit 4004 provided over the first substrate 4001 include a plurality of thin film transistors. FIG. 16B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

Any of the highly reliable thin film transistors including the oxide semiconductor layer described in Embodiment 3, can be used as the thin film transistors 4010 and 4011. Alternatively, the thin film transistor described in Embodiment 1 or 2 may be applied. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 1 msec or less, which is short, the alignment process is unnecessary because the liquid crystal composition has optical isotropy, and viewing angle dependency is small.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In order to reduce surface unevenness of the thin film transistor and to improve reliability of the thin film transistor, the thin film transistor obtained in any of the above embodiments is covered with the insulating layers (the insulating layer 4020 and the insulating layer 4021) functioning as a protective film or a planarizing insulating film. Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, an aluminum oxynitride film, and/or an aluminum nitride oxide film by a sputtering method. Although an example in which the protective film is formed by a sputtering method is described in this embodiment, an embodiment of the present invention is not limited to this method and a variety of methods may be employed.

In this embodiment, the insulating layer 4020 having a stacked-layer structure is formed as a protective film. Here, as a first layer of the insulating layer 4020, a silicon oxide film is formed by a sputtering method. The use of a silicon oxide film as a protective film has an effect of preventing hillock of an aluminum film used for the source and drain electrode layers.

As a second layer of the protective film, an insulating layer is formed. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electrical properties of the TFT.

In addition, after the protective film is formed, heat treatment (at 300° C. or lower) may be performed under a nitrogen atmosphere or an air atmosphere.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), or the like. Further, the insulating layer 4021 can be formed with a doctor knife, a roll coater, a curtain coater, a knife coater, or the like. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connection terminal electrode 4015 is electrically connected to a terminal included in the FPC 4018 via an anisotropic conductive film 4019.

Note that FIGS. 16A1, 16A2, and 16B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 26:
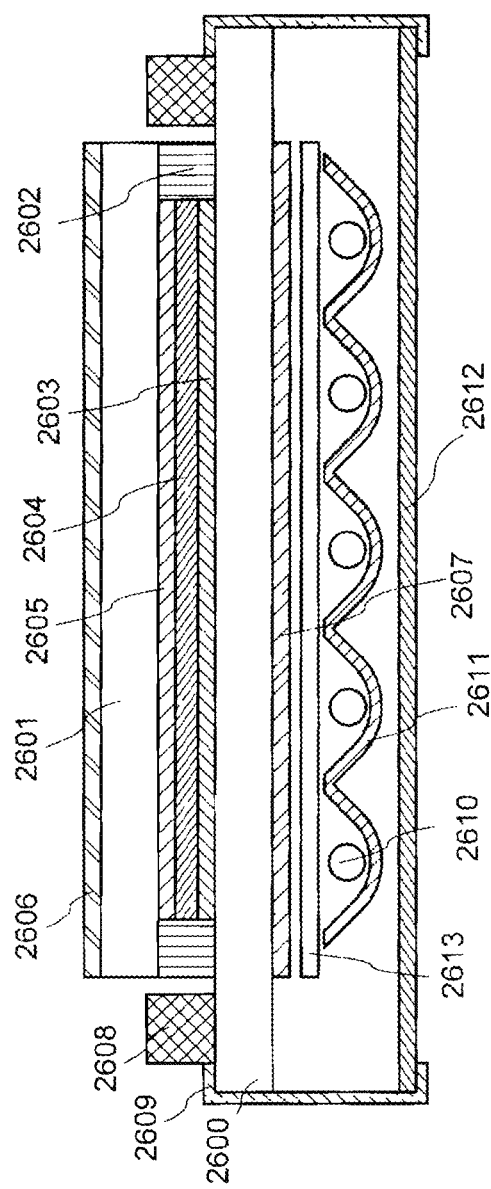
FIG. 26 illustrates a semiconductor device.

FIG. 26 illustrates an example in which a liquid crystal display module is formed as a semiconductor device using a TFT substrate 2600 which is manufactured according to the manufacturing method disclosed in this specification.

FIG. 26 illustrates an example of a liquid crystal display module, in which the TFT substrate 2600 and a counter substrate 2601 are fixed to each other with a sealant 2602, and a pixel portion 2603 including TFTs and the like, a display element 2604 including a liquid crystal layer, and a coloring layer 2605, are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

Through the above process, a highly reliable liquid crystal display panel as a semiconductor device can be manufactured.

This embodiment can be implemented in appropriate combination with the structures described in the other embodiments.

Embodiment 6

An example of an electronic paper will be described as a semiconductor device.

The semiconductor device can be used for electronic paper in which electronic ink is driven by an element electrically connected to a switching element.

The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained using the thin film transistor of any of Embodiments 1 to 3 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 15:
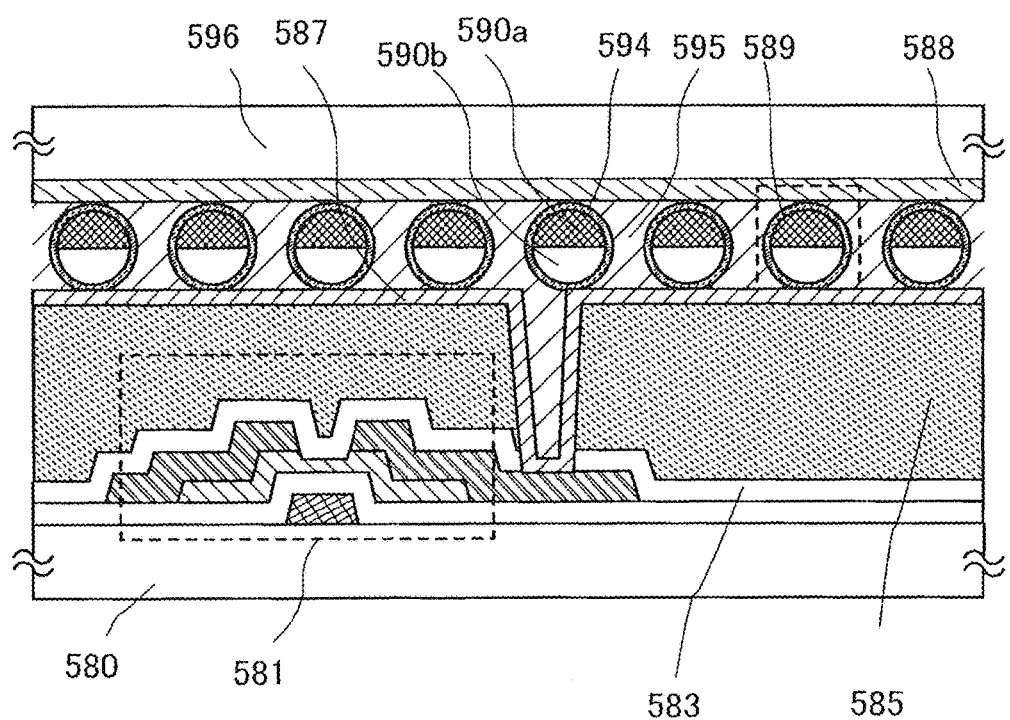
FIG. 15 illustrates a semiconductor device.

FIG. 15 illustrates an active matrix electronic paper as an example of a semiconductor device. A thin film transistor 581 used for the semiconductor device can be formed in a manner similar to the thin film transistor described in Embodiment 1, which is a highly reliable thin film transistor including an oxide semiconductor layer. Any of the thin film transistors described in Embodiment 2 or 3 can also be used as the thin film transistor 581 of this embodiment.

The electronic paper in FIG. 15 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 has a bottom-gate structure, which is covered with an insulating film 583 in contact with the semiconductor layer. A source electrode layer or a drain electrode layer of the thin film transistor 581 is in contact with a first electrode layer 587 at an opening formed in the insulating film 583 and an insulating layer 585, whereby the thin film transistor 581 is electrically connected to the first electrode layer 587. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The circumference of the spherical particle 589 is filled with filler 595 such as a resin (see FIG. 15). In this embodiment, the first electrode layer 587 corresponds to a pixel electrode, and the second electrode layer 588, a common electrode. The second electrode layer 588 is electrically connected to a common potential line provided over the same substrate 580 as the thin film transistor 581. With the use of a common connection portion, the second electrode layer 588 can be electrically connected to the common potential line via conductive particles provided between the pair of substrates 580 and 596.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented in appropriate combination with the structures described in the other embodiments.

Embodiment 7

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 18:
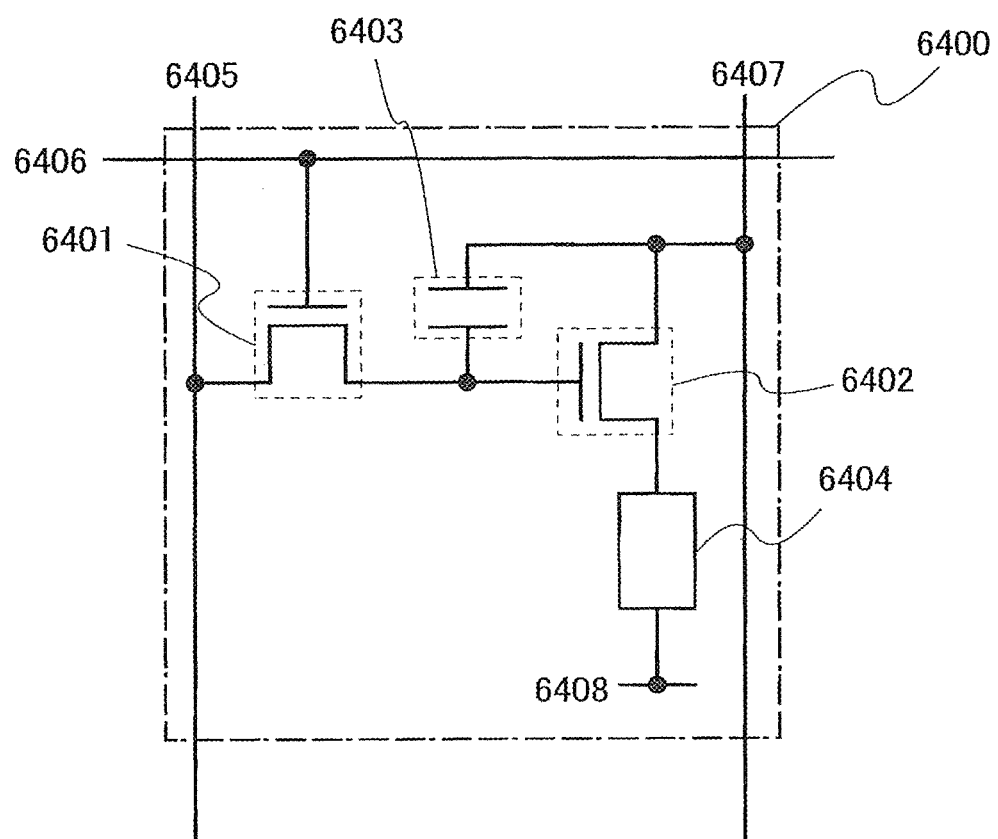
FIG. 18 illustrates a pixel equivalent circuit of a semiconductor device.

FIG. 18 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying that the low power supply potential is lower than a high power supply potential (low power supply potential <high power supply potential) based on the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that the gate capacitor of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to the sum voltage of the power supply line voltage and $V_{th}$ of the driver transistor 6402 (voltage of the power supply line+$V_{th}$ of the driver transistor 6402) is applied to the signal line 6405.

In a case of performing analog grayscale driving instead of digital time grayscale driving, the same pixel structure as that in FIG. 18 can be used by changing signal input.

In the case of performing analog grayscale driving, a voltage higher than or equal to the sum voltage of the light-emitting element 6404 and $V_{th}$ of the driver transistor 6402 (forward voltage of the light-emitting element 6404+$V_{th}$ of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 18 is not limited thereto. For example, a switch, a resistor, a capacitor, a transistor, a logic circuit, or the like may be added to the pixel illustrated in FIG. 18.

Next, structures of the light-emitting element will be described with reference to FIGS. 19A to 19C. Here, a cross-sectional structure of a pixel will be described by taking an n-channel driving TFT as an example. Driving TFTs 7001, 7011, and 7021 used in semiconductor devices illustrated in FIGS. 19A, 19B, and 19C, respectively can be formed in a manner similar to the thin film transistor described in Embodiment 1 and are highly reliable thin film transistors each including an oxide semiconductor layer. Alternatively, the thin film transistor described in Embodiment 2 or 3 can be employed as the driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure will be described with reference to FIG. 19A.

Figure 19A:
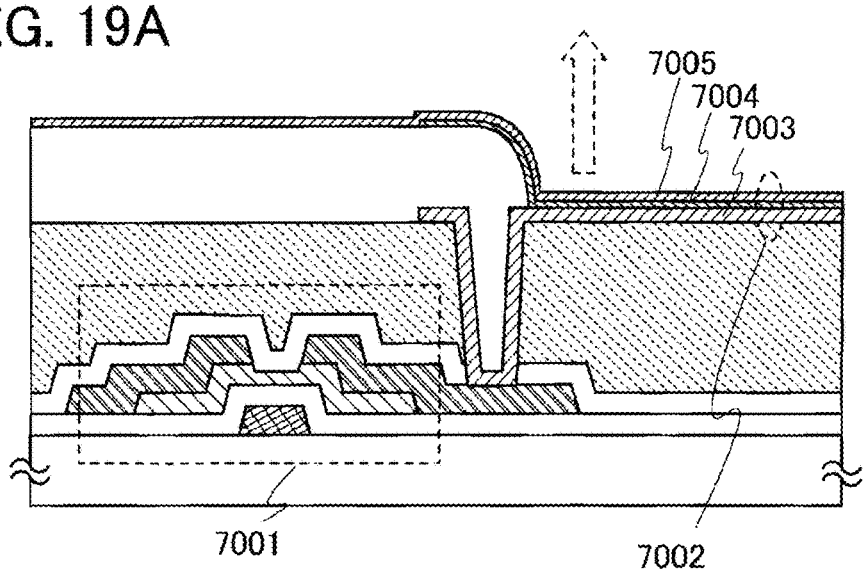
FIGS. 19A to 19C illustrate a semiconductor device.

FIG. 19A is a cross-sectional view of a pixel in the case where the driving TFT 7001 is an n-channel TFT and light is emitted from a light-emitting element 7002 to an anode 7005 side. In FIG. 19A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-inject layer in this order over the cathode 7003. It is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 19A, light is emitted from the light-emitting element 7002 to the anode 7005 side as indicated by an arrow.

Next, a light-emitting element having a bottom emission structure will be described with reference to FIG. 19B. FIG. 19B is a cross-sectional view of a pixel in the case where the driving TFT 7011 is of an n-type and light is emitted from a light-emitting element 7012 to a cathode 7013 side. In FIG. 19B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 19A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 19A, the light-emitting layer 7014 may be formed using either a single layer or a plurality of layers stacked. The anode 7015 does not need to transmit light, but can be formed using a light-transmitting conductive material as in the case of FIG. 19A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 19B, light is emitted from the light-emitting element 7012 to the cathode 7013 side as indicated by an arrow.

Next, a light-emitting element having a dual emission structure will be described with reference to FIG. 19C. In FIG. 19C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 19A, the cathode 7023 can be formed using a variety of conductive materials as long as they have a low work function. The cathode 7023 is formed to have a thickness which allows light transmission. For example, a 20-nm-thick aluminum film can be used as the cathode 7023. As in FIG. 19A, the light-emitting layer 7024 may be formed using either a single layer or a plurality of layers stacked. The anode 7025 can be formed using a light-transmitting conductive material as in the case of FIG. 19A.

The light-emitting element 7022 corresponds to a region where the cathode 7023, the light-emitting layer 7024, and the anode 7025 overlap with one another. In the case of the pixel illustrated in FIG. 19C, light is emitted from the light-emitting element 7022 to both the anode 7025 side and the cathode 7023 side as indicated by arrows.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 19B:
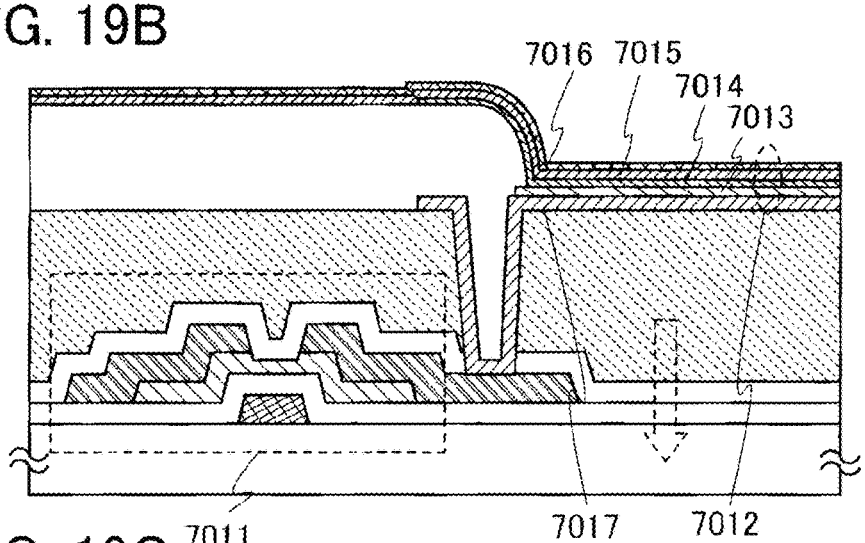
Figure 19C:
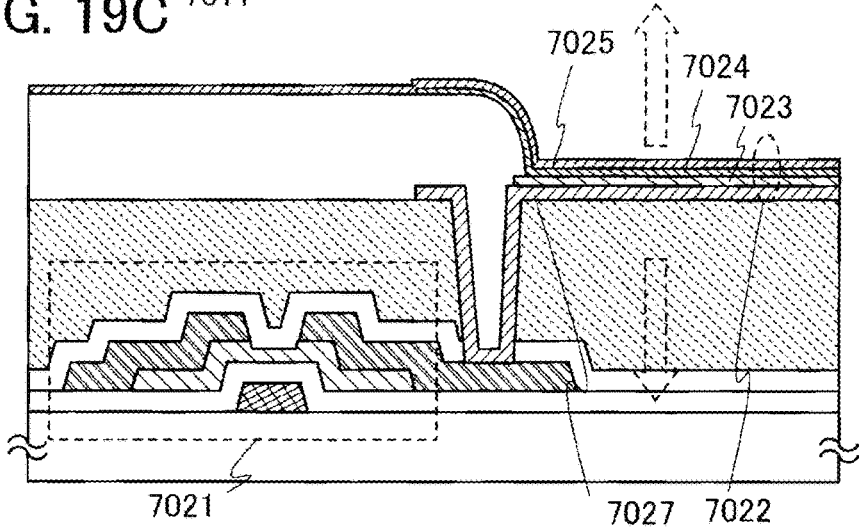

Note that the structure of the semiconductor device is not limited to those illustrated in FIGS. 19A to 19C and can be modified in various ways based on techniques disclosed in this specification.

Figure 17A:
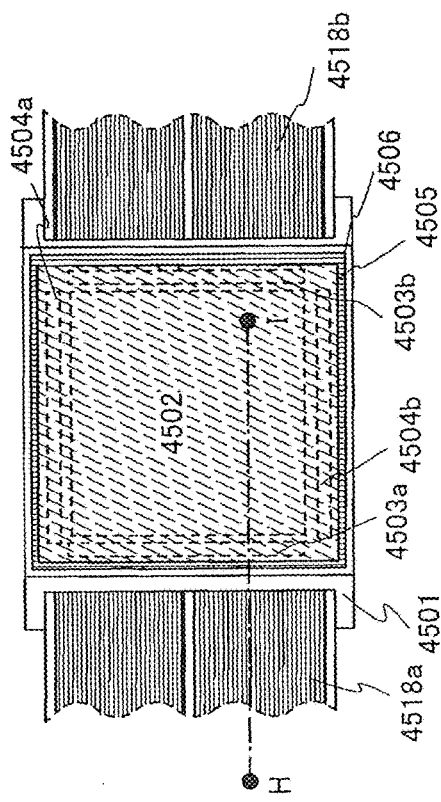
FIGS. 17A and 17B illustrate a semiconductor device.
Figure 17B:
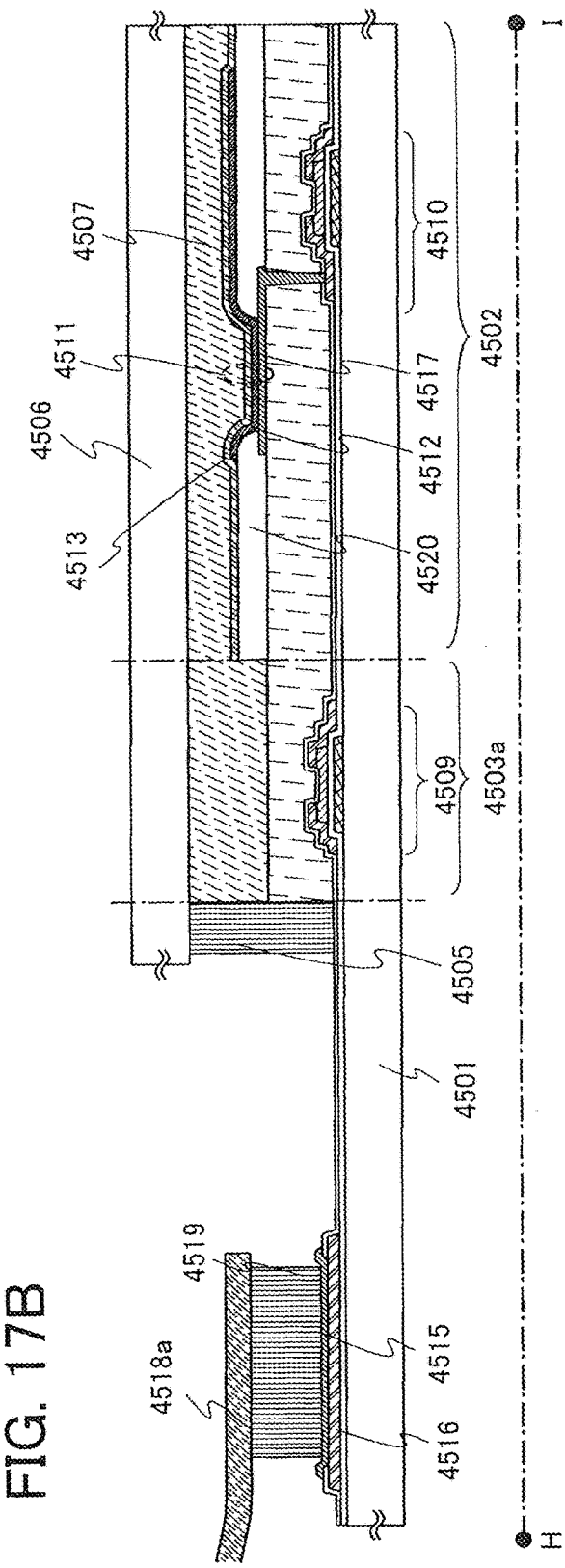

Next, the appearance and cross section of a light-emitting display panel (also referred to as a light-emitting panel) which corresponds to one embodiment of the semiconductor device will be described with reference to FIGS. 17A and 17B. FIG. 17A is a plan view of a panel in which a thin film transistor and a light-emitting element formed over a first substrate are sealed between the first substrate and a second substrate with a sealant. FIG. 17B is a cross-sectional view along line H-I of FIG. 17A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 17B.

For the thin film transistors 4509 and 4510, the highly reliable thin film transistor including an oxide semiconductor layer described in Embodiment 3 can be employed. Alternatively, the thin film transistor described in Embodiment 1 or 2 may be applied. The thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is, but not limited to, the stack structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

As the second substrate 4506 located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted with driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 17A and 17B.

Through the above process, a highly reliable light-emitting display device (display panel) as a semiconductor device can be manufactured.

This embodiment can be implemented in appropriate combination with the structures described in the other embodiments.

Embodiment 8

A semiconductor device disclosed in this specification can be applied to an electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. Examples of such electronic appliances are illustrated in FIG. 27.

Figure 27:
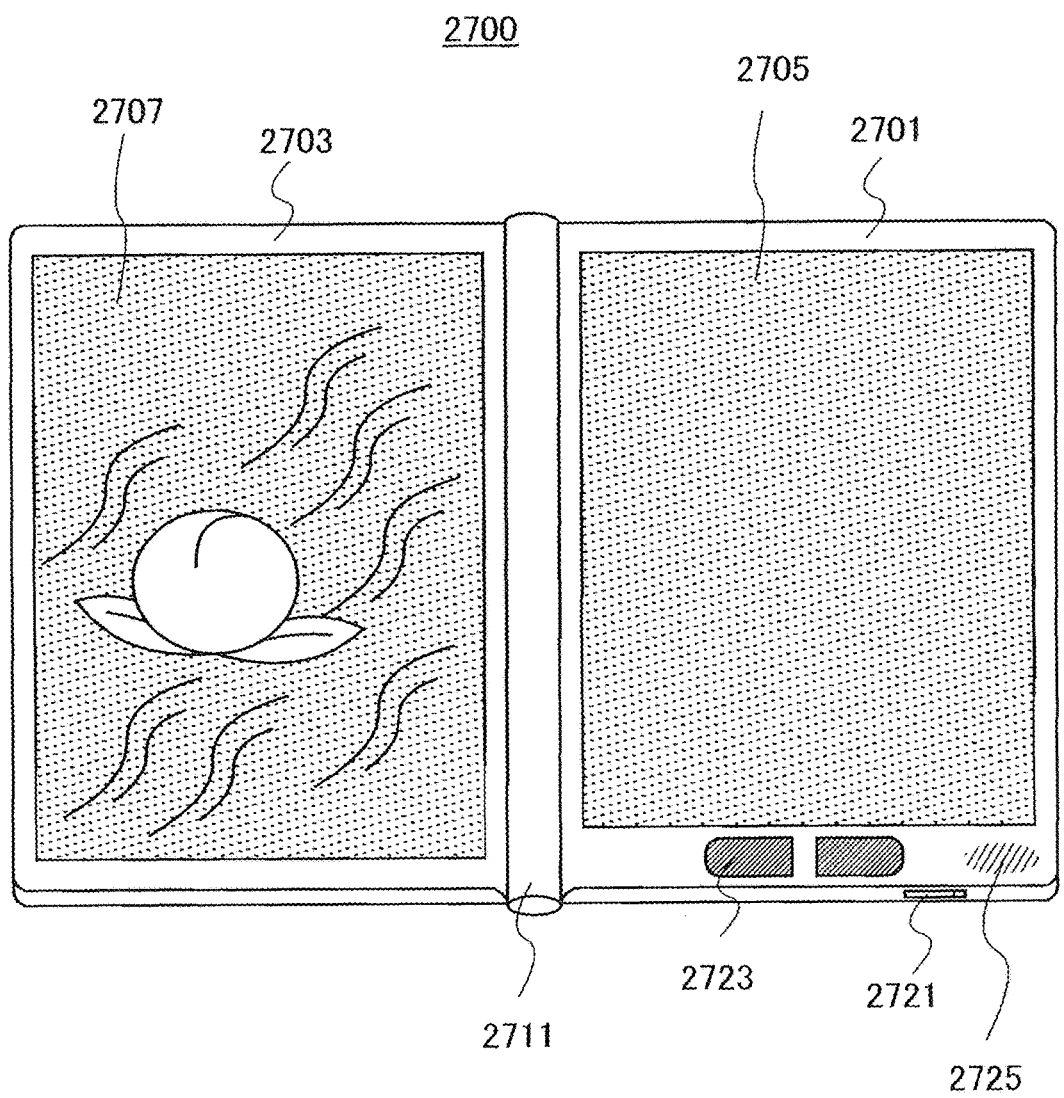
FIG. 27 is an external view illustrating an example of an e-book reader.

FIG. 27 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 27) can display text and a display portion on the left side (the display portion 2707 in FIG. 27) can display graphics.

FIG. 27 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 9

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 28A:
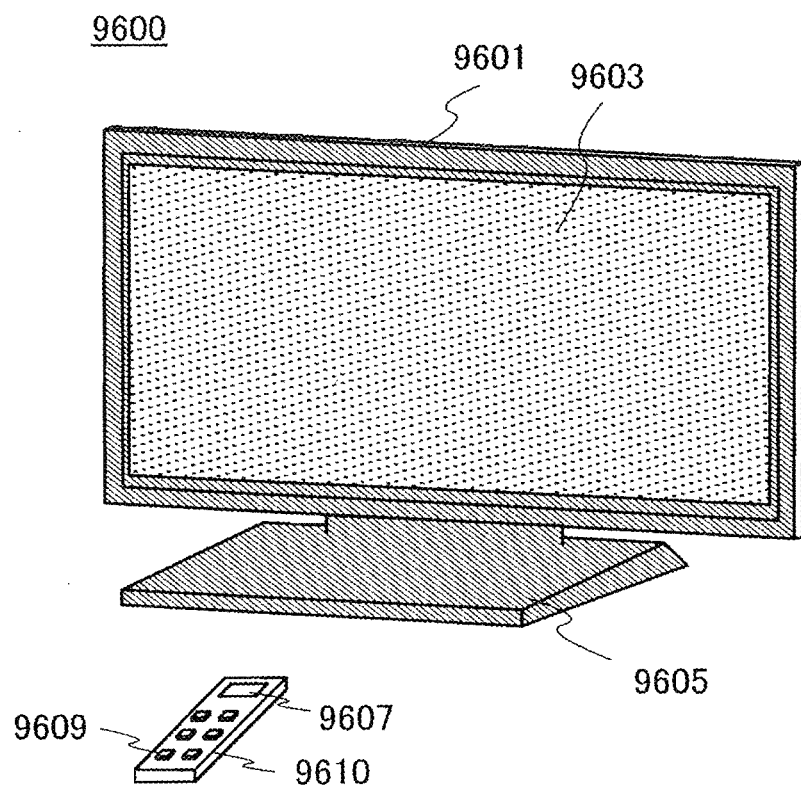
FIGS. 28A and 28B are external views respectively illustrating an example of a television set and an example of a digital photo frame.

FIG. 28A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 28B:
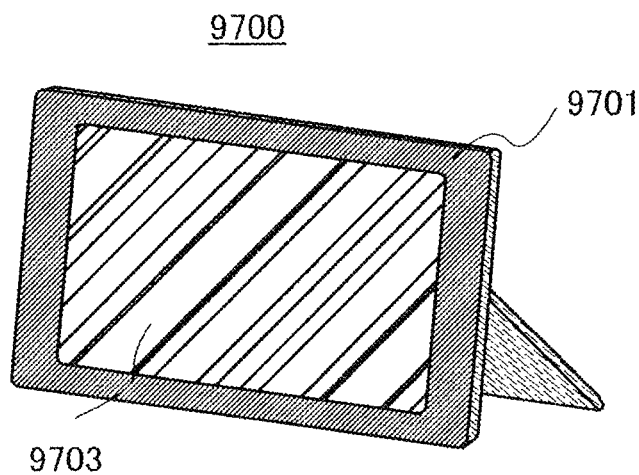

FIG. 28B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 29A:
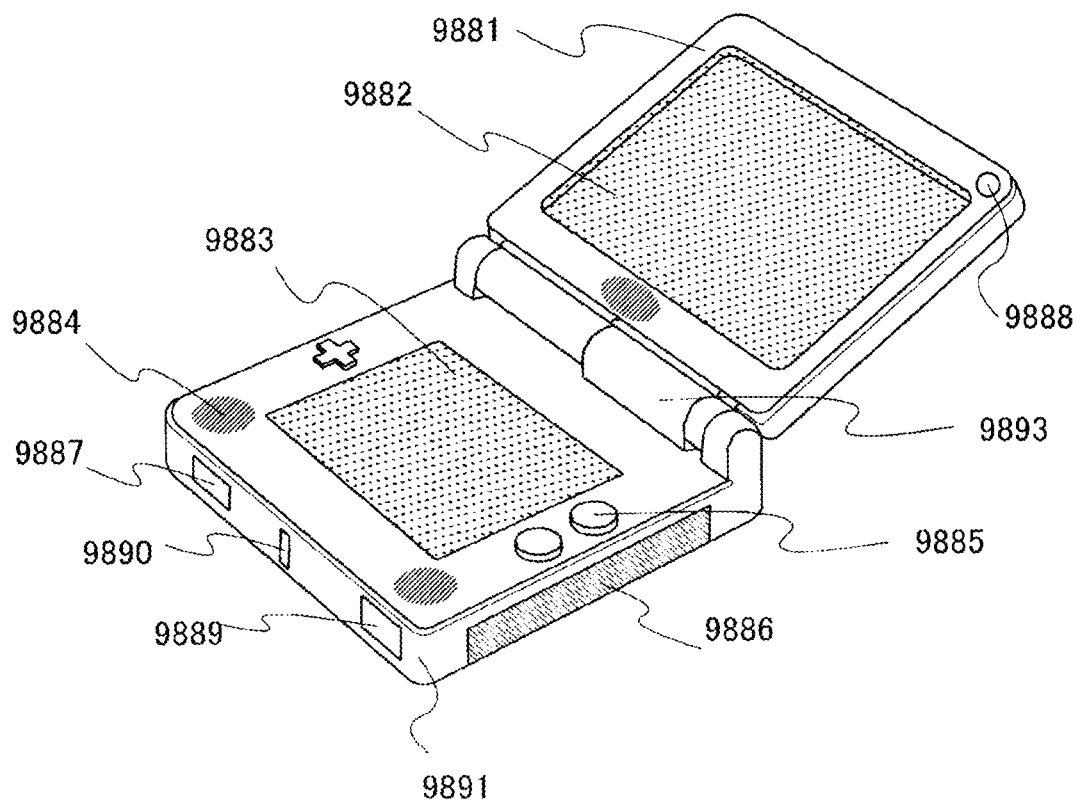
FIGS. 29A and 29B are external views illustrating examples of game machines.

FIG. 29A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 29A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable game machine is not limited to the above and other structures provided with at least a semiconductor device disclosed in this specification can be employed. The portable game machine may include other accessory equipment as appropriate. The portable game machine illustrated in FIG. 29A has a function of reading a program or data stored in a recording medium to display it on the display portion, and a function of sharing information with another portable game machine via wireless communication. Note that a function of the portable game machine illustrated in FIG. 29A is not limited to those described above, and the portable game machine can have a variety of functions.

Figure 29B:
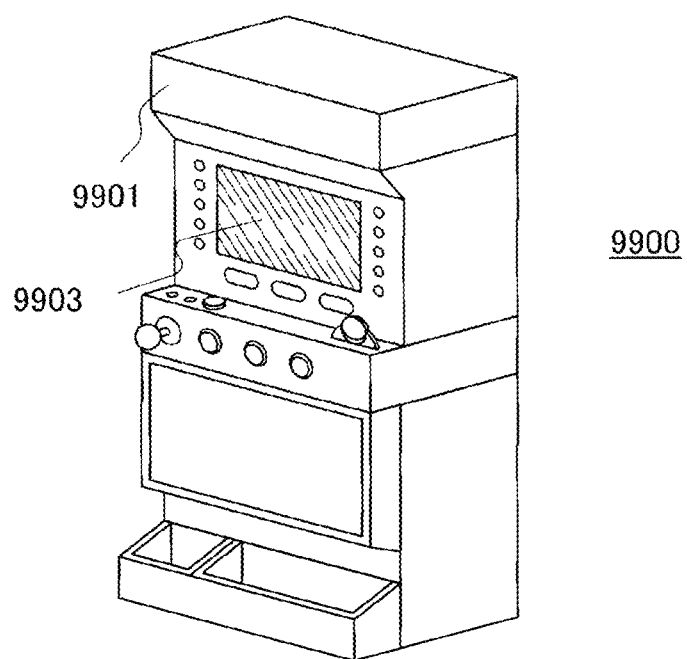

FIG. 29B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 30A:
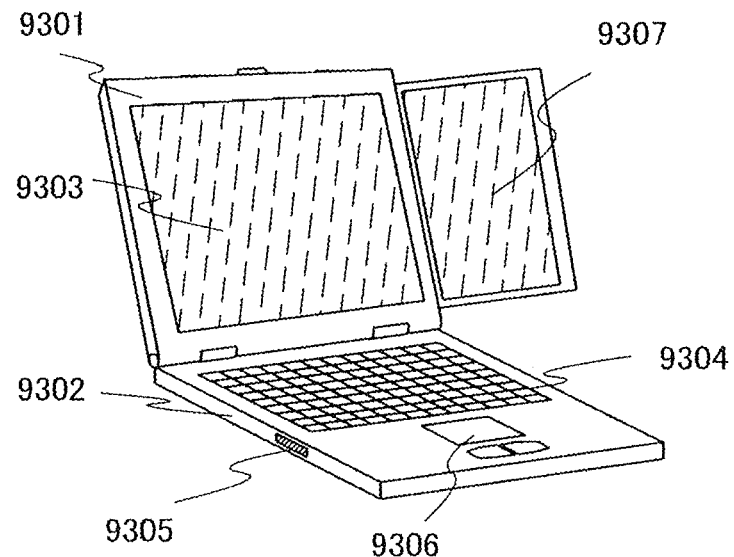
FIGS. 30A and 30B are external views illustrating an example of a portable computer and an example of a mobile phone, respectively.

FIG. 30A is a perspective view illustrating an example of a portable computer.

In the portable computer of FIG. 30A, a top housing 9301 having a display portion 9303 and a bottom housing 9302 having a keyboard 9304 can overlap with each other by closing a hinge unit which connects the top housing 9301 and the bottom housing 9302. The portable computer of FIG. 30A can be convenient for carrying, and in the case of using the keyboard for input, the hinge unit is opened and the user can input data looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed using an image display device of a liquid crystal display panel, a light-emitting display panel such as an organic light-emitting element or an inorganic light-emitting element, or the like.

In addition, the portable computer in FIG. 30A can be provided with a receiver and the like and can receive a television broadcast to display an image on the display portion. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 30B:
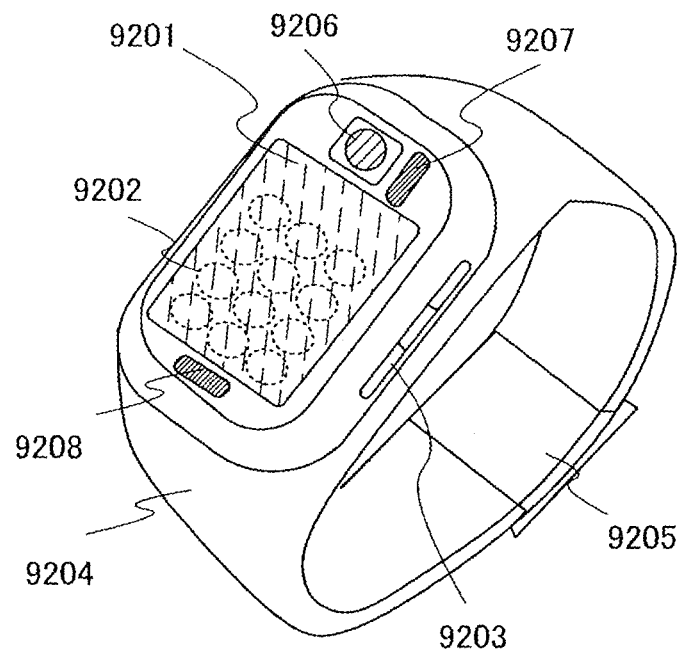

FIG. 30B is a perspective view illustrating an example of a mobile phone that the user can wear on the wrist like a wristwatch.

This mobile phone is formed with a main body which includes a communication device including at least a telephone function, and battery; a band portion which enables the main body to be wore on the wrist; an adjusting portion 9205 for adjusting the fixation of the band portion fixed for the wrist; a display portion 9201; a speaker 9207; and a microphone 9208.

In addition, the main body includes operation switches 9203. The operation switches 9203 can serve, for example, as a switch for starting a program for the Internet when the switch is pushed, in addition to serving as a switch for turning on a power source, a switch for shifting the display, a switch for instruction to start taking images, or the like, and can be configured to have respective functions.

Input to this mobile phone is operated by touching the display portion 9201 with a finger or an input pen, operating the operation switches 9203, or inputting voice into the microphone 9208. Note that displayed buttons 9202 which are displayed on the display portion 9201 are illustrated in FIG. 30B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 30B is provided with a receiver of a television broadcast and the like, and can display an image on the display portion 9201 by receiving a television broadcast. In addition, the mobile phone illustrated in FIG. 30B is provided with a memory device and the like such as a memory, and can record a television broadcast in the memory. The mobile phone illustrated in FIG. 30B may have a function of collecting location information, such as the GPS.

An image display device of a liquid crystal display panel, a light-emitting display panel such as an organic light-emitting element or an inorganic light-emitting element, or the like is used as the display portion 9201. The cellular phone illustrated in FIG. 30B is compact and lightweight and the battery capacity of the cellular phone illustrated in FIG. 30B is limited. Therefore, a panel which can be driven with low power consumption is preferably used as a display device for the display portion 9201.

Note that FIG. 30B illustrates the electronic appliances which are worn on the wrist; however, this embodiment is not limited thereto as long as a portable shape is employed.

Embodiment 10

In this embodiment, an example of a manufacturing process which is partly different from that of Embodiment 1 will be described. An example in which heat treatment for dehydration or dehydrogenation is performed after formation of source and drain electrode layers 405a and 405b is illustrated in FIGS. 31A to 31D. Note that portions the same as those in FIGS. 6A to 6D are denoted by the same reference numerals.

Figure 31A:
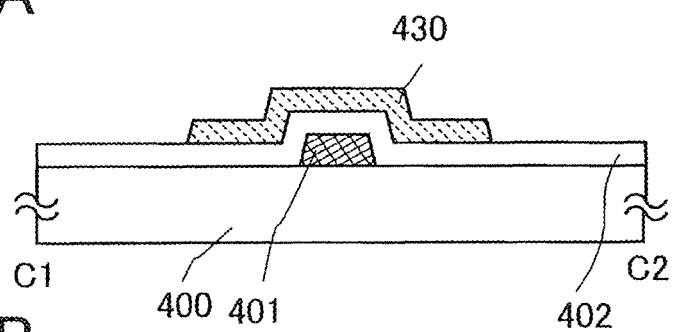
FIGS. 31A to 31D illustrate a method for manufacturing a semiconductor device.

In a manner similar to Embodiment 1, over the substrate 400 having an insulating surface, the gate electrode layer 401, the gate insulating layer 402, and the oxide semiconductor layer 430 are formed (see FIG. 31A).

Figure 31B:
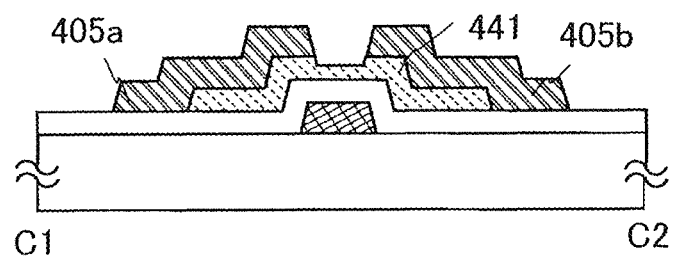
Figure 31C:
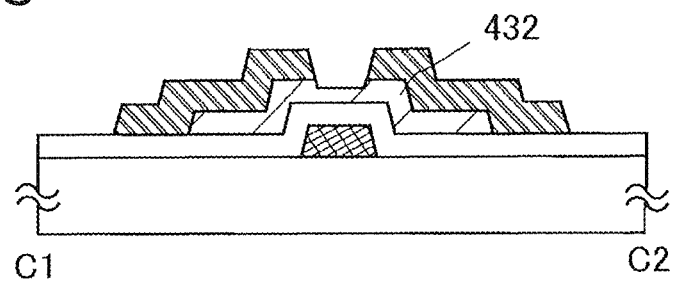
Figure 31D:
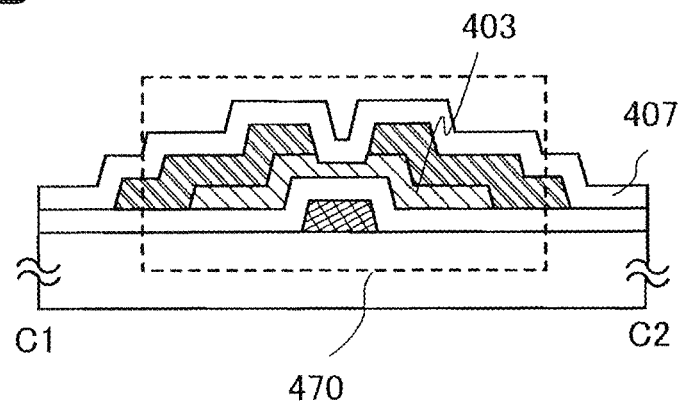

The source and drain electrode layers 405a and 405b are formed over the oxide semiconductor layer 430, and the oxide semiconductor layer 430 is partly etched, so that an oxide semiconductor layer 441 is formed (see FIG. 31B).

Next, the oxide semiconductor layer 441 and the source and drain electrode layers 405a and 405b are subjected to heat treatment and slow cooling under an atmosphere of an inert gas (such as nitrogen, helium, neon, or argon) or under reduced pressure. This heat treatment causes dehydration or dehydrogenation in the oxide semiconductor layer 441, so that resistance of the oxide semiconductor layer 441 is reduced. Thus, the low-resistance oxide semiconductor layer 432 can be obtained (see FIG. 31C). Note that as the source and drain electrode layers 405a and 405b, a material which has heat resistance enough to withstand heat treatment, such as tungsten or molybdenum, is preferably used.

After the heat treatment and slow cooling, the oxide insulating film 407 is formed to be in contact with the oxide semiconductor layer 432 by a sputtering method or a PCVD method without exposure to air. When the oxide insulating film 407 is formed to be in contact with the low-resistance oxide semiconductor layer 432 by a sputtering method or a PCVD method, in the low-resistance oxide semiconductor layer 432, at least a region in contact with the oxide insulating film 407 has increased resistance (i.e., the carrier concentration is reduced, preferably to lower than $1\times10^{18}/cm^3$, more preferably $1\times10^{14}/cm^3$ or lower), so that a high-resistance oxide semiconductor region can be obtained. Thus, the oxide semiconductor layer 432 becomes the semiconductor layer 403 having a high-resistance oxide semiconductor region (a third oxide semiconductor layer), and then the thin film transistor 470 can be completed (see FIG. 31D).

Impurities (such as $H_2O$, H, and OH) contained in the oxide semiconductor layer are reduced by performance of the heat treatment for dehydration or dehydrogenation, and the carrier concentration is increased. After that, slow cooling is performed. Then, formation of an oxide insulating film in contact with the oxide semiconductor layer, or the like, is performed, so that the carrier concentration is reduced. Thus, reliability of the thin film transistor 470 can be improved.

Further, this embodiment can be freely combined with Embodiment 1.

Embodiment 11

A semiconductor device and a method of manufacturing the semiconductor device will be described with reference to FIG. 32. The same portion as or a portion having similar function to those described in Embodiment 1 can be formed in a manner similar to that described in Embodiment 1; therefore, repetitive description is omitted.

Figure 32:
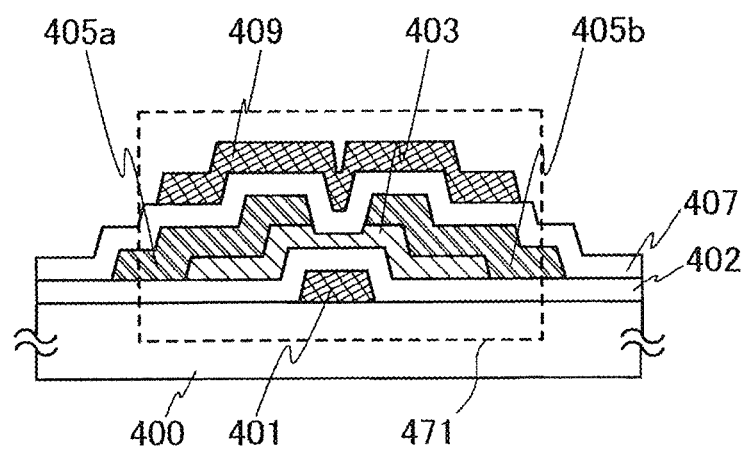
FIG. 32 illustrates a semiconductor device of one embodiment of the present invention.

The thin film transistor 471 illustrated in FIG. 32 is an example, in which a conductive layer 409 is provided to overlap with the gate electrode layer 401 and a channel region of the semiconductor layer 403 with an insulating film interposed therebetween.

FIG. 32 is a cross-sectional view of the thin film transistor 471 included in a semiconductor device. The thin film transistor 471 is a bottom-gate thin film transistor and includes, over the substrate 400 which is a substrate having an insulating surface, the gate electrode layer 401, the gate insulating layer 402, the semiconductor layer 403, the source and drain electrode layers 405a and 405b, and the conductive layer 409. The conductive layer 409 is provided over the oxide insulating film 407 so as to overlap with the gate electrode layer 401.

The conductive layer 409 can be formed using a material similar to that of the gate electrode layer 401 or the source and drain electrode layers 405a and 405b by a method similar thereto. In the case of providing a pixel electrode layer, the conductive layer 409 may be formed using a material similar to that of the pixel electrode by a method similar thereto. In this embodiment, the conductive layer 409 is formed using a stacked layer of a titanium film, an aluminum film, and a titanium film.

The conductive layer 409 may have the same potential as the gate electrode layer 401 or have potential different from that of the gate electrode layer 401 and can function as a second gate electrode layer. Further, the conductive layer 409 may be in a floating state.

In addition, by providing the conductive layer 409 in a position overlapping with the semiconductor layer 403, in a bias-temperature stress test (BT test) for examining reliability of a thin film transistor, the amount of shift in threshold voltage of the thin film transistor 471 between before and after the BT test can be reduced. In particular, in a −BT test where −20 V of voltage is applied to a gate after the substrate temperature is increased to 150° C., shift in threshold voltage can be suppressed.

This embodiment can be freely combined with Embodiment 1.

Embodiment 12

A semiconductor device and a method for manufacturing a semiconductor device will be described with reference to FIG. 33. The same portion as or a portion having similar function to those described in Embodiment 1 can be formed in a manner similar to that described in Embodiment 1; therefore, repetitive description is omitted.

Figure 33:
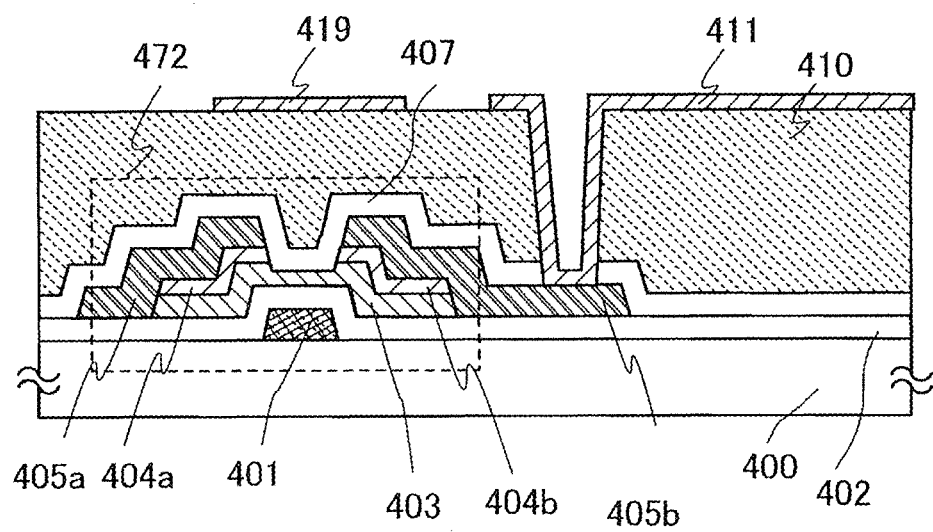
FIG. 33 illustrates a semiconductor device of one embodiment of the present invention.

A thin film transistor 472 illustrated in FIG. 33 is an example, in which a conductive layer 419 is provided to overlap with the gate electrode layer 401 and a channel region of the semiconductor layer 403 with the oxide insulating film 407 and an insulating layer 410 interposed therebetween.

FIG. 33 is a cross-sectional view of the thin film transistor 472 included in a semiconductor device. The thin film transistor 472 is a bottom-gate thin film transistor and includes, over the substrate 400 which is a substrate having an insulating surface, the gate electrode layer 401, the gate insulating layer 402, the semiconductor layer 403, source and drain regions 404a and 404b, the source and drain electrode layers 405a and 405b, and the conductive layer 419. The conductive layer 419 is provided over the oxide insulating film 407 and the insulating layer 410 to overlap with the gate electrode layer 401.

In this embodiment, the insulating layer 410 serving as a planarization film is stacked over the oxide insulating film 407, and an opening which reaches the source or drain electrode layer 405b is formed in the oxide insulating film 407 and the insulating layer 410. A conductive film is formed over the insulating layer 410 and in the opening formed in the oxide insulating film 407 and the insulating layer 410, and etched into a desired shape, so that the conductive layer 419 and a pixel electrode layer 411 are formed. In such a manner, the conductive layer 419 can be formed together with the pixel electrode layer 411, using the same material by the same method. In this embodiment, the pixel electrode layer 411 and the conductive layer 419 are formed using indium oxide-tin oxide alloy containing silicon oxide (an In—Sn—O based oxide containing silicon oxide).

The conductive layer 419 may be formed using a material similar to that of the gate electrode layer 401 or the source and drain electrode layers 405a and 405b by a method similar thereto.

The conductive layer 419 may have the same potential as the gate electrode layer 401 or have potential different from that of the gate electrode layer 401 and can function as a second gate electrode layer. Further, the conductive layer 419 may be in a floating state.

In addition, in the case of providing the conductive layer 419 in a portion overlapping with the semiconductor layer 403, in a bias-temperature stress test (BT test) for examining reliability of a thin film transistor, the amount of shift in threshold voltage of the thin film transistor 472 between before and after the BT test can be reduced.

This embodiment can be freely combined with Embodiment 1.

Embodiment 13

In this embodiment, an example of a channel-stop thin film transistor 1430 will be described with reference to FIGS. 34A to 34C. FIG. 34C illustrates an example of a top view of the thin film transistor, cross-sectional view along dotted line Z1-Z2 of which corresponds to FIG. 34B. Described in this embodiment is an example in which gallium is not contained in an oxide semiconductor layer of the thin film transistor 1430.

Figure 34A:
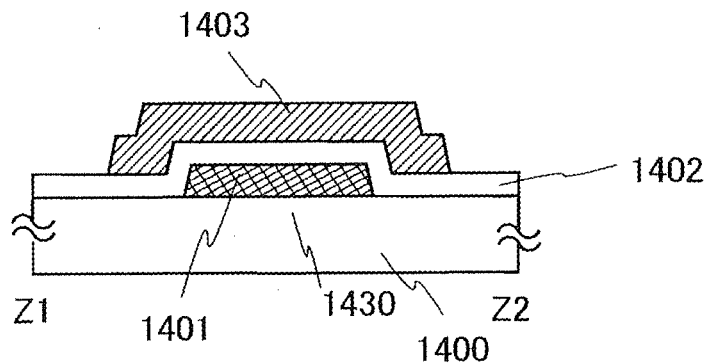
FIGS. 34A to 34C illustrate a semiconductor device of one embodiment of the present invention.

As in FIG. 34A, a gate electrode layer 1401 is formed over a substrate 1400. Next, an oxide semiconductor layer is formed over a gate insulating layer 1402 covering the gate electrode layer 1401.

In this embodiment, the oxide semiconductor layer is formed using a Sn—Zn—O-based oxide semiconductor by a sputtering method. When gallium is not used for the oxide semiconductor layer, cost can be reduced because an expensive target is not used in formation of the oxide semiconductor layer.

Just after deposition of an oxide semiconductor film or after patterning of the oxide semiconductor film, dehydration or dehydrogenation is performed.

In order to perform dehydration or dehydrogenation, heat treatment is performed under an atmosphere of an inert gas (such as nitrogen, helium, neon, or argon) or under reduced pressure, and then, slow cooling is performed under an inert atmosphere. The heat treatment is performed at 200° C. to 600° C. inclusive, preferably 400° C. to 450° C. inclusive. By heat treatment and slow cooling performed under an inert-gas atmosphere or under reduced pressure, the oxide semiconductor layer can have reduced resistance (i.e., the carrier concentration is increased, preferably to $1\times10^{18}/cm^3$ or higher), so that a low-resistance oxide semiconductor layer 1403 can be provided (see FIG. 34A).

Next, a channel protective layer 1418 is provided to be in contact with the oxide semiconductor layer 1403. The channel protective layer 1418 can prevent the channel formation region of the oxide semiconductor layer 1403 to be damaged in the manufacturing process (e.g., reduction in thickness due to plasma or an etchant in etching). Accordingly, reliability of the thin film transistor 1430 can be improved.

Further, after dehydration or dehydrogenation, the channel protective layer 1418 can be formed successively without exposure to air. Successive film formation without being exposed to air makes it possible to obtain each interface of stacked layers, which are not contaminated by atmospheric components or impurity elements floating in air. Therefore, variation in characteristics of the thin film transistor can be reduced.

When the channel protective layer 1418 that is an oxide insulating film is formed to be in contact with the low-resistance oxide semiconductor layer 1403, by a sputtering method, a PCVD method, or the like, in the low-resistance oxide semiconductor layer 1403, at least a region which is in contact with the channel protective layer 1418 can have increased resistance (i.e., the carrier concentration is reduced, preferably to lower than $1\times10^{18}/cm^3$, more preferably $1\times10^{14}/cm^3$ or lower). Thus, a high-resistance oxide semiconductor region can be obtained. During a manufacture process of a semiconductor device, it is important to increase and decrease the carrier concentration in the oxide semiconductor layer through performance of heat treatment and slow cooling under an inert-gas atmosphere (or reduced pressure), formation of an oxide insulating film, and the like.

The channel protective layer 1418 can be formed using an inorganic material including oxygen (such as silicon oxide, silicon oxynitride, or silicon nitride oxide). As a formation method, a vapor deposition method such as a plasma CVD method or a thermal CVD method or a sputtering method can be used. The channel protective layer 1418 is processed by etching a shape of a deposited film. Here, the channel protective layer 1418 is formed in such a manner that a silicon oxide film is formed by a sputtering method and processed by etching using a mask formed by photolithography.

Next, n$^+$ layers 1406a and 1406b are formed over the channel protective layer 1418 and the oxide semiconductor layer 1403. In this embodiment, the n$^+$ layers 1406a and 1406b serving as source and drain regions, which are oxide semiconductor layers having lower resistance, are formed of an Al—Zn—O-based non-single-crystal film under deposition conditions different from the deposition conditions of the oxide semiconductor layer 1403. The n$^+$ layers 1406a and 1406b may be formed using an Al—Zn—O-based non-single-crystal film containing nitrogen, that is, an Al—Zn—O—N-based non-single-crystal film (also called an AZON film).

Figure 34B:
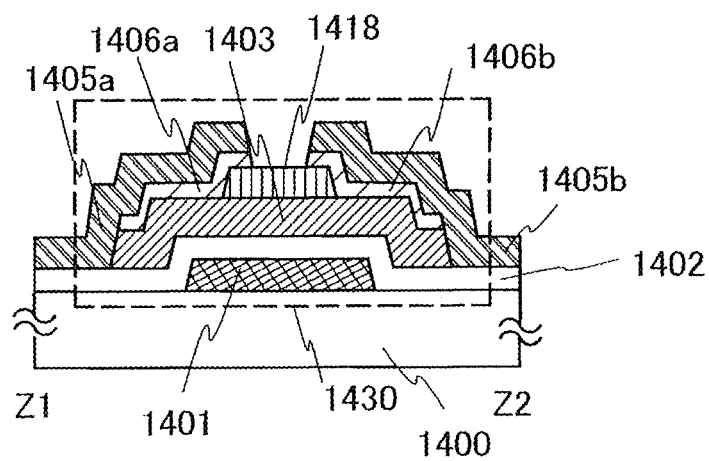
Figure 34C:
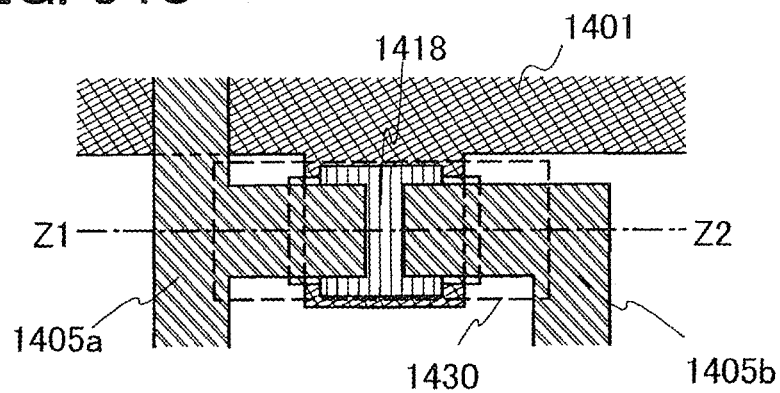

Next, a source electrode layer 1405a and a drain electrode layer 1405b are formed over the n$^+$ layer 1406a and the n$^+$ layer 1406b, respectively; thus, the thin film transistor 1430 is completed (see FIG. 34B). The source and drain electrode layers 1405a and 1405b are formed using any of an element selected from Al, Cr, Ta, Ti, Mo, and W, an alloy including any of the elements as a component, an alloy film including a combination of any of the elements, and the like. Alternatively, the source and drain electrode layers 1405a and 1405b may have a stacked layer including any of the above.

Provision of the n$^+$ layers 1406a and 1406b can make a good junction between the oxide semiconductor layer 1403 and the source and drain electrode layers 1405a and 1405 which are metal layers, which allows higher thermal stability than in the case of providing Schottky junction. In addition, willing provision of the n$^+$ layer is effective in supplying carriers to the channel (on the source side), stably absorbing carriers from the channel (on the drain side), or preventing a resistance component from being formed at an interface between the wiring and the oxide semiconductor layer. Moreover, since resistance is reduced, good mobility can be ensured even with a high drain voltage.

Further, this embodiment is not limited to the above-described structure including the n$^+$ layers 1406a and 1406b; a structure in which an n$^+$ layer is not provided may be employed.

After the channel protective layer 1418 is formed, the thin film transistor 1430 is subjected to heat treatment under a nitrogen atmosphere or an air atmosphere (in air) (at a temperature equal to or higher than 150° C. and lower than 350° C.). For example, heat treatment is performed under a nitrogen atmosphere at 250° C. for one hour. In such heat treatment, the oxide semiconductor layer 1403 in a condition of being in contact with the channel protective layer 1418 is heated; thus, variation in electric characteristics of the thin film transistor 1470 can be reduced. There is no particular limitation on when to perform this heat treatment (at temperature equal to or higher than 150° C. and lower than 350° C., preferably) as long as it is performed after the channel protective layer 1418 is formed. When this heat treatment also serves as heat treatment in another step, e.g., heat treatment in formation of a resin film or heat treatment for reducing resistance of a transparent conductive film, the number of steps can be prevented from increasing.

This embodiment can be implemented in appropriate combination with the structures described in the other embodiments.

Embodiment 14

A semiconductor device and a method for manufacturing a semiconductor device will be described with reference to FIGS. 35A and 35B. The same portion or a portion having a function similar to that of Embodiment 13 and the same steps as those of Embodiment 13 can be made as described in Embodiment 13; thus the repetitive description thereof is omitted.

Figure 35A:
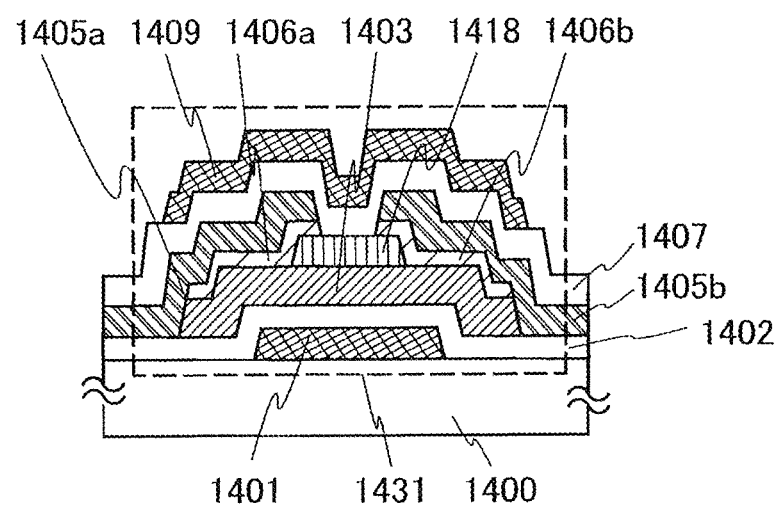
FIGS. 35A and 35B illustrate a semiconductor device of one embodiment of the present invention.

A thin film transistor 1431 illustrated in FIG. 35A is an example having a structure in which a conductive layer 1409 is provided to overlap with the gate electrode layer 1401 and a channel region of the oxide semiconductor layer 1403 with the channel protective layer 1418 and an insulating layer 1407 interposed therebetween.

FIG. 35A is a cross-sectional view of the thin film transistor 1431 included in a semiconductor device. The thin film transistor 1431 is a bottom-gate thin film transistor, which includes, over the substrate 1400 having an insulating surface, the gate electrode layer 1401, the gate insulating layer 1402, the oxide semiconductor layer 1403, the source and drain regions 1404a and 1404b, the source and drain electrode layers 1405a and 1405b, and the conductive layer 1409. The conductive layer 1409 is provided to overlap with the gate electrode layer 1401 with the insulating layer 1407 interposed therebetween.

The conductive layer 1409 can be formed using a material similar to that of the gate electrode layer 1401 or the source and drain electrode layers 1405a and 1405b by a method similar thereto. In the case where a pixel electrode layer is provided, the conductive layer 1409 may be formed using a material similar to that of the pixel electrode layer by a method similar thereto. In this embodiment, a stack of a titanium film, an aluminum film, and a titanium film is used as the conductive layer 1409.

The conductive layer 1409 may have the same potential as the gate electrode layer 1401 or have potential different from that of the gate electrode layer 1401 and can function as a second gate electrode layer. Further, the conductive layer 1409 may be in a floating state.

In addition, by providing the conductive layer 1409 in a portion overlapping with the oxide semiconductor layer 1403, in a bias-temperature stress test (hereinafter, referred to as a BT test) for examining reliability of a thin film transistor, the amount of shift in threshold voltage of the thin film transistor 1431 between before and after the BT test can be reduced.

Figure 35B:
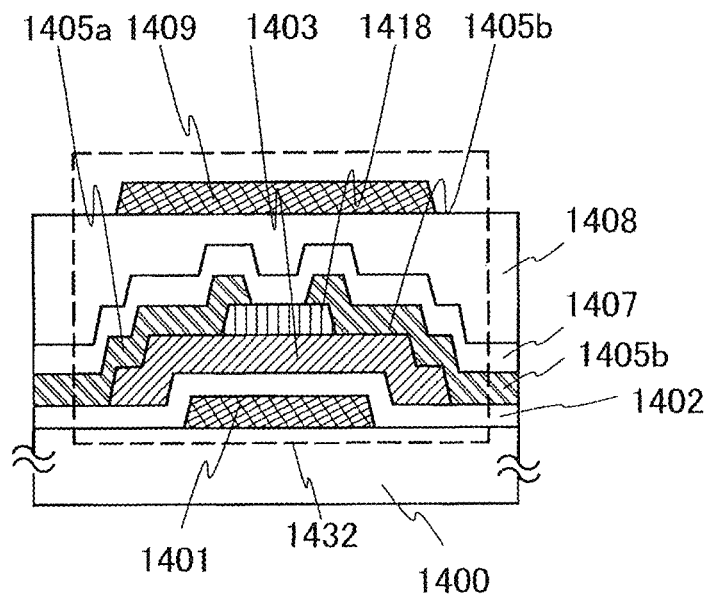

FIG. 35B illustrates an example partly different from FIG. 35A. The same portion and a step as, or a portion having function similar to those illustrated in FIG. 35A can be made in a manner similar to that illustrated in FIG. 35A; therefore, repetitive description is omitted.

A thin film transistor 1432 illustrated in FIG. 35B is an example having a structure in which the conductive layer 1409 is provided to overlap with the gate electrode layer 1401 and a channel region of the oxide semiconductor layer 1403 with the channel protective layer 1418, the insulating layer 1407, and an insulating layer 1408 interposed between the conductive layer 1409 and the gate electrode layer 1401.

In FIG. 35B, the insulating layer 1408 functioning as a planarization film is stacked over the insulating layer 1407.

In addition, FIG. 35B shows a structure in which source and drain regions are not provided, and the oxide semiconductor layer 1403 is directly in contact with the source electrode layer 1405a and the drain electrode layer 1405b.

The conductive layer 1409 is provided in a portion overlapping with the oxide semiconductor layer 1403 in the structure of FIG. 35B similar to FIG. 35A, whereby in a bias-temperature stress test for examining reliability of a thin film transistor, the amount of shift in threshold voltage of the thin film transistor 1432 between before and after the BT test can be reduced.

This embodiment can be implemented in appropriate combination with the structures described in the other embodiments.

Embodiment 15

In this embodiment, an example of a structure which is partly different from that of Embodiment 1 will be described with reference to FIG. 36. The same portion as or a portion having a function similar to those described in Embodiment 1 can be formed in a manner similar to that described in Embodiment 1, and also the steps similar to those of Embodiment 1 can be performed in a manner similar to those described in Embodiment 1; therefore, repetitive description is omitted.

In this embodiment, after patterning of the first oxide semiconductor layer, heat treatment is performed under an atmosphere of an inert gas (such as nitrogen, helium, neon, or argon) or under reduced pressure, and then slow cooling is performed. Heat treatment performed on the first oxide semiconductor layer under the above atmosphere makes it possible to eliminate impurities such as hydrogen and moisture in an oxide semiconductor layer 403.

Next, a second oxide semiconductor film used for forming source and drain regions (also referred to as an n$^+$ layer or a buffer layer) of a thin film transistor is formed over the first oxide semiconductor layer and then a conductive film is formed.

Then, the first oxide semiconductor layer, the second oxide semiconductor film, and the conductive film are selectively etched through an etching step to form the oxide semiconductor layer 403, source and drain regions 404a and 404b (also referred to as n$^+$ layers or buffer layers), and the source and drain electrode layers 405a and 405b. Note that the oxide semiconductor layer 403 is partly etched to have a groove portion (a recessed portion).

Next, a silicon oxide film as the oxide insulating film 407 is formed in contact with the oxide semiconductor layer 403 by a sputtering method or a PCVD method. The oxide insulating film 407 formed in contact with the low-resistance oxide semiconductor layer does not include impurities such as moisture, a hydrogen ion, and OH$^-$ and is formed using an inorganic insulating film which blocks entry of these impurities from the outside, specifically, a silicon oxide film or a silicon nitride oxide film.

When the oxide insulating film 407 is formed in contact with the low-resistance oxide semiconductor layer 403 by a sputtering method or a PCVD method, or the like, in the low-resistance oxide semiconductor layer 403, at least a region in contact with the oxide insulating film 407 has increased resistance (i.e., the carrier concentration is reduced, preferably to lower than $1 \times 10^{18}/cm^3$, more preferably $1 \times 10^{14}/cm^3$ or lower). Thus, a high-resistance oxide semiconductor region can be provided. By formation of the oxide insulating film 407 in contact with the oxide semiconductor layer 403, the oxide semiconductor layer has a high-resistance oxide semiconductor region. Thus, a thin film transistor 473 can be completed (see FIG. 36).

Figure 36:
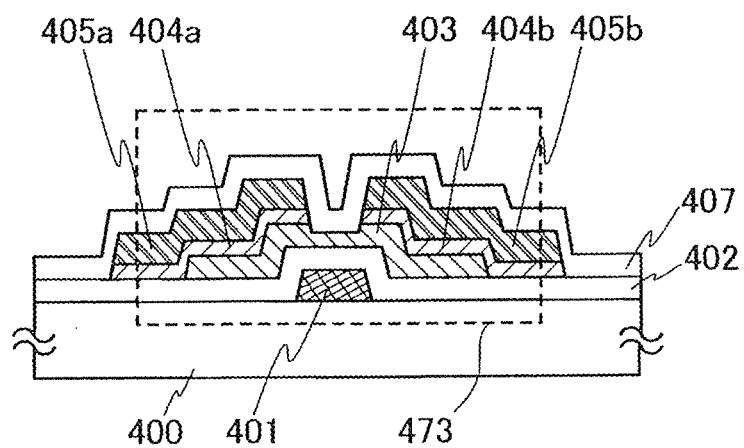
FIG. 36 illustrates a semiconductor device of one embodiment of the present invention.
Figure 37:
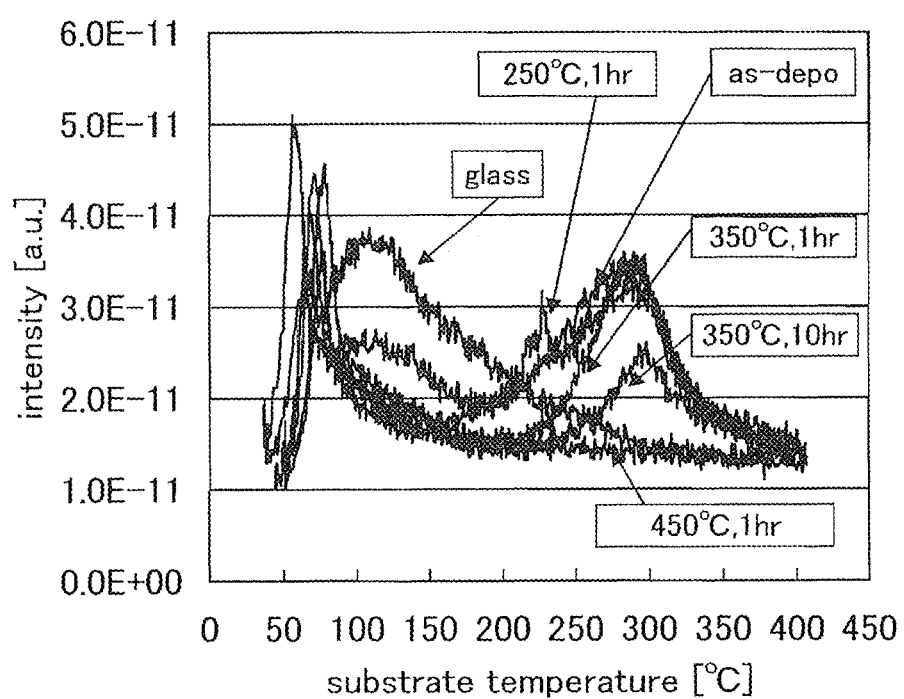
FIG. 37 is a graph showing TDS results about H.
Figure 38:
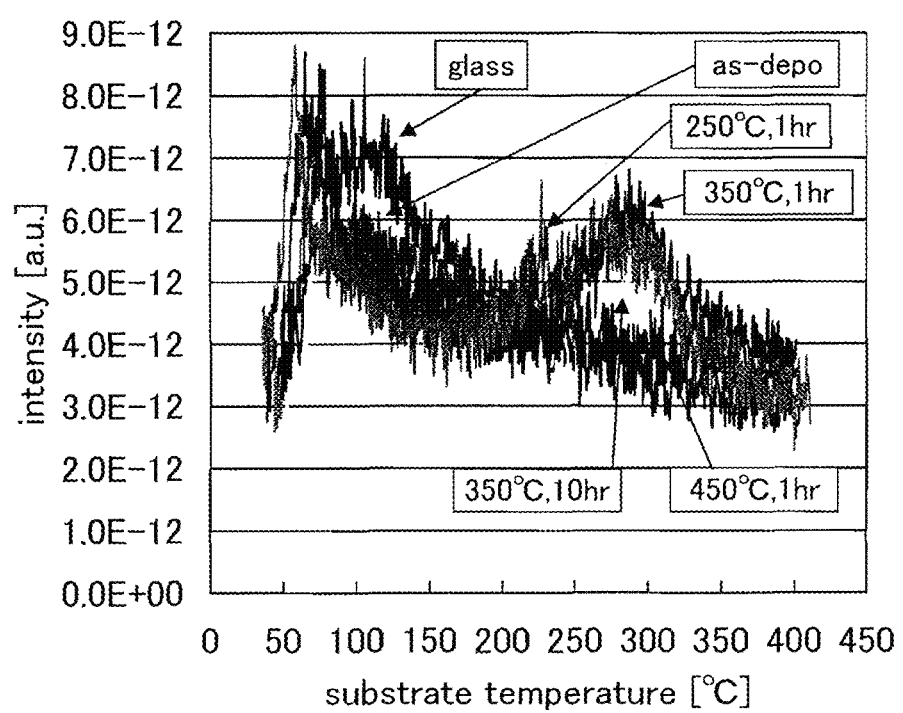
FIG. 38 is a graph showing TDS results about O.
Figure 39:
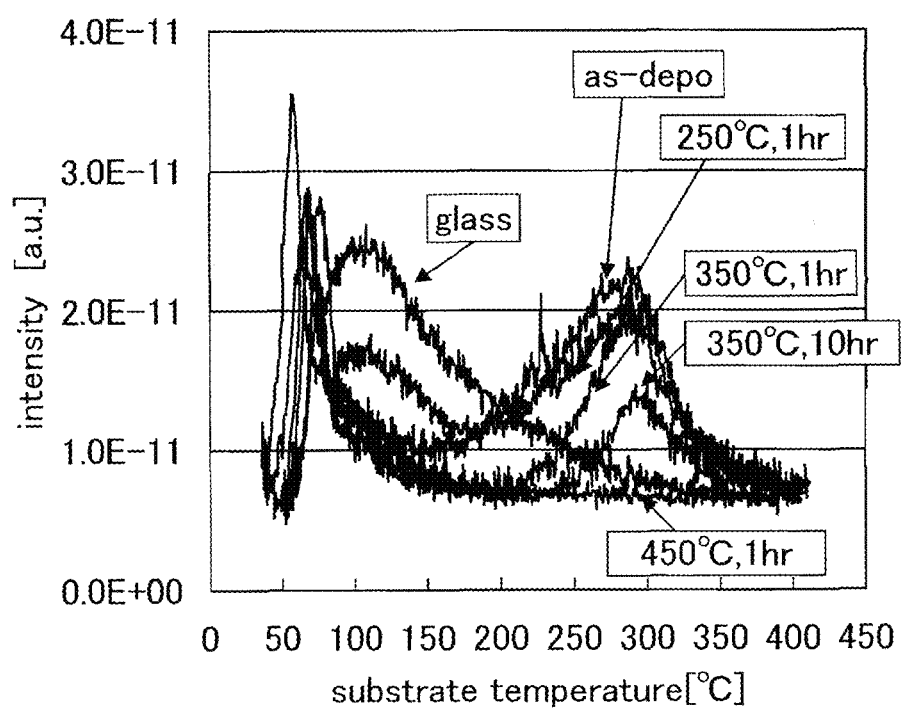
FIG. 39 is a graph showing TDS results about OH.
Figure 40:
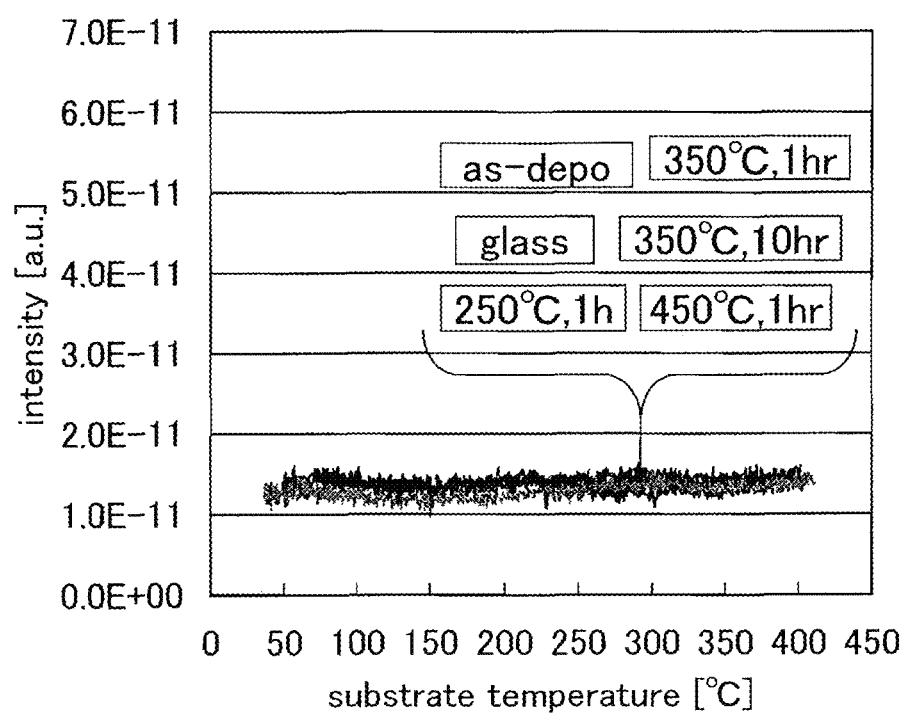
FIG. 40 is a graph showing TDS results about $H_2$.

In the structure illustrated in FIG. 36, an In—Ga—Zn—O-based non-single-crystal film is used for the source and drain regions (also referred to as n$^+$ layers or buffer layers) 404a and 404b.

In addition, the source region is provided between the oxide semiconductor layer 403 and the source electrode layer, and the drain region is provided between the oxide semiconductor layer 403 and the drain electrode layer. As the source and drain regions, an oxide semiconductor layer having an n-type conductivity is used.

Further, the second oxide semiconductor film used for the source and drain regions 404a and 404b of the thin film transistor 473 is preferably thinner than the first oxide semiconductor layer used for a channel formation region and preferably has conductivity (electrical conductivity) higher than the first oxide semiconductor layer.

Further, the first oxide semiconductor layer used for the channel formation region has an amorphous structure and the second oxide semiconductor film used for the source region and the drain region includes a crystal grain (nanocrystal) in an amorphous structure in some cases. The crystal grain (nanocrystal) in the second oxide semiconductor film used for the source region and the drain region has a diameter of 1 nm to 10 nm, typically about 2 nm to 4 nm.

After formation of the oxide insulating film 407, the thin film transistor 473 may be subjected to heat treatment (preferably at a temperature higher than or equal to 150° C. and lower than 350° C.) under a nitrogen atmosphere or an air atmosphere (in air). For example, heat treatment is performed under a nitrogen atmosphere at 250° C. for one hour. In such heat treatment, the oxide semiconductor layer 403 in a condition of being in contact with the oxide insulating film 407 is heated; thus, variation in electric characteristics of the thin film transistor 473 can be reduced.

This embodiment can be implemented in appropriate combination with the structures described in the other embodiments.

On the present invention having the above-described structures, further specific description will be made with an embodiments below.

Example 1

With respect to an oxide semiconductor layer including a region having high oxygen density and a region having low oxygen density, a change in the oxygen density between before and after heat treatment was simulated. The result thereof will be described with reference to FIG. 42 and FIG. 43 in this example. As software for the simulation, Materials Explorer 5.0 manufactured by Fujitsu Limited was used.

Figure 42:
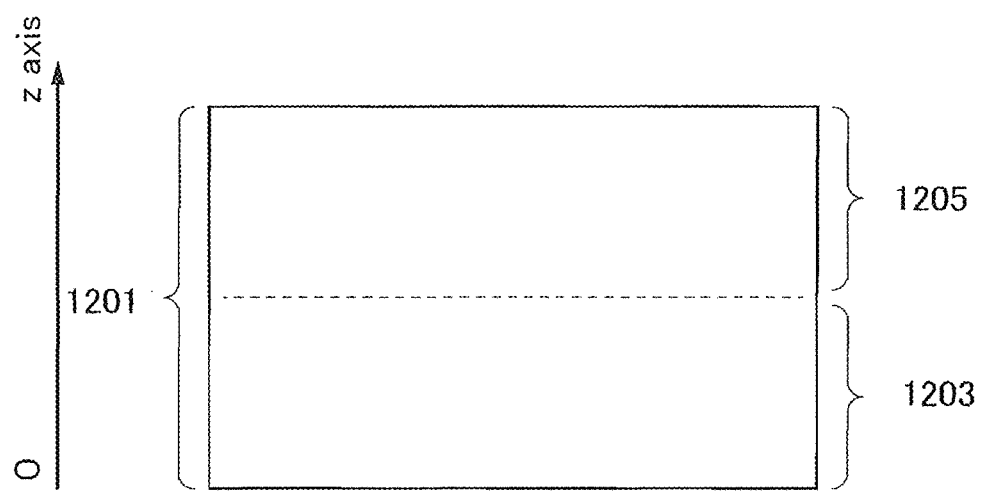
FIG. 42 is a view illustrating a structure of an oxide semiconductor layer used for calculation.

FIG. 42 illustrates a model of an oxide semiconductor layer which was used for the simulation. Here, a structure in which a layer 1203 having low oxygen density and a layer 1205 having high oxygen density were stacked was employed for an oxide semiconductor layer 1201.

The layer 1203 having low oxygen density was formed to have an amorphous structure including In atoms, Ga atoms, Zn atoms, and O atoms, where the numbers of In atoms, Ga atoms, and Zn atoms were each 15 and the number of O atoms was 54.

In addition, the layer 1205 having high oxygen density was formed to have an amorphous structure including In atoms, Ga atoms, Zn atoms, and O atoms, where the numbers of In atoms, Ga atoms, and Zn atoms were each 15 and the number of O atoms was 66.

The density of the oxide semiconductor layer 1201 was set to 5.9 g/cm$^3$.

Next, the classical molecular dynamics (MD) simulation was performed on the oxide semiconductor layer 1201 under conditions of NVT ensemble and a temperature of 250° C. The time step was set to 0.2 fs, and the total simulation time was set to 200 ps. In addition, Born-Mayer-Huggins potential was used for the potentials of metal-oxygen bonding and oxygen-oxygen bonding. Moreover, movement of atoms at an upper end portion and a lower end portion of the oxide semiconductor layer 1201 was fixed.

Figure 43:
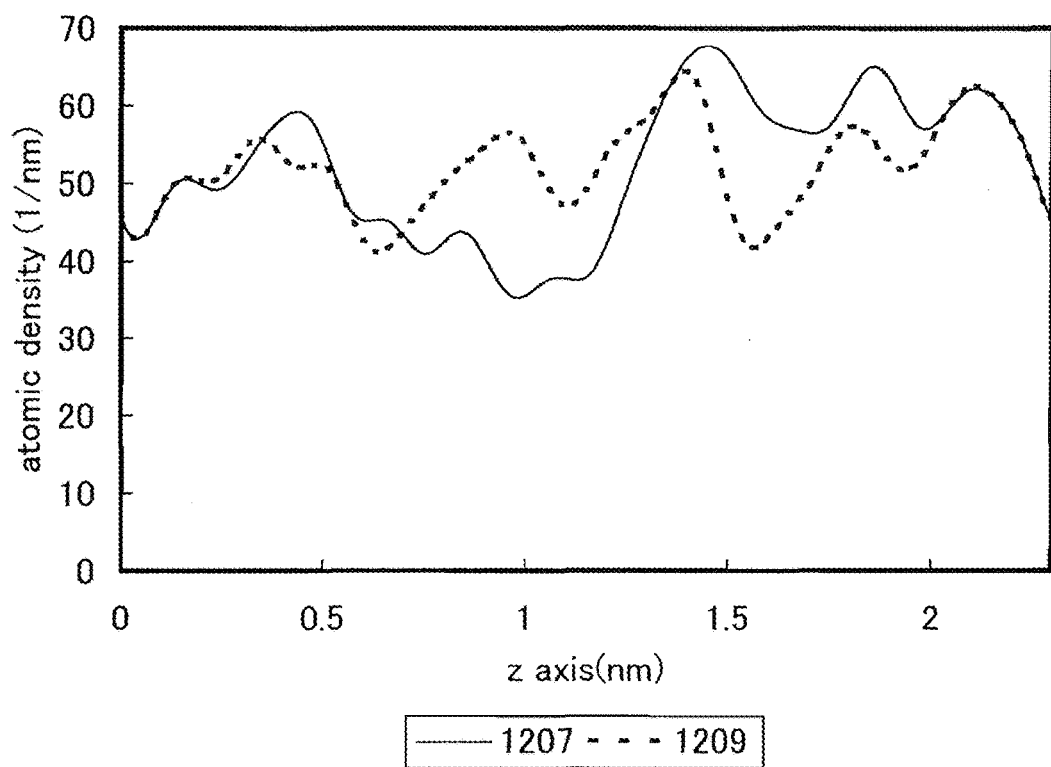
FIG. 43 is a graph describing calculation results of the oxygen density in an oxide semiconductor layer.

The simulation results are shown in FIG. 43. In z-axis coordinates, the range of 0 nm to 1.15 nm indicates the layer 1203 having low oxygen density, and the range of 1.15 nm to 2.3 nm indicates the layer 1205 having high oxygen density. The distribution of oxygen densities before the MD simulation is indicated by a solid line 1207, and the distribution of oxygen densities after the MD simulation is indicated by a dashed line 1209.

The solid line 1207 shows that the oxide semiconductor layer 1201 has high oxygen densities in a region ranging from an interface between the layer 1203 having low oxygen density and the layer 1205 having high oxygen density to the layer 1205 having high oxygen concentration. On the other hand, the dashed line 1209 shows that the oxygen density is uniform in the layer 1203 having low oxygen density and the layer 1205 having high oxygen density.

From the above, when there is non-uniformity in the distribution of oxygen density as in the stack of the layer 1203 having low oxygen density and the layer 1205 having high oxygen density, it is found that the oxygen density from where the oxygen density is higher to where the oxygen density is lower by heat treatment and thus the oxygen density becomes uniform.

That is, as described in Embodiment 1, since the oxygen density at the interface between the oxide semiconductor layer 403 and the oxide insulating film 407 is increased by formation of the oxide insulating film 407 over the first oxide semiconductor layer 403, the oxygen diffuses to the oxide semiconductor layer 403 where the oxygen density is low and thus the semiconductor layer 403 has higher resistance. As described above, reliability of a thin film transistor can be improved.

This application is based on Japanese Patent Application serial no. 2009-156410 filed with Japan Patent Office on Jun. 30, 2009, the entire contents of which are hereby incorporated by reference.

The invention claimed is:

1. A method for manufacturing a semiconductor device including a transistor, the method comprising the steps of:
    forming an oxide semiconductor layer over an insulating layer;
    preforming a first heat treatment on the oxide semiconductor layer under an inert atmosphere at a first temperature equal to or higher than 400° C.;
    forming an oxide insulating layer over and in contact with a first part of the oxide semiconductor layer after the first heat treatment; and
    performing a second heat treatment heating the oxide insulating layer at a second temperature equal to or higher than 150° C. and lower than 350° C.,
    wherein the first part of the oxide semiconductor layer is included in a channel formation region of the transistor.

2. The method according to claim 1, wherein the inert atmosphere is one of a nitrogen atmosphere and a rare gas atmosphere.

3. The method according to claim 1, wherein the second heat treatment is performed under one of a nitrogen atmosphere and an air atmosphere.

4. The method according to claim 1, further comprising the step of forming a source electrode layer and a drain electrode layer on a second part and a third part of the oxide semiconductor layer before forming the oxide insulating layer.

5. The method according to claim 4, wherein the source electrode layer and the drain electrode layer comprise a material selected from titanium and molybdenum.

6. The method according to claim 1, wherein the oxide semiconductor layer comprises a crystal.

7. The method according to claim 1, wherein the oxide semiconductor layer comprises indium and zinc.

8. The method according to claim 1, wherein the oxide semiconductor layer comprises a material selected from the group consisting of In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; an In—Ga—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

9. The method according to claim 1,
    wherein by performing the first heat treatment, a carrier concentration in the oxide semiconductor layer is increased, and
    wherein by performing the second heat treatment, the carrier concentration in the oxide semiconductor layer is reduced.

10. The method according to claim 1,
    wherein by performing the first heat treatment, resistance of the oxide semiconductor layer is reduced, and
    wherein by performing the second heat treatment, the resistance of the oxide semiconductor layer is increased.

11. A method for manufacturing a semiconductor device including a transistor, the method comprising the steps of:
    forming a first conductive layer;
    forming an oxide semiconductor layer over the first conductive layer;
    preforming a first heat treatment on the oxide semiconductor layer under an inert atmosphere at a first temperature equal to or higher than 400° C.;
    forming an oxide insulating layer over and in contact with a first part of the oxide semiconductor layer after the first heat treatment; and
    performing a second heat treatment heating the oxide insulating layer at a second temperature equal to or higher than 150° C. and lower than 350° C.,
    wherein the first part of the oxide semiconductor layer is included in a channel formation region of the transistor.

12. The method according to claim 11, wherein the inert atmosphere is one of a nitrogen atmosphere and a rare gas atmosphere.

13. The method according to claim 11, wherein the second heat treatment is performed under one of a nitrogen atmosphere and an air atmosphere.

14. The method according to claim 11, further comprising the step of forming a source electrode layer and a drain electrode layer on a second part and a third part of the oxide semiconductor layer before forming the oxide insulating layer.

15. The method according to claim 14, wherein the source electrode layer and the drain electrode layer comprise a material selected from titanium and molybdenum.

16. The method according to claim 11, further comprising the step of forming a second conductive layer over the oxide insulating layer.

17. The method according to claim 16, wherein the first conductive layer and the second conductive layer are electrically connected to each other.

18. The method according to claim 11, wherein the oxide semiconductor layer comprises a crystal.

19. The method according to claim 11, wherein the oxide semiconductor layer comprises indium and zinc.

20. The method according to claim 11, wherein the oxide semiconductor layer comprises a material selected from the group consisting of In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; an In—Ga—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

21. The method according to claim 11,
wherein by performing the first heat treatment, a carrier concentration in the oxide semiconductor layer is increased, and
wherein by performing the second heat treatment, the carrier concentration in the oxide semiconductor layer is reduced.

22. The method according to claim 11,
wherein by performing the first heat treatment, resistance of the oxide semiconductor layer is reduced, and
wherein by performing the second heat treatment, the resistance of the oxide semiconductor layer is increased.

* * * * *